United States Patent
Slachter et al.

(10) Patent No.: US 11,079,687 B2
(45) Date of Patent: Aug. 3, 2021

(54) PROCESS WINDOW BASED ON DEFECT PROBABILITY

(71) Applicant: ASML NETHERLANDS B.V., Veldhoven (NL)

(72) Inventors: Abraham Slachter, Waalre (NL); Stefan Hunsche, Santa Clara, CA (US); Wim Tjibbo Tel, Helmond (NL); Anton Bernhard Van Oosten, Lommel (BE); Koenraad Van Ingen Schenau, Veldhoven (NL); Gijsbert Rispens, Eersel (NL); Brennan Peterson, Longmont, CO (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/955,483

(22) PCT Filed: Dec. 17, 2018

(86) PCT No.: PCT/EP2018/085159
§ 371 (c)(1),
(2) Date: Jun. 18, 2020

(87) PCT Pub. No.: WO2019/121486
PCT Pub. Date: Jun. 27, 2019

(65) Prior Publication Data
US 2021/0018850 A1 Jan. 21, 2021

Related U.S. Application Data

(60) Provisional application No. 62/609,755, filed on Dec. 22, 2017, provisional application No. 62/773,259, filed on Nov. 30, 2018.

(51) Int. Cl.
*G03F 7/20* (2006.01)

(52) U.S. Cl.
CPC .......... *G03F 7/70633* (2013.01); *G03F 7/705* (2013.01); *G03F 7/70558* (2013.01); *G03F 7/70625* (2013.01)

(58) Field of Classification Search
CPC ............. G03F 7/70633; G03F 7/70641; G03F 7/70625; G03F 7/70558; G03F 7/705
See application file for complete search history.

(56) References Cited

U.S. PATENT DOCUMENTS

| | | |
|---|---|---|
| 6,961,116 B2 | 11/2005 | Den Boef et al. |
| 7,003,758 B2 | 2/2006 | Ye et al. |

(Continued)

FOREIGN PATENT DOCUMENTS

| | | |
|---|---|---|
| WO | 2009078708 | 6/2009 |
| WO | 2009106279 | 9/2009 |

(Continued)

OTHER PUBLICATIONS

International Search Report and Written Opinion issued in corresponding PCT Patent Application No. PCT/EP2018/085159, dated Apr. 9, 2019.

(Continued)

*Primary Examiner* — Steven Whitesell Gordon
(74) *Attorney, Agent, or Firm* — Pillsbury Winthrop Shaw Pittman LLP

(57) ABSTRACT

A method including obtaining (i) measurements of a parameter of the feature, (ii) data related to a process variable of a patterning process, (iii) a functional behavior of the parameter defined as a function of the process variable based on the measurements of the parameter and the data related to the process variable, (iv) measurements of a failure rate of the feature, and (v) a probability density function of the process variable for a setting of the process variable, converting the probability density function of the process vari- (Continued)

able to a probability density function of the parameter based on a conversion function, where the conversion function is determined based on the function of the process variable, and determining a parameter limit of the parameter based on the probability density function of the parameter and the measurements of the failure rate.

20 Claims, 39 Drawing Sheets

(56) References Cited

U.S. PATENT DOCUMENTS

| | | | |
|---|---|---|---|
| 7,587,704 | B2 | 9/2009 | Ye et al. |
| 8,200,468 | B2 | 6/2012 | Ye et al. |
| 2006/0066855 | A1 | 3/2006 | Den Boef et al. |
| 2007/0031745 | A1 | 2/2007 | Ye et al. |
| 2007/0050749 | A1 | 3/2007 | Ye et al. |
| 2008/0301620 | A1 | 12/2008 | Ye et al. |
| 2008/0309897 | A1 | 12/2008 | Wong et al. |
| 2009/0157360 | A1 | 6/2009 | Ye et al. |
| 2010/0162197 | A1 | 6/2010 | Ye et al. |
| 2010/0180251 | A1 | 7/2010 | Ye et al. |
| 2010/0315614 | A1 | 12/2010 | Hansen |
| 2011/0027704 | A1 | 2/2011 | Cramer et al. |
| 2011/0043791 | A1 | 2/2011 | Smilde et al. |
| 2011/0099526 | A1 | 4/2011 | Liu |
| 2012/0117522 | A1 | 5/2012 | Feng et al. |
| 2012/0242970 | A1 | 9/2012 | Smilde et al. |
| 2013/0000505 | A1 | 1/2013 | Tao et al. |
| 2013/0179847 | A1 | 7/2013 | Hansen |
| 2013/0254724 | A1 | 9/2013 | Parikh |
| 2013/0326437 | A1 | 12/2013 | Liu et al. |
| 2014/0282307 | A1 | 9/2014 | Latypov |
| 2015/0227654 | A1 | 8/2015 | Hunsche et al. |
| 2015/0356233 | A1 | 12/2015 | Fouquet et al. |
| 2016/0085905 | A1* | 3/2016 | Chen .................. G06F 30/398 716/52 |
| 2016/0313651 | A1 | 10/2016 | Middlebrooks et al. |
| 2017/0010538 | A1 | 1/2017 | Hansen |
| 2018/0031981 | A1 | 2/2018 | Vellanki et al. |
| 2018/0259858 | A1 | 9/2018 | Chen et al. |
| 2018/0329311 | A1 | 11/2018 | Cheong et al. |
| 2019/0317412 | A1 | 10/2019 | Mos et al. |
| 2019/0369480 | A1 | 12/2019 | Hansen et al. |

FOREIGN PATENT DOCUMENTS

| | | |
|---|---|---|
| WO | 2010059954 | 5/2010 |
| WO | 2017080279 | 5/2017 |
| WO | 2019121486 | 6/2019 |

OTHER PUBLICATIONS

Zhou, Wenzhan et al.: "Say good-bye to DOF: statistical process window analysis with inline lithographic process variations", Proc. of SPIE, vol. 6518 (2007).

Hector, Scott D. et al.: "Evaluation of the critical dimension control requirements in the ITRS using statistical simulation and error budgets", Proc. of SPIE, vol. 5377 (2004).

Cao. Y. et al.: "Optimized Hardware and Software for Fast, Full Chip Simulation", Proc. of SPIE, vol. 5754 (2005).

Rosenbluth et al.: "Optimum Mask and Source Patterns to Print a Given Shape", Journal of Microlithography, Microfabrication, Microsystems 1(1), pp. 13-20 (2002).

Socha et al. "Simultaneous Source Mask Optimization (SMO)," Proc. of SPIE, vol. 5853, pp. 180-193 (2005).

Spence, C.: "Full-Chip Lithography Simulation and Design Analysis— How OPC Is Changing IC Design", Proc. of SPIE, vol. 5751 (2005).

* cited by examiner

PROCESS WINDOW BASED ON DEFECT PROBABILITY

CROSS-REFERENCE TO RELATED APPLICATIONS

This application is the U.S. national phase entry of PCT patent application no. PCT/EP2018/085159, which was filed on Dec. 17, 2018, which claims the benefit of priority of U.S. patent application No. 62/609,755, which was filed on Dec. 22, 2017, and U.S. patent U.S. application No. 62/773,259, which was filed on Nov. 30, 2018, which are incorporated herein in their entireties its entirety by reference.

FIELD

The present disclosure relates to techniques of improving the performance of a device manufacturing process. The techniques may be used in connection with a lithographic apparatus or a metrology apparatus.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

According to an embodiment of the present disclosure, there is provided a method for determining parameter limits of a feature on a substrate. The method includes steps for obtaining (i) measurements of a parameter of the feature, (ii) data related to a process variable of a patterning process, (iii) a functional behavior of the parameter defined as a function of the process variable based on the measurements of the parameter and the data related to the process variable, (iv) measurements of a failure rate of the feature, and (v) a probability density function of the process variable per setting of the process variable. Further, the method includes steps for converting the probability density function of the process variable to a probability density function of the parameter per setting of the process variable based on a conversion function, wherein the conversion function is determined based on the function of the process variable, and determining a parameter limit of the parameter based on the probability density function of the parameter and the measurements of the failure rate of the feature.

The determining of the probability density function of the process variable is based on a variance of the process variable that is computed from a measured variance of the parameter per setting of the process variable and a local derivative of the function of the process variable with respect to the process variable determined per setting of the process variable.

The conversion function is a conversion factor, wherein the conversion factor is an absolute value of a local derivative of an inverse of the function of the process variable determined per setting of the process variable.

The determining an estimated failure rate of the feature based on the parameter limit and the probability density function of the parameter; and identifying a process window related to the process variable such that the estimated failure rate of the feature is less than a predetermined threshold. The predetermined threshold is based on a selected yield of the patterning process.

The failure rate is related to one or more failures of the feature, the one or more failure modes comprising a physical failure, a transfer failure, and/or postponed failure of the feature. In an embodiment, the postponed failure of the feature is a stipulated limit on the process parameter based on a failure that has been measured to occur during a subsequent step in the patterning process. The one or more failures of the feature are weighted based on a frequency of a particular failure to generate a weighted failure rate of the feature.

The method further includes steps for obtaining a weighted function of the process variable based on a correlation between the one or more failures and the process variable, determining a weighted parameter limit of the parameter based on the weighted function of the process variable, and determining the process window based on the weighted parameter limit.

The method further includes steps for optimizing a resist thickness, and/or resist type using a resist model of a resist process, by simulation, based on the postponed failures associated with the resist process. The failure associated with the resist process includes a footing failure and/or a necking failure.

The method further includes steps for obtaining the parameter limit for each feature type of a plurality of feature types, and the estimated failure rate of each feature type of the plurality of feature types based on the corresponding parameter limit, and determining an overlapping process window based on a product of the estimated failure rate of each feature type of the plurality of feature types.

The method further includes steps for iteratively determining an optical proximity correction, by modelling and/or simulation, based on a maximum of the estimated failure rate of each feature type of the plurality of feature types. The maximum of the estimated failure rate corresponds to a feature type having lowest yield.

The method further includes steps for determining a refined variance of the parameter from the measured variance of the parameter, wherein the refined variance accounts for variance due to factors unrelated to the process variable. The refined variance is computed by removing the variance due the factors unrelated to the process variable from the measured variance. The factors unrelated to the process variable include contribution from metrology noise, mask, and background. The contribution of the background is a stochastic component of the patterning process determined at a particular setting of the process variable, wherein the measured variance has minimum sensitivity to the process variable.

The determining of the process window is based on the refined variance.

The method further includes steps for obtaining a transfer function of a post pattern transfer step of the patterning process, and another process variable PDF based on the transfer function, and determining the process window based on the another process variable PDF.

The parameter of the patterning process is a critical dimension and the process variable is a dose.

The setting of the process variable is a dose value within a range of dose values.

The patterning process is configured to adjust of one or more apparatuses of the patterning process based on the process window. The one or more apparatuses includes a lithographic apparatus configured to perform patterning on a substrate based on the process window.

Further, according to an embodiment of the present disclosure, there is provided a method for determining a process window of a patterning process. The method includes steps for obtaining (i) a parameter limit of a parameter of the patterning process based on failure rate measurements of the patterning process, and (ii) a probability density function of the parameter defined as a function of a process variable and a variance of the process variable of the patterning process. The method further includes steps for determining an estimated failure rate of the patterning process based on the parameter limit and the probability density function of the parameter, and identifying, a hardware computer system, the process window in terms of the process variable such that the estimated failure rate of the parameter is less than a selected threshold.

The identifying of the process window involves determining a range of the process variable between an intersection of the estimated failure rate and the selected threshold. The intersection is graphically determined by plotting the estimated failure rate, the process variable, and the selected threshold on a graph. The selected threshold is based on a selected yield of the patterning process.

The patterning process is configured to adjust of one or more apparatuses of the patterning process based on the process window. The one or more apparatuses includes a lithographic apparatus configured to perform patterning on a substrate based on the process window.

The parameter of the patterning process is a critical dimension and the process variable is a dose.

The setting of the process variable is a dose value within a range of dose values.

Furthermore, there is provided a method for determining a process window of a patterning process, the method includes obtaining (i) a variation of a first parameter of the patterning process, (ii) a variation of a second parameter based on a relationship between the first parameter and the second parameter, and (iii) a process model of the patterning process, inserting, by a hardware computer system, a Gaussian distribution in the relationship between the first parameter and the second parameter for modifying the variation of the first parameter resulting in a failure rate distribution of the second parameter; and identifying, via simulation of the process model, the process window such that a merit function of the process model is optimized, wherein the merit function comprises a defect metric based on failure rate distribution of the second parameter.

In an embodiment, the identifying the process window is an iterative process, an iteration includes biasing the second parameter; and determining a failure probability based on the failure rate distribution due to the biasing.

In an embodiment, the biasing is achieved by adjusting values of the first parameter or a characteristic of a patterning device.

In an embodiment, the first parameter is a dose and the second parameter is a critical dimension.

In an embodiment, the biasing of the critical dimension comprises adjusting the dose and/or a dimension of a feature of the patterning device.

In an embodiment, the biasing includes increasing or decreasing the critical dimension to be printed on the substrate.

In an embodiment, the adjustment of the critical dimension is achieved by increasing or decreasing the dose of the patterning process.

In an embodiment, the identifying of the process window further includes determining an overlapping process window based on an overlap of a first process window related to a first pattern with a second process window related to a second pattern.

In an embodiment, the first pattern and the second pattern are process window limiting patterns.

In an embodiment, optimizing of the merit function comprises minimizing of a failure rate associated with one or more defects.

In an embodiment, the one or more defect comprises a hole closure.

In an embodiment, optimization of the merit function involves establishing a balance between a first defect occurrence due to values of the first parameter below a first threshold and/or a second defect occurrence due to the values of the first parameter being above a second threshold.

In an embodiment, the first threshold is lower than the second threshold.

In an embodiment, the merit function further comprises constraints related to one or more of a focus, overlay, msdz, and dose.

In an embodiment, the first parameter variation is estimated based on simulation of a local parameter uniformity model of the patterning process.

In an embodiment, the local parameter uniformity model is a local critical dimension uniformity model.

In an embodiment, the process model is a source optimization, mask optimization, and/or a source-mask optimization model.

In an embodiment, the Gaussian distribution has a variation of greater than or equal to three sigma.

In an embodiment, the one or more defects include at least one of a hole closure, necking, and bridging.

In an embodiment, the failure rate distribution is a probability density function used to compute a probability of defect occurrence for a change in the second parameter.

In an embodiment, the defect metric is a total number of defects, a failure rate associated with the one or more defects.

Furthermore, there is provided a method for performing source-mask optimization based on a defect-based process window. The method includes obtaining a first result of from a source-mask-optimization model and process window limiting patterns within the first result; and adjusting, via a hardware computer system, characteristic of a source and/or a mask based on a defect metric, such that the defect metric is reduced.

In an embodiment, the adjustment includes biasing the mask to create a positive bias on a substrate printed using the mask.

In an embodiment, the biasing is applied to patterning within a pattern limiting process windows.

In an embodiment, the method further includes performing an optical proximity correction on the mask to reduce the defect metric.

In an embodiment, the method further includes increasing the critical dimension of a feature, such that the feature is relatively close to or touches a neighboring feature.

DETAILED DESCRIPTION

Before describing embodiments in detail, it is instructive to present an example environment in which embodiments may be implemented.

Figure 1:
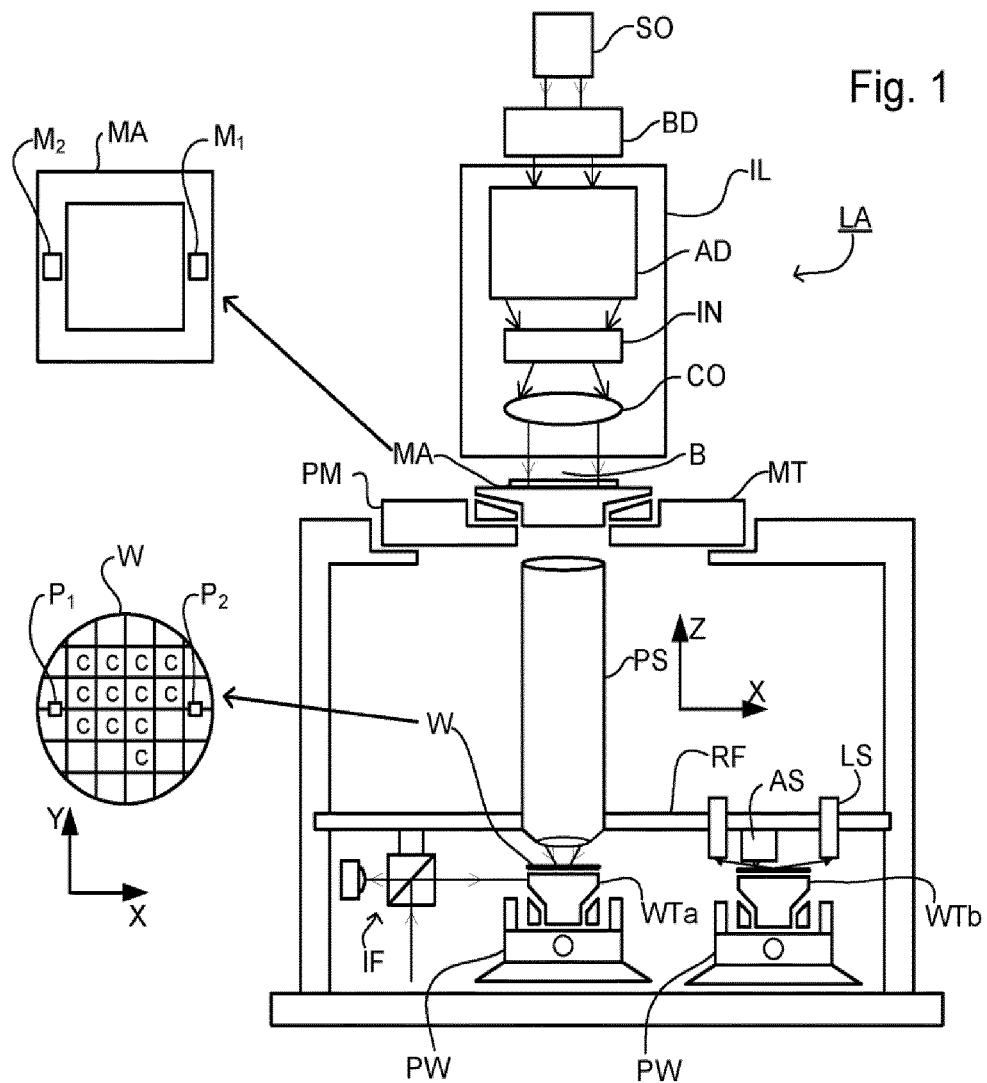
FIG. 1 schematically depicts a lithography apparatus according to an embodiment.

FIG. 1 schematically depicts an embodiment of a lithographic apparatus LA. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp.

The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
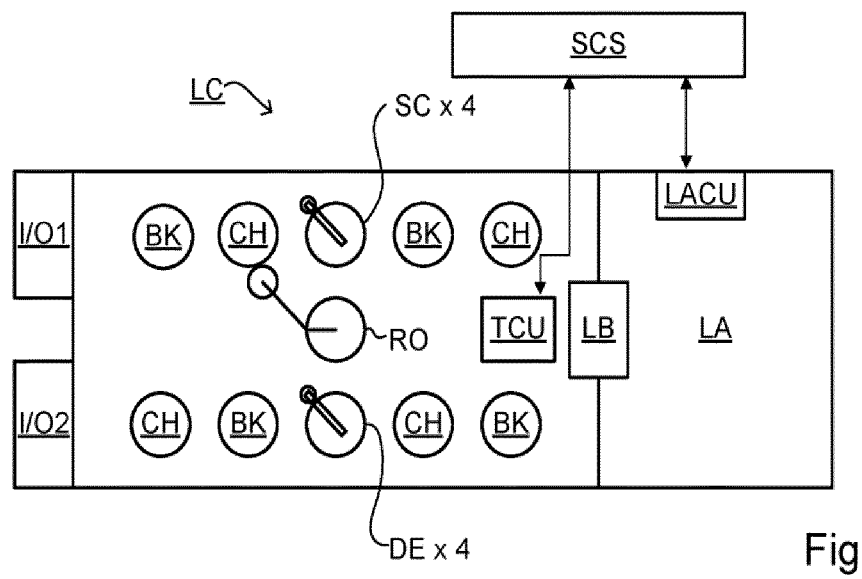
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1' orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
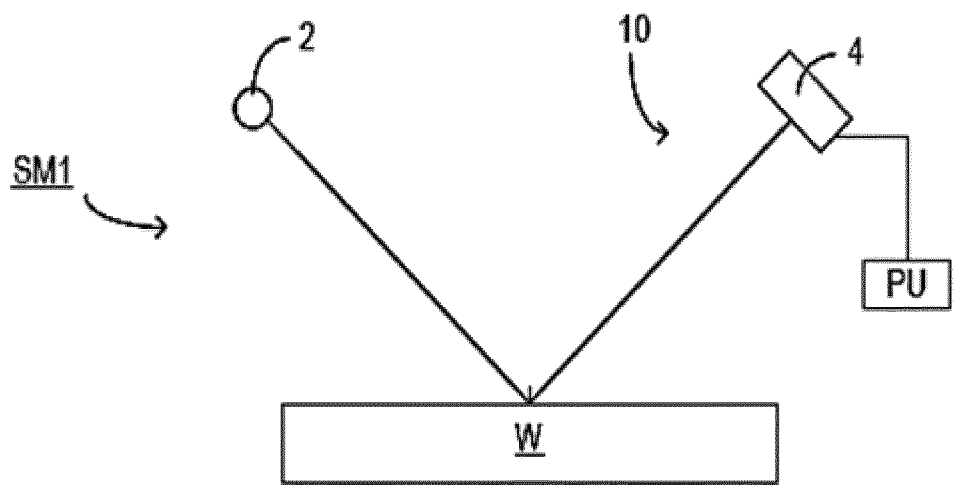
FIG. 3 schematically depicts an example inspection apparatus and metrology technique.
Figure 3:
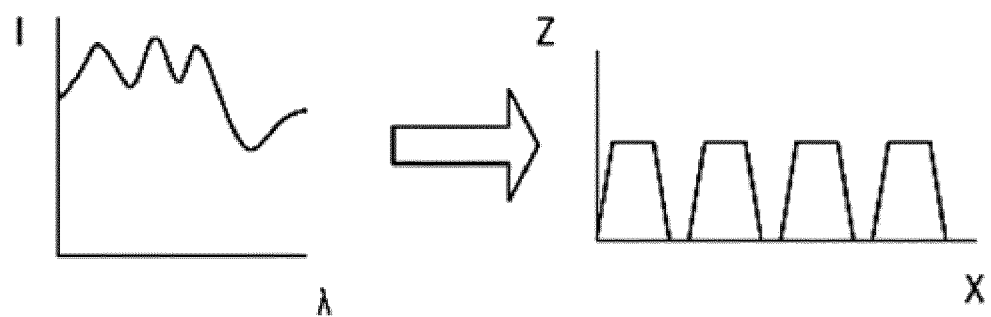

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
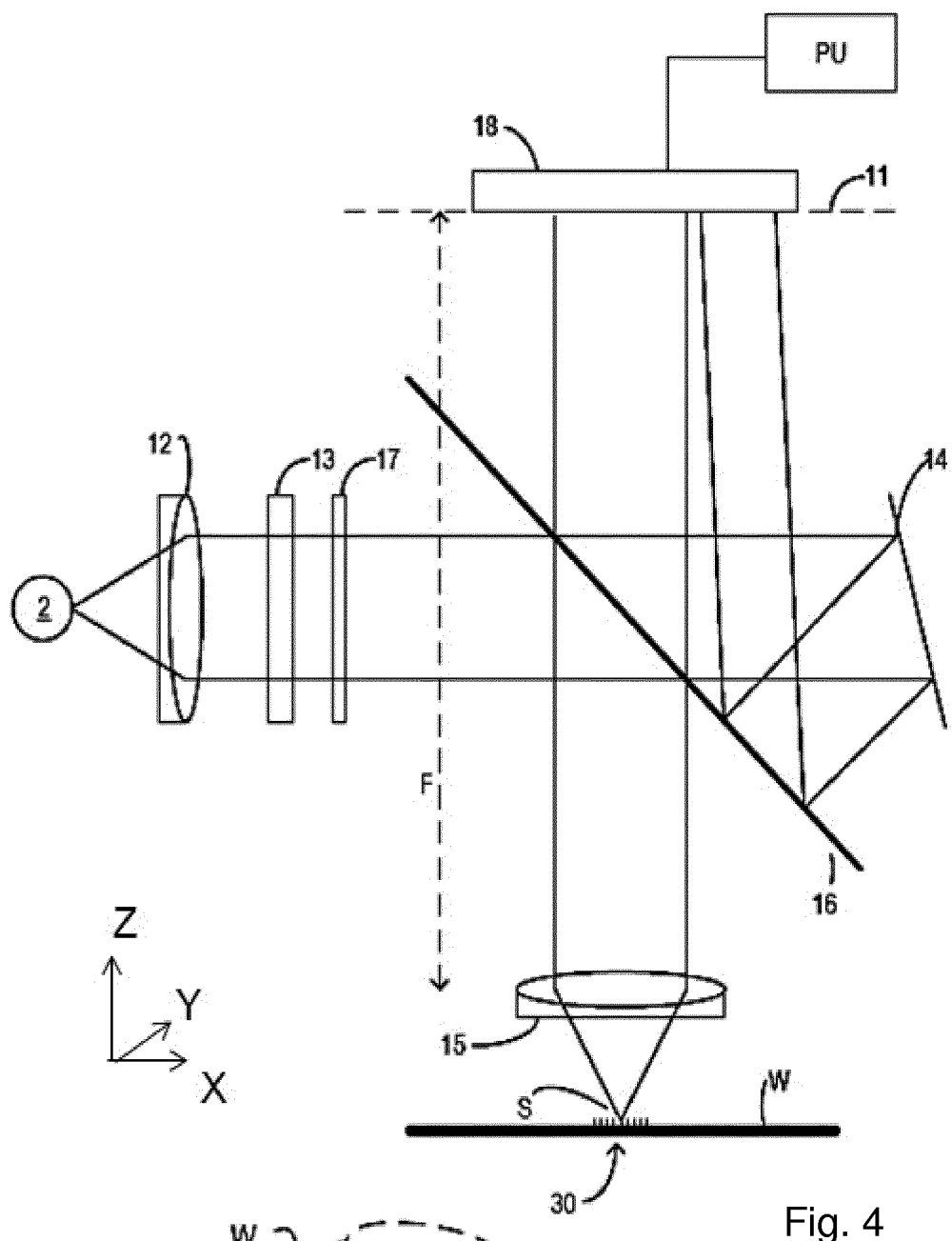
FIG. 4 schematically depicts an example inspection apparatus.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 5:
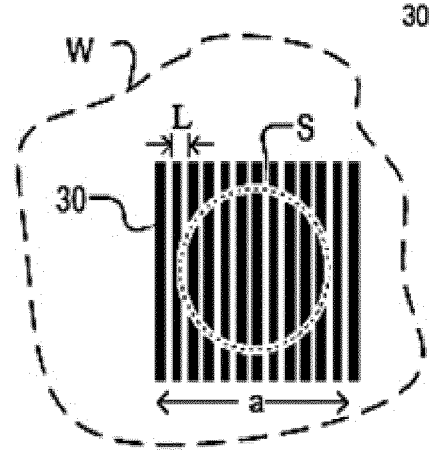
FIG. 5 illustrates the relationship between an illumination spot of an inspection apparatus and a metrology target.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 6:
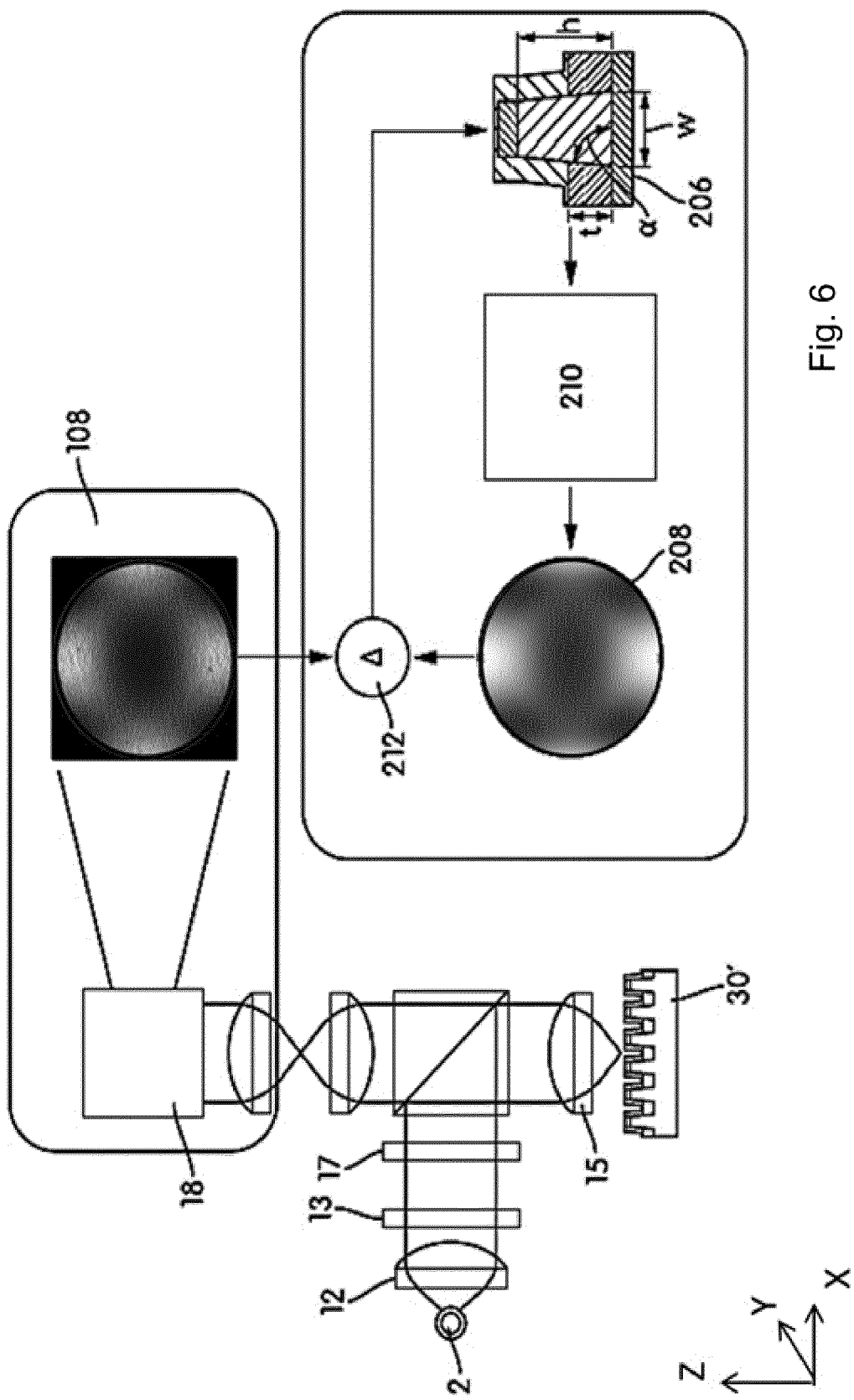
FIG. 6 schematically depicts a process of deriving a plurality of variables of interest based on measurement data.

FIG. 6 schematically depicts an example process of the determination of the value of one or more variables of interest of a target pattern 30' based on measurement data obtained using metrology. Radiation detected by the detector 18 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

Figure 7:
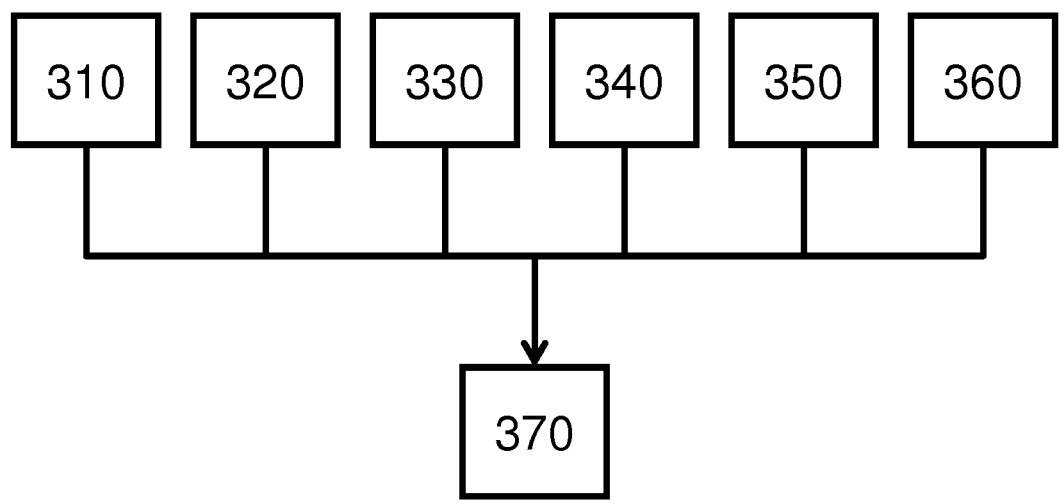
FIG. 7 shows example categories of processing variables.

Variables of a patterning process are called "processing variables." The patterning process may include processes upstream and downstream to the actual transfer of the pattern in a lithography apparatus. FIG. 7 shows example categories of the processing variables 370. The first category may be variables 310 of the lithography apparatus or any other apparatuses used in the lithography process. Examples of this category include variables of the illumination, projection system, substrate stage, etc. of a lithography apparatus. The second category may be variables 320 of one or more procedures performed in the patterning process. Examples of this category include focus control or focus measurement, dose control or dose measurement, bandwidth, exposure duration, development temperature, chemical composition used in development, etc. The third category may be variables 330 of the design layout and its implementation in, or using, a patterning device. Examples of this category may include shapes and/or locations of assist features, adjustments applied by a resolution enhancement technique (RET), CD of mask features, etc. The fourth category may be variables 340 of the substrate. Examples include characteristics of structures under a resist layer, chemical composition and/or physical dimension of the resist layer, etc. The fifth category may be characteristics 350 of temporal variation of one or more variables of the patterning process. Examples of this category include a characteristic of high frequency stage movement (e.g., frequency, amplitude, etc.), high frequency laser bandwidth change (e.g., frequency, amplitude, etc.) and/or high frequency laser wavelength change. These high frequency changes or movements are those above the response time of mechanisms to adjust the underlying variables (e.g., stage position, laser intensity).

The sixth category may be characteristics 360 of processes upstream of, or downstream to, pattern transfer in a lithographic apparatus, such as spin coating, post-exposure bake (PEB), development, etching, deposition, doping and/or packaging.

As will be appreciated, many, if not all of these variables, will have an effect on a parameter of the patterning process and often a parameter of interest. Non-limiting examples of parameters of the patterning process may include critical dimension (CD), critical dimension uniformity (CDU), focus, overlay, edge position or placement, sidewall angle, pattern shift, etc. Often, these parameters express an error from a nominal value (e.g., a design value, an average value, etc.). The parameter values may be the values of a characteristic of individual patterns or a statistic (e.g., average, variance, etc.) of the characteristic of a group of patterns.

The values of some or all of the processing variables, or a parameter related thereto, may be determined by a suitable method. For example, the values may be determined from data obtained with various metrology tools (e.g., a substrate metrology tool). The values may be obtained from various sensors or systems of an apparatus in the patterning process (e.g., a sensor, such as a leveling sensor or alignment sensor, of a lithography apparatus, a control system (e.g., a substrate or patterning device table control system) of a lithography apparatus, a sensor in a track tool, etc.). The values may be from an operator of the patterning process.

Figure 8:
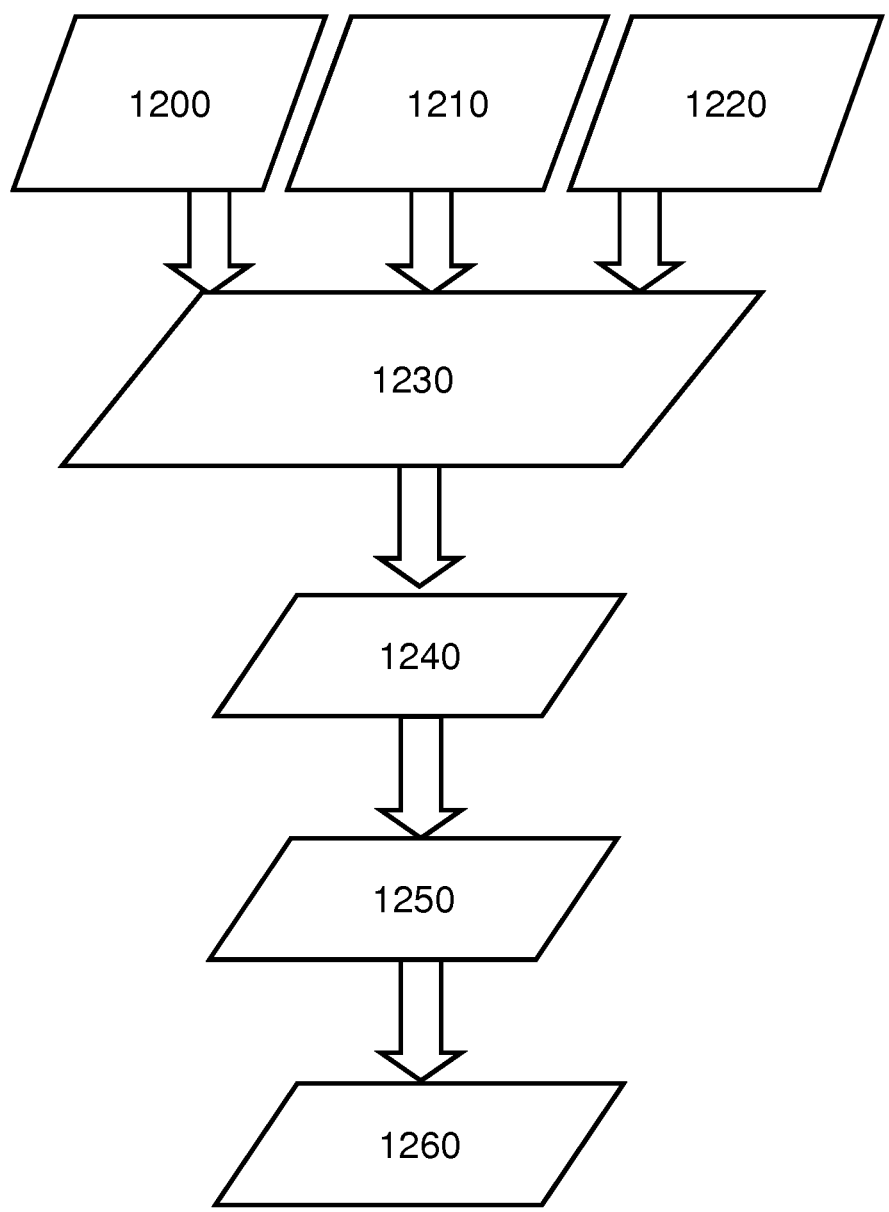
FIG. 8 schematically shows a flow for a patterning simulation method, according to an embodiment.

An exemplary flow chart for modelling and/or simulating parts of a patterning process is illustrated in FIG. 8. As will be appreciated, the models may represent a different patterning process and need not comprise all the models described below. A source model 1200 represents optical characteristics (including radiation intensity distribution, bandwidth and/or phase distribution) of the illumination of a patterning device. The source model 1200 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where σ (or sigma) is outer radial extent of the illuminator.

A projection optics model 1210 represents optical characteristics (including changes to the radiation intensity distribution and/or the phase distribution caused by the projection optics) of the projection optics. The projection optics model 1210 can represent the optical characteristics of the projection optics, including aberration, distortion, one or more refractive indexes, one or more physical sizes, one or more physical dimensions, etc.

The patterning device/design layout model module 1220 captures how the design features are laid out in the pattern of the patterning device and may include a representation of detailed physical properties of the patterning device, as described, for example, in U.S. Pat. No. 7,587,704, which is incorporated by reference in its entirety. In an embodiment, the patterning device/design layout model module 1220 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. Since the patterning device used in the lithographic projection apparatus can be changed, it is desirable to separate the optical properties of the patterning device from the optical properties of the rest of the lithographic projection apparatus including at least the illumination and the projection optics. The objective of the simulation is often to accurately predict, for example, edge placements and CDs, which can then be compared against the device design. The device design is generally defined as the pre-OPC patterning device layout, and will be provided in a standardized digital file format such as GDSII or OASIS.

An aerial image 1230 can be simulated from the source model 1200, the projection optics model 1210 and the patterning device—design layout model 1220. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1250 can be simulated from the aerial image 1230 using a resist model 1240. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 1210.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 1260. The post-pattern transfer process model 1260 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Figure 9:
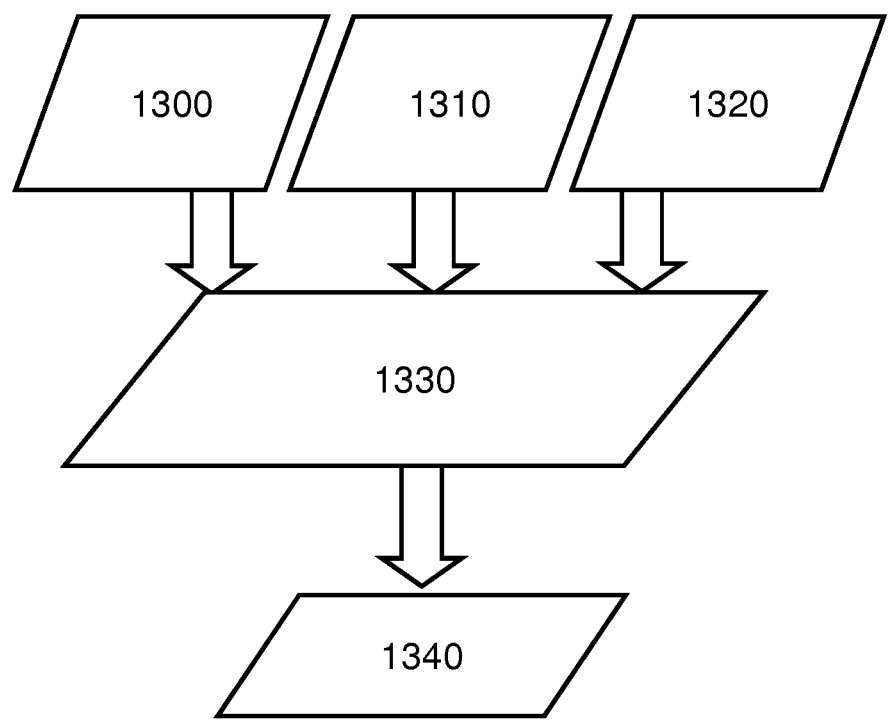
FIG. 9 schematically shows a flow for a measurement simulation method, according to an embodiment.

An exemplary flow chart for modelling and/or simulating a metrology process is illustrated in FIG. 9. As will be appreciated, the following models may represent a different metrology process and need not comprise all the models described below (e.g., some may be combined). A source model 1300 represents optical characteristics (including radiation intensity distribution, radiation wavelength, polarization, etc.) of the illumination of a metrology target. The source model 1300 can represent the optical characteristics of the illumination that include, but not limited to, wavelength, polarization, illumination sigma ($\sigma$) settings (where $\sigma$ (or sigma) is a radial extent of illumination in the illuminator), any particular illumination shape (e.g. off-axis radiation shape such as annular, quadrupole, dipole, etc.), etc.

A metrology optics model 1310 represents optical characteristics (including changes to the radiation intensity distribution and/or the phase distribution caused by the metrology optics) of the metrology optics. The metrology optics 1310 can represent the optical characteristics of the illumination of the metrology target by metrology optics and the optical characteristics of the transfer of the redirected radiation from the metrology target toward the metrology apparatus detector. The metrology optics model can represent various characteristics involving the illumination of the target and the transfer of the redirected radiation from the metrology target toward the detector, including aberration, distortion, one or more refractive indexes, one or more physical sizes, one or more physical dimensions, etc.

A metrology target model 1320 can represent the optical characteristics of the illumination being redirected by the metrology target (including changes to the illumination radiation intensity distribution and/or phase distribution caused by the metrology target). Thus, the metrology target model 1320 can model the conversion of illumination radiation into redirected radiation by the metrology target. Thus, the metrology target model can simulate the resulting illumination distribution of redirected radiation from the metrology target. The metrology target model can represent various characteristics involving the illumination of the target and the creation of the redirected radiation from the metrology, including one or more refractive indexes, one or more physical sizes of the metrology, the physical layout of the metrology target, etc. Since the metrology target used can be changed, it is desirable to separate the optical properties of the metrology target from the optical properties of the rest of the metrology apparatus including at least the illumination and projection optics and the detector. The objective of the simulation is often to accurately predict, for example, intensity, phase, etc., which can then be used to derive a parameter of interest of the patterning process, such overlay, CD, focus, etc.

A pupil or aerial image 1330 can be simulated from the source model 1300, the metrology optics model 1310 and the metrology target model 1320. A pupil or aerial image is the radiation intensity distribution at the detector level. Optical properties of the metrology optics and metrology target (e.g., properties of the illumination, the metrology target and the metrology optics) dictate the pupil or aerial image.

A detector of the metrology apparatus is exposed to the pupil or aerial image and detects one or more optical properties (e.g., intensity, phase, etc.) of the pupil or aerial image. A detection model module 1320 represents how the radiation from the metrology optics is detected by the detector of the metrology apparatus. The detection model can describe how the detector detects the pupil or aerial image and can include signal to noise, sensitivity to incident radiation on the detector, etc. So, in general, the connection between the metrology optics model and the detector model is a simulated pupil or aerial image, which arises from the illumination of the metrology target by the optics, redirection of the radiation by the target and transfer of the redirected radiation to the detectors. The radiation distribution (pupil or aerial image) is turned into detection signal by absorption of incident energy on the detector.

Simulation of the metrology process can, for example, predict spatial intensity signals, spatial phase signals, etc. at the detector or other calculated values from the detection system, such as an overlay, CD, etc. value based on the detection by the detector of the pupil or aerial image. Thus, the objective of the simulation is to accurately predict, for example, detector signals or derived values such overlay, CD, corresponding to the metrology target. These values can be compared against an intended design value to, e.g., correct the patterning process, identify where a defect is predicted to occur, etc.

Thus, the model formulation describes most, if not all, of the known physics and chemistry of the overall metrology process, and each of the model parameters desirably corresponds to a distinct physical and/or chemical effect in the metrology process.

Various patterns on or provided by a patterning device may have different process windows. i.e., a space of processing variables under which a pattern will be produced within a specification. Examples of pattern specifications that relate to potential systematic defects include checks for necking, line pull back, line thinning, CD, edge placement, overlapping, resist top loss, resist undercut and/or bridging. Typically, a process window is defined over two processing variables i.e., dose and focus such that the CD obtained after patterning may be within ±10% of the desired CD of a feature of the pattern. The process window of all the patterns on a patterning device or an area thereof may be obtained by merging (e.g., overlapping) process windows of each individual pattern.

Typically, a pattern can include several instances of one or more features (e.g., $10^6$ instances of feature A, $10^4$ instances of feature B, etc.) arranged in a certain manner to form the pattern. During the patterning process, one or more features may fail at certain, for example, dose/focus settings, leading to a defect in the substrate thereby affecting the yield of the patterning process. Hence, selection of an appropriate range of dose/focus values or processing window is desired (or selected) to achieve a desired yield or a selected yield. For example, a high yield (e.g., 99.9%) may be selected or a range of yield (e.g., 98%-99.99%) may be selected by, for example, a designer or a manufacturer.

The present disclosure describes a method to obtain a process window based on a desired yield and/or defect criteria for one or more features. For example, the process window can be a set of dose and/or focus values (also referred as dose/focus settings) that are sensitive to failures of individual features and/or a desired yield of the patterning process.

Figure 10:
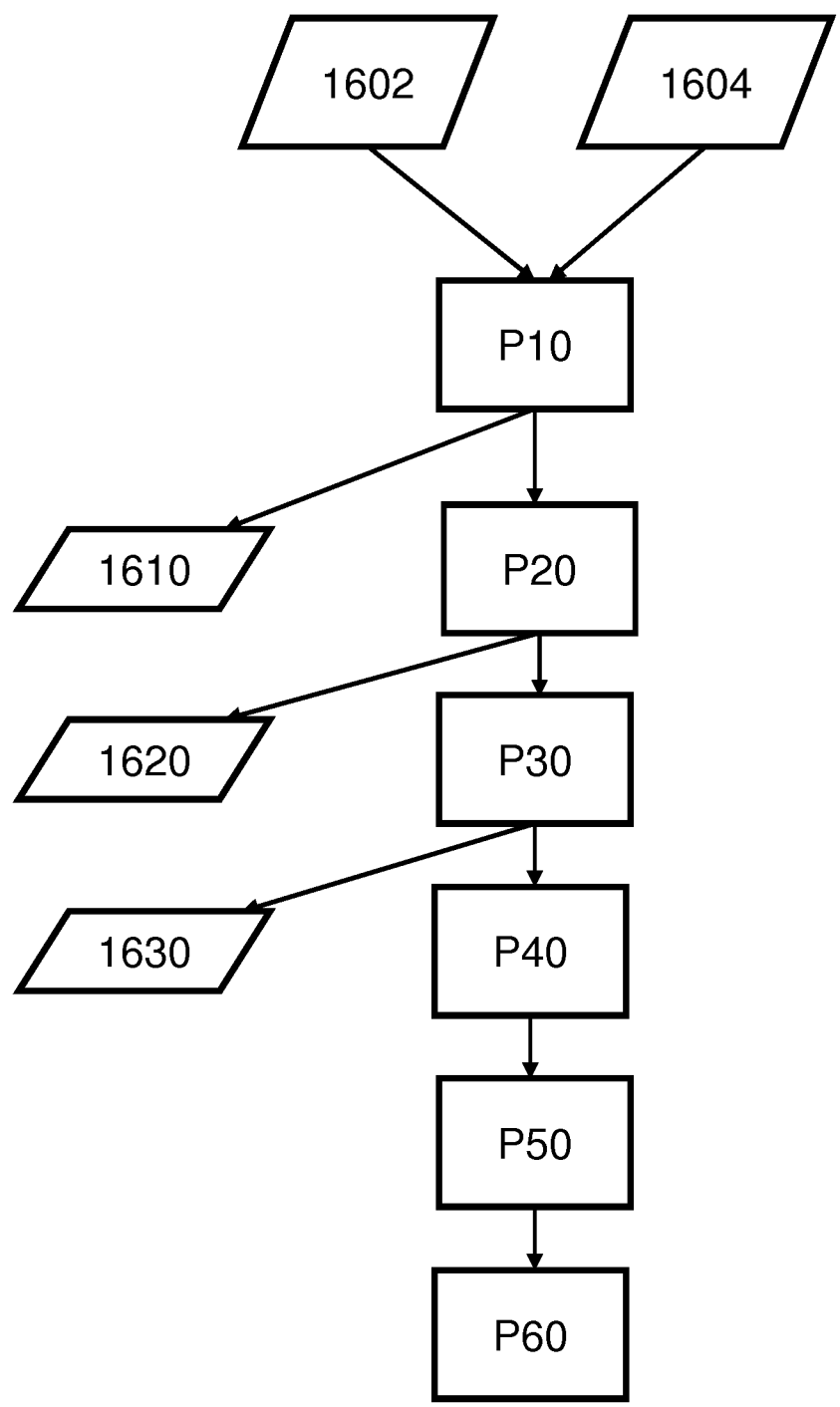
FIG. 10 schematically shows a flow for a method to determine a defect based process window, according to an embodiment.

FIG. 10 is a flow chart of a process 1600 to determine a process window based on a desired die yield and/or a failure rate of a patterning process. The process 1600 starts when measurements of a parameter 1602 (e.g., a CD, overlay, etc.) and a process variable 1604 (e.g., dose, focus, etc.) of the patterning process are obtained. For example, the measurements of the process variable may include approximately 20 dose settings (i.e., a range of dose values) and measurements of the parameter of a feature (which appears, for example, $10^6$ times in a pattern) may include CD values for approximately 1000 instance of the feature per setting of the dose. Hence, approximately 1000×20 CD values may be measured. The present disclosure is not limited to total number of measurements. The number of instances may be selected to reach a desired accuracy of the variance. For example, for large number of instances and normal distributions, the standard deviation of the standard deviation is approximately $1/\sqrt{(2*\text{number of instances})}$, such that the standard deviation of 1000 instances lead to an error in the estimated standard deviation of approximately 2% with a 99.7% confidence interval (i.e. 3σ).

Based on the measurements of the parameter (e.g., CD) and the process variable (dose), in process P10, a functional relationship 1610 between the parameter (e.g., CD) and the process variable (e.g., dose) may be determined and/or obtained. For example, the functional relationship 1610 may be a mathematical model based on statistical analysis such as linear regression analysis. In an embodiment, the function relationship may be linear, or non-linear such as polynomial, trigonometric, etc. Following is an example functional relationship between CD and dose.

$$f_{CD}(d) = \sum_{n=0} a_n d^n \qquad (1)$$

In the example functional relationship (1), (i) $f_{CD}$ (d) refers to the parameter CD defined as a function of dose(d), (ii) n refers to the dose polynomial (d), and (iii) $a_n$ refers to sensitivity of the CD to the $n^{th}$ dose polynomial $d^n$. In an embodiment, the function relationship (1) can be based on a curve fitting algorithm, for example, that minimizes a mean squared error between the measured values and the fitted values. In an embodiment, the functional relationship may be a linear, a polynomial, or other non-linear function of the process variable. In an embodiment, the measurements 1602 can also be used to determine a variance in the parameter values with e.g. a different functional relationship with the intent to suppress noise in the variance in the parameter values.

Figure 11A:
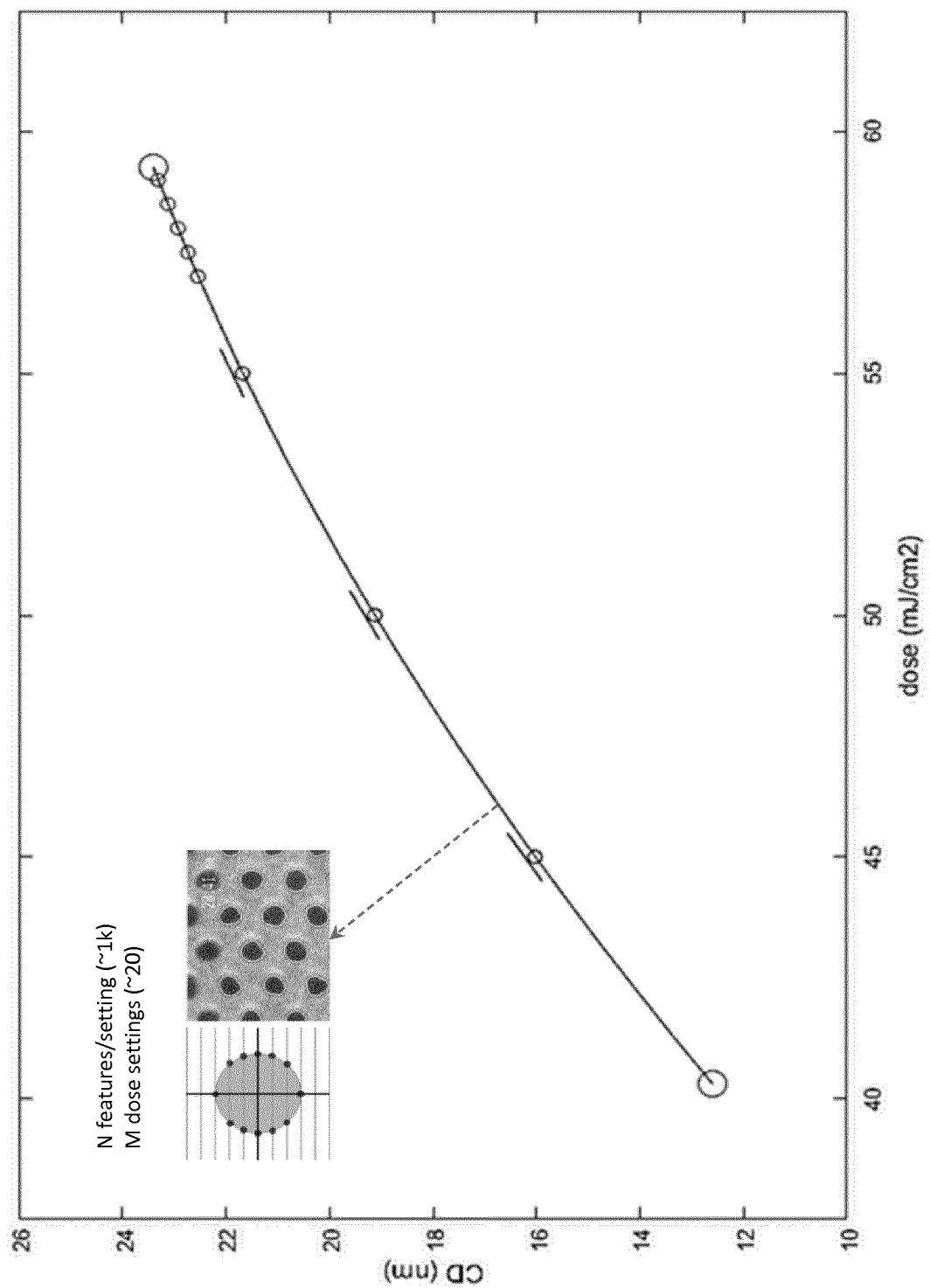
FIG. 11A illustrates an example relationship between measured CD and dose, according to an embodiment.

In another example, FIG. 11A illustrates Bossung curve 1702 (which is an example of the functional relationship 1610) that defines a relationship between the measured CD and dose values. The Bossung curve 1702 may be obtained for various dose settings, for example, 20 dose settings between 40 mJ/cm² to 60 mJ/cm². For each dose setting, 1000 CD values may be obtained, which may be approximately between 12 nm to 24 nm. In an embodiment, Bossung curve may be obtained using modelling and/or simulation of the patterning process.

Referring back to FIG. 10, in process P20, a probability density function (PDF) 1620 per setting of the process variable may be computed. Hereinafter, the probability density function (PDF) 1620 per setting of the process variable is referred as the process variable PDF 1620 for purposes of understanding of the concepts and simplicity of discussion. The process variable PDF 1620 is defined a function of the process variable and a variation of the process variable. The process variable PDF 1620 enables to capture an impact of any variations in a setting of dose that may eventually affect the parameter. Variations in the process variable per setting may occur, for example, at a particular instant of time during the patterning process or may be inherent to a process variable (e.g., dose). Such variations may affect the parameter of the patterning process leading to, for example, failure of a feature in some cases. In an embodiment, the process variable PDF 1620 can be a normal distribution, Poisson distribution, or other standard distributions.

In an embodiment, the process variable PDF 1620 can be a distribution computed based on the functional relationship (e.g., $f_{CD}$ (d)) between the parameter and the process variable. The computation can be performed by modifying/substituting a variance of, for example, the standard distribution (e.g., normal distribution) with a computed variance. The computed variance may be computed from the variance (e.g., $\sigma_{CD}^2$ (d)) of the parameter and the functional relationship (e.g., $f_{CD}$ (d)). For example, in case of the parameter CD and dose d, the variance of dose can be defined using the following variance equation (2):

$$\sigma_d = \sigma_{CD} * 1 / \left(\frac{\partial f_{CD}(d)}{\partial d}\right) \qquad (2)$$

In variance equation (2) above, (i) $\sigma_d$ is the standard deviation (also interchangeably used to refer to variance) of the dose; (ii) $\sigma_{CD}$ is the standard deviation (also interchangeably used to refer to variance) of the CD; and (iii) the partial derivative term $$\frac{\partial f_{CD}(d)}{\partial d}$$

provides for a conversion of the variance in CD at a particular dose setting to the variance of the dose at such dose setting.

Figure 11B:
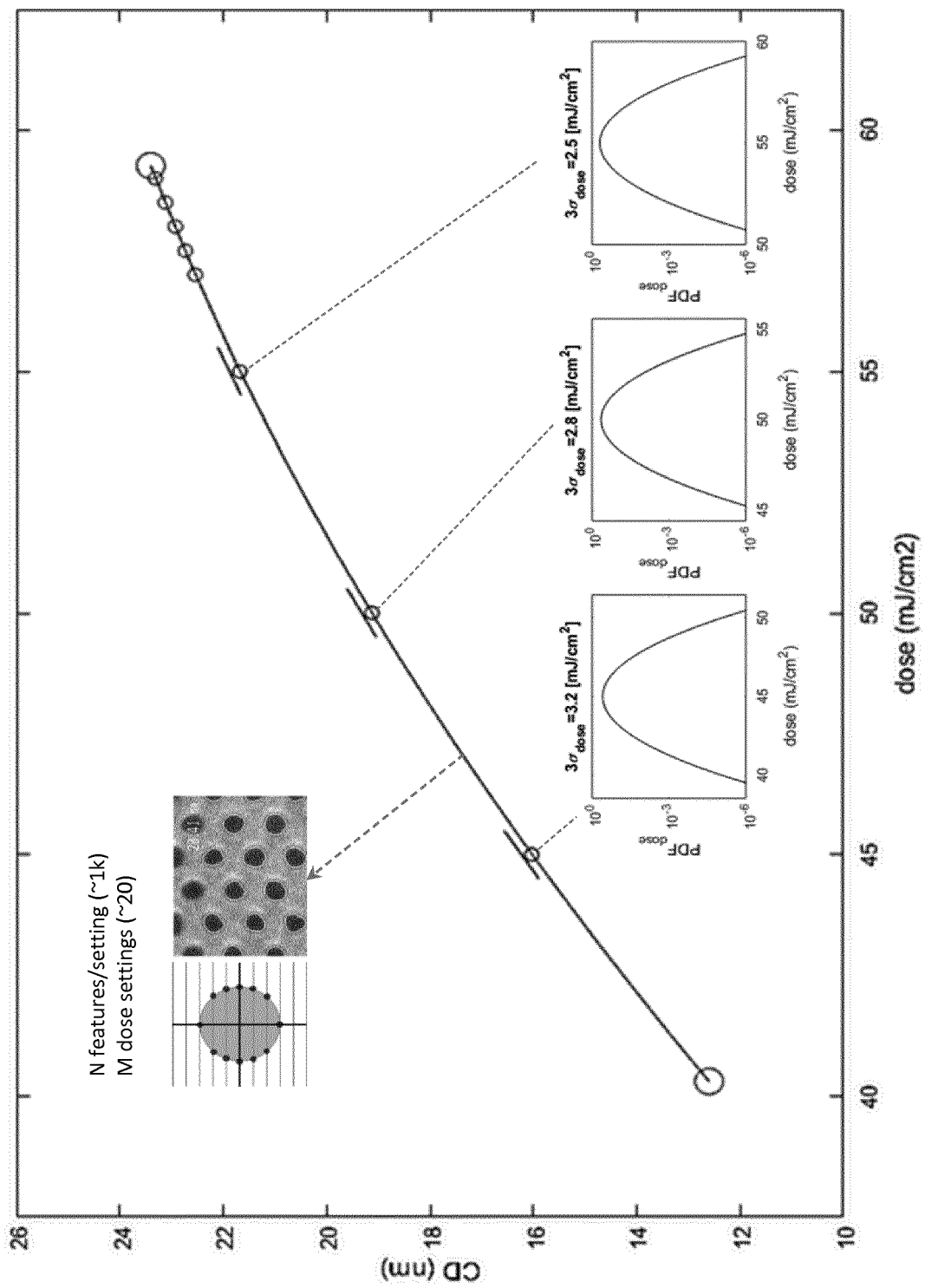
FIG. 11B illustrates example dose PDFs at different dose settings, according to an embodiment.

For example, referring to FIG. 11B, a first dose PDF 1721 at a first dose setting 45 mJ/cm², a second dose PDF 1722 at a second dose setting 50 mJ/cm², and a third dose PDF 1723 at dose setting 55 mJ/cm², etc. may be obtained. Based on the variations in the CD per dose setting, a dose variation may be observed. For example, at a lower dose (e.g., at 45 mJ/cm²), the variation (e.g., $3\sigma_d$) is approximately 3.2 mJ/cm², while at a higher dose (e.g., 55), the variation (e.g., $3\sigma_d$) is approximately 2.5 mJ/cm². Thus, a backward determination of the variation in dose may be obtained based on the CD values at a particular dose setting.

Such computed variance (e.g., in eq. (2)) used to compute the PDF of the process variable (e.g., dose) may enable accounting for stochastic variations (i.e., variations that cannot be explained by, for example, physics of the apparatus) in the patterning process that cause deviations in the parameter. The process variable PDF may enable determination of an improved dose setting of the patterning process and may eventually reduce defects and improve yield of the patterning process.

Referring back to FIG. 10, in process P30, a probability density function (PDF) 1630 of the parameter of the patterning process per setting of the process variable may be determined and/or obtained based on the process variable PDF 1620 per setting of the process variable (e.g., from process P20), and the functional relationship (e.g., from process P10). Hereinafter, the probability density function (PDF) 1630 of the parameter per setting of the process variable is referred as the parameter PDF 1630 for purposes of understanding of the concepts and simplicity of discussion.

According to an embodiment, the parameter PDF 1630 may be a non-standard distribution when calculated from the process variable PDF 1620. Using such non-standard distribution may also account for the any stochastic variations in the patterning process that cause deviations in the parameter, thus providing an improved estimate of probability that a parameter (e.g., CD) value will be within a desired range per process variable setting (e.g., dose) of the patterning process which may be further used to identify probability of defects and a processing window to reduce defects and effectively improve yield.

In an embodiment, the parameter PDF 1630, for example, a CD PDF may be computed using dose PDF and a conversion function (or a conversion factor) that converts the dose PDF to a CD PDF based on the following equation (3):

$$PDF_{CD}(CD, d) = PDF_d(g_d(CD), \sigma_d(g_d(CD))) * \left| \frac{\partial}{\partial d} g_d(CD) \right| \quad (3)$$

In the equation (3) above, (i) $PDF_{CD}$ (CD, d) refers to the CD PDF (which is an example of the parameter PDF 1630) and is a function of dose (d), (ii) $g_d(CD)$ is an inverse function of the functional relationship 1610 (e.g., in eq. (1)) between the dose and CD, (iii) $PDF_d(g_d(CD), \sigma_d(g_d(CD)))$ is the process variable PDF 1620, where $\sigma_d(g_d(CD))$ is a computed variance based on $g_d(CD)$, for example, computed using an equation similar to eq. (2), where the conversion function (or conversion factor) can be a partial derivative of $g_d(CD)$, and (iv) the absolute value of partial derivative term $$\left(\text{i.e., } \left| \frac{\partial}{\partial d} g_d(CD) \right| \right)$$

is the conversion function (or conversion factor) that converts the process variable PDF to parameter PDF at a particular dose setting.

Thus, the dose PDF is converted to the CD PDF that can be further used to compute a probability that CD will be within a desired range per dose setting, failure probabilities of the patterning process, or other statistically interesting values. According to the present disclosure, computation of failure probabilities (or failure rate) is further discussed with respect to process P60.

In an embodiment, when the original functional relationship 1610 may be non-monotonic (i.e. one multiple process values may lead to the same parameter), the right part of eq. 3 will be replaced by a sum over the multiple process-values (e.g. dose).

Figure 11C:
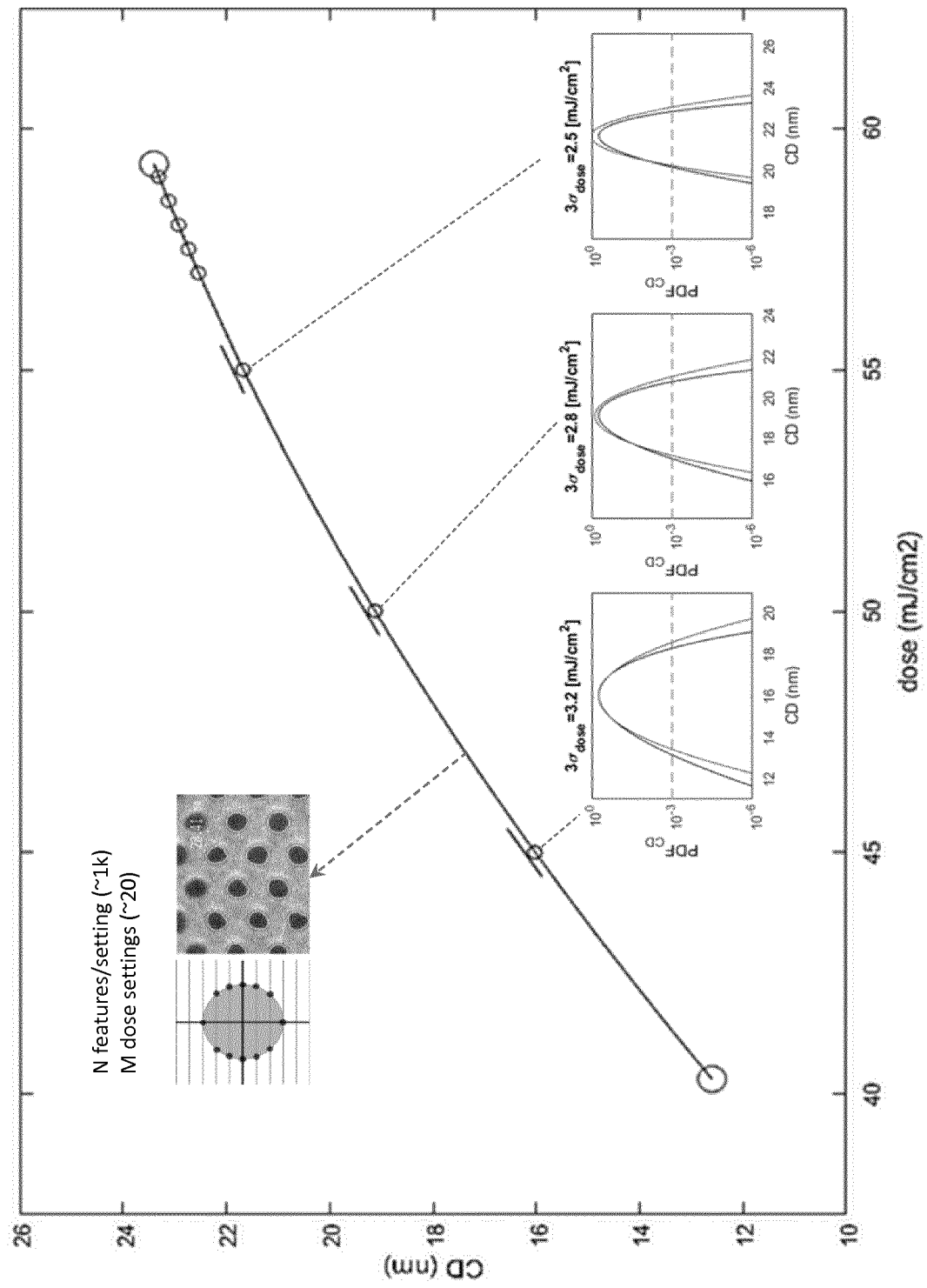
FIG. 11C illustrates example CD PDFs at different dose settings, according to an embodiment.

FIG. 11C, illustrates examples of the CD PDF 1630 obtained at different dose settings using, for example, equation (3) above. For example, a first CD PDF 1731 at a first dose setting 45 mJ/cm², a second CD PDF 1732 at a second dose setting 50 mJ/cm², and a third CD PDF 1733 at dose setting 55 mJ/cm², etc. may be obtained. The FIG. 11C also illustrates a standard normal CD PDF at each dose settings to illustrate deviation of the computed CD PDF from standard or normal distribution that typically assumes normal operating condition, while the actual operating conditions may be different from normal conditions; hence such CD PDF (e.g., 1731, 1732, 1733) provide a more realistic estimates (e.g., of failure probabilities) compared to assumed normal operation.

Referring back to FIG. 10, in process P40, failure rates of features with reference to the parameter (e.g., CD) may be obtained/measured per setting of the process variable (e.g., dose). In the present disclosure, the term failure rate and failure probability of a feature may be used interchangeably. In an embodiment, the failure rate of an individual feature can be expressed as, for example, 1 part per million (ppm) or 1 part per billion (ppb) of the feature of the pattern. In other words, 1 ppm may mean that 1 feature out of 1 million occurrences of the feature is expected to fail. In an embodiment, failure rates may correspond to different failure modes such as a physical failure, a transfer failure, and a postponed failure associated with individual features. A failure of a feature can be determined based on, for example, a failure analysis of a SEM image of the substrate or by electrical measurements.

Figure 11D:
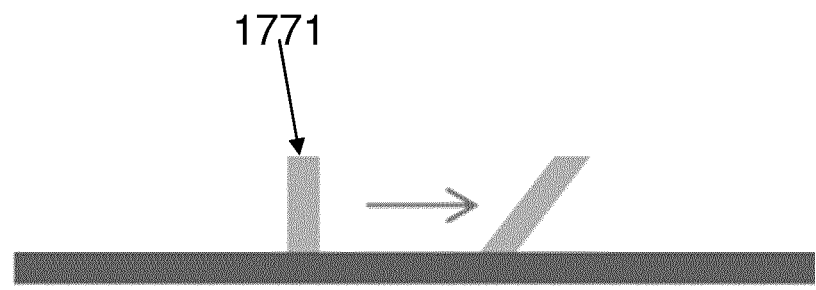
FIG. 11D illustrates an example failure mode, according to an embodiment.

In an embodiment, the physical failure may refer to a failure that can be quantified based on a physical aspect of a feature, for example, resist mechanically fails at a certain CD and/or the feature having certain CD does not transfer to the substrate. For example, the aspect ratio of a pillar (i.e., a vertical thickness to horizontal width ratio), a thickness of a resist, size of a contact hole, etc. or other measurable parameters. Based on the measurements, a physical failure can indicate that the CD of the feature has an aspect ratio greater than a threshold (e.g., >3) which causes the feature to failure. For example, in FIG. 11D, a pillar 1771 bends at an angle with respect to the substrate after the pattern transfer process or resist development as the aspect ratio is greater than 3. Hence, although the pillar is transferred to the substrate there is a physical deformation.

Figure 11E:
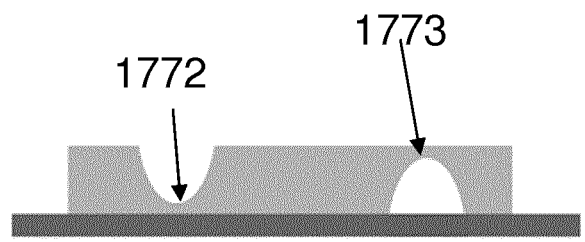
FIG. 11E illustrates another example failure mode, according to an embodiment.

In certain cases, a desired pattern may be only partially transferred or not transferred at all to the substrate. Such a failure may be referred to as a transfer failure. For example, out of 20 contact holes only 15 may be transferred and 5 holes may be missing both originally present in resist. Such missing holes may be termed as transfer failures. In an embodiment, the transfer failure may be due to the parameter being outside threshold limits of the patterning process. For example, in FIG. 11E, the contact hole may be too small (e.g., less than 5 nm) and the resist layer may be relatively thick which disallows transfer of such small contact holes. Hence, an incomplete transfer of pattern may be observed such as a footing 1772 may be observed where a contact hole may be blocked at the substrate. In another embodiment, a necking 1173 may observed in which, a top layer of the resist may not be removed while at the substrate an incomplete hole may be formed. In either case, a hole is not formed throughout the resist up to the substrate. Such transfer failure may be due to, for example, contact hole being too small to transfer to next layer or there may excess etch-loading due to resist thickness or resist type.

The postponed failure of the feature may be a failure that occurs in a next step of the patterning process due to a parameter (e.g. CD) outside its stipulated bounds in a current processing step. For example, failure of a feature occurring in a development stage after the patterning process.

It can be appreciated that the present disclosure is not limited to a type of failure. Also, in some cases, the types of failures may be used interchangeably to mean a failure in general. In an embodiment, the transfer failure may also be referred as a physical failure, or a postponed failure may also be referred as the physical failure. The present disclosure is not limited to a type of failure and generally any deviation from the design intent beyond a certain threshold may be considered as a failure.

Figure 11F:
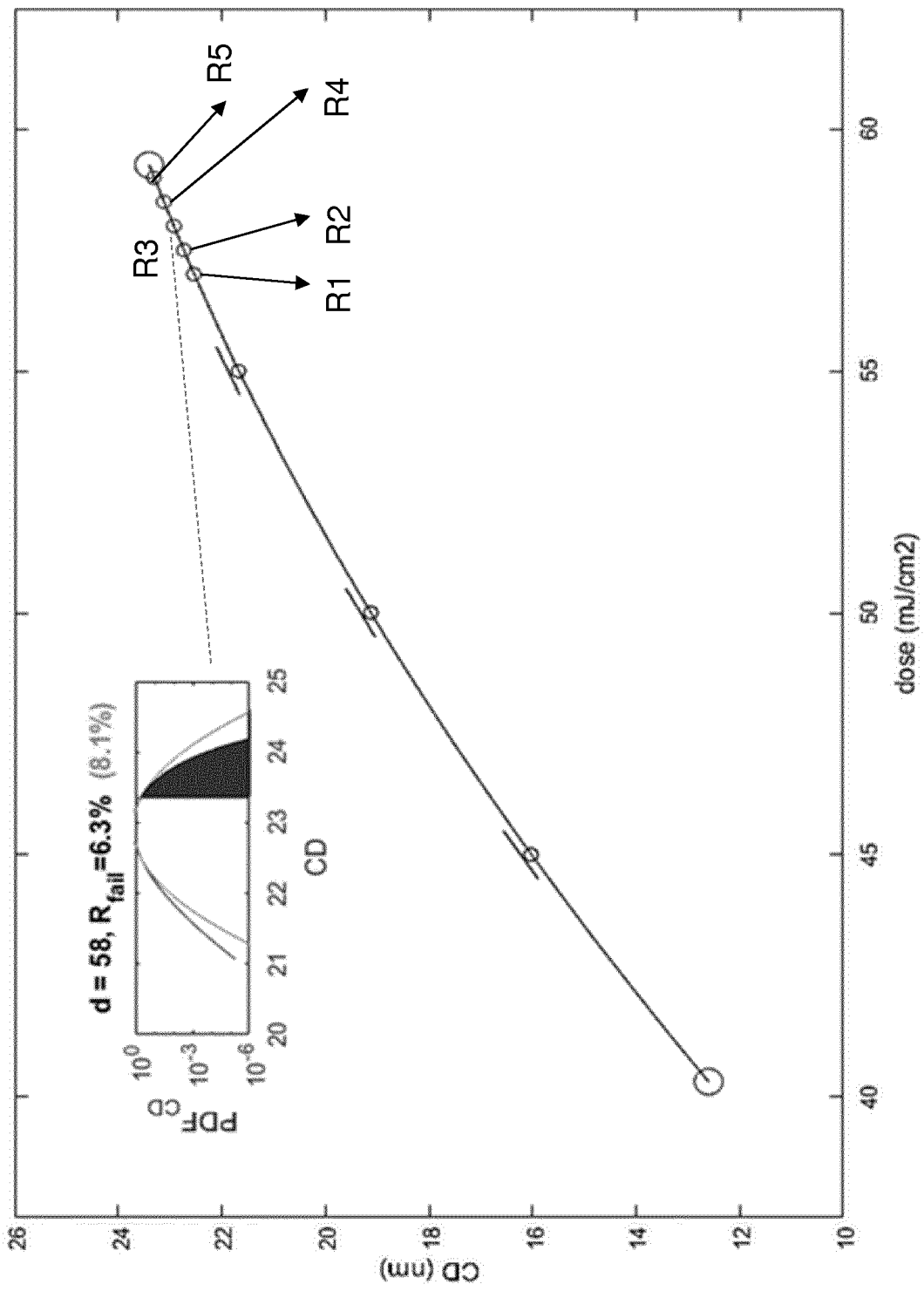
FIG. 11F illustrates an example parameter limit at a dose setting, according to an embodiment.
Figure 11G:
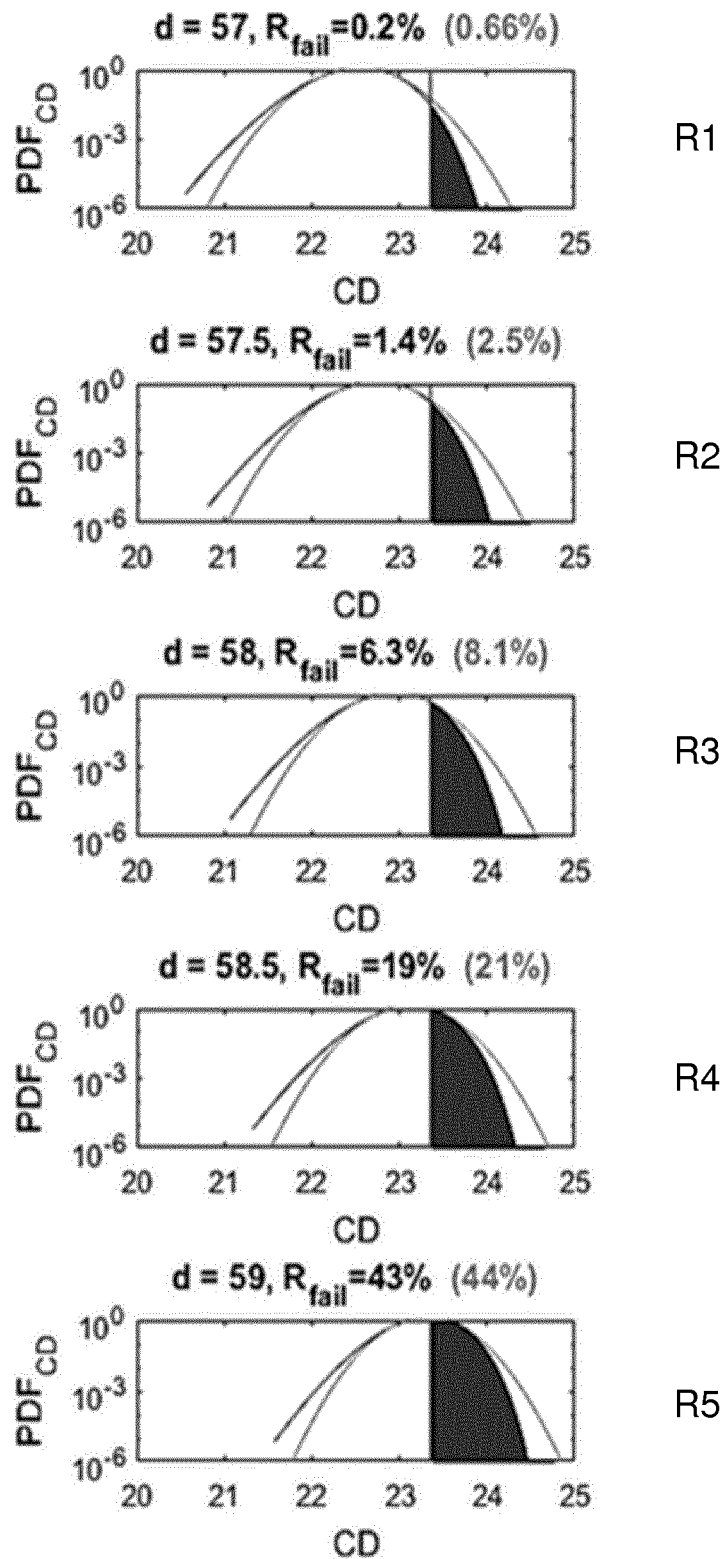
FIG. 11G illustrates an example parameter limit and related failure probabilities at different dose setting, according to an embodiment.

In an embodiment, the failure rates may be measured for failures that occur at ends of a curve fitted between the parameter and the process variable. For example, as shown in FIG. 11F and FIG. 11G, the failure rates may be measured at process parameters R1, R2, R3, R4, and R5. The failure measurement locations may be defined as location on the curve 1702 that are beyond a certain values of, for example, dose based on experience or prior observed failures. In the present example, the failure rate measurements are defined at both ends of the curve, i.e., having dose values above approximately 55 mJ/cm² and below or around 43 mJ/cm². In an embodiment, the one or more failures of the feature may weighted based on a frequency of a particular failure to generate a weighted failure rate of the feature. For example, if a contact hole failure occurs more often at a dose setting of approximately 43 mJ/cm², then a higher weight may be assigned to such failures at that dose setting. In another embodiment, a weighted function of the process variable may be obtained/generated based on a correlation between the one or more failures and the process variable. For example, the low dose (e.g., below 40 mJ/cm² in the examples herein) may be assigned a higher weight, since higher failures may be observed at such doses compared to other doses. Accordingly, a weighted parameter limit of the parameter and subsequently a process window may be computed based on the weighted function of the process variable.

In an embodiment, measurements of failure rate may be performed in a selective manner based on the process variable and parameter values. Further, a failure of the one or more feature may be correlated (e.g., by linear regression or other statistical techniques) to the parameter and/or the process variable. For example, one or more features may be sensitive to a higher dose and one or more features may be sensitive to a lower dose. In other words, for example, a feature A may have a higher probability of failure at a 50 mJ/cm² dose compared to at 45 mJ/cm² dose. During the patterning process, the dose may vary between different dies, as such the same feature (e.g., feature A) may be exposed at different doses that eventually affects the failure probability of the feature and hence failure probabilities of different dies. As such, depending on the dose and number of instances of a feature in a die, the failure probability may vary among different dies. In other words, for example, if a particular feature is more likely to fail at a high dose and a die of the substrate includes $10^6$ such features, then the failure rate of the die may be high (e.g., 1 per $10^4$) as opposed to a die exposed at a relatively lower dose.

In addition or alternatively, the failure may be related to the parameter such as CD. For example, a CD of a contact hole may be too small (e.g., less than a threshold such as less than 10 nm) which causes footing (i.e., a hole is not transferred to the substrate), a CD of the pillar may be too large that it causes the pillar to bend, CD (i.e., thickness) of the resist layer is too large which causes a necking, or CD is too large that random via contacts are observed, etc. Such correlation also enables determination of a failure rate of each individual feature as a function of the parameter and/or process variable. Hence, based on the failure rate of a feature, a sampling scheme may be defined for optimized measurements.

In an embodiment, based on the failure rate of a feature (e.g., feature A) and a scanner data (e.g., dose values) across a die and/or a substrate, a failure rate map may be generated/obtained by modelling and/or simulation of the relationship between the failure rate and the process variable (e.g., dose). Similarly, a map of the failure rate for the entire substrate may be determined based on the failure rate of a pattern and/or a die. Based on such failure rate map, a sampling scheme may be defined for measurements on the substrate. For example, the sampling scheme may be modified to take more measurements at certain dose values at certain locations on the substrate that have a relatively higher probability of failure, thus reducing the metrology burden and improving the efficiency of the patterning process. Also, based on the failure rate of the one or more features, the process variable, e.g., dose values may be modified to maximize the yield.

According to an embodiment, the failure rate, process variable and parameter may be related. For example, failure rate, dose values and CD are related, hence a CD limit may also be determined for each dose value to limit the failures and increase the yield of the patterning process. A process of determining such CD limit or parameter limit in general is discussed next.

In process P50, a parameter limit may be computed based on the measured failure rates per setting of the process variable and the parameter PDF such as 1630. The parameter limit can be a common theoretical limit at which less than a predetermined number or percentage (e.g., 50%) of features fail per setting of the process variable, further discussed with respect to FIGS. 11F and 11G. The parameter limit can be determined in an iterative manner based on a cumulative distribution of the parameter PDF. An example equation to determine a CD limit is provided in the following equation (4):

$$R_{fail} = \int_{CD_{lim}}^{\infty} PDF_{CD}(CD, d) DCE = 1 - CDF_{CD}(CD_{lim}, d) \quad (4)$$

In the equation (4) above, (i) $R_{fail}$ is a failure rate of a feature per setting of the process variable, i.e., dose; (ii) $PDF_{CD}$ (CD, d) refers to the parameter PDF such as PDF 1630 obtained in process P30; and (iii) $CDF_{CD}$ ($CD_{lim}$, d) is a cumulative distribution function of the $PDF_{CD}$ (CD, d) that provides a total probability of failure at and beyond the $CD_{lim}$. In an embodiment, $PDF_{CD}$ (CD, d) may be a normal distribution as discussed earlier. The parameter limit can be determined at one or more settings of the process variables (e.g. dose) with corresponding failure rates where the failing features do not influence each other's failure-rate (i.e. one can treat each failure as an "isolated failure"), yet a sufficient amount of them is present to limit the variance of the measured or determined failure-rate. A typical rate can be around approximately 1%. In an embodiment, the parameter limit may be a common parameter limit, the common parameter limit determined based on a plurality of probability density functions of the parameter, each probability density function of the parameter determined at a particular setting of the process variable, for example, as illustrated in FIG. 11G.

The determination of the parameter limit, using the equation (4), is further graphically explained for the parameter CD with respect to FIGS. 11F and 11G. In an example, the measured failure rates that are above a predetermined threshold (e.g., more than or equal to 50%) per setting can be compared to the computed total failure rate using $CDF_{CD}$ ($CD_{lim}$, d) to determine the $CD_{lim}$ of a feature per dose. Such $CD_{lim}$ of the feature suggests that at a particular dose, the CD value of the feature may not exceed the $CD_{lim}$ otherwise a high failure rate may be observed. For example, a $CD_{lim}$ can be 23.5 nm. A parameter limit set at 50% fail-rate represents the academic process-limit in the absence of stochastics. By determining the $CD_{lim}$ at multiple process variables one can validate that the process-variables relates in expected fashion to the related defect-mode.

FIG. 11F shows that at an end of the curve 1702, particularly around a relatively high dose value of 58 mJ/cm² for $CD_{lim}$ of 23.5, the failure rate (shaded region) may be 6.3% when computed using the parameter PDF 1630 (or 8.1% assuming a nominal distribution of CD). Similarly, FIG. 11G shows, for the $CD_{lim}$ of 23.5 nm, the failure rates at per dose setting may be within the desired limit. For example, the failure rates are: 0.2% at dose 57; 1.4% at dose 57.5; 6.3% at dose 58; 19% at dose 58.5; and 43% at dose 59. Thus, the $CD_{lim}$ of 23.5 nm satisfies the failure rate specification for several doses.

In another example, the failure rates may also be computed for the feature exposed at a relatively lower dose value (e.g., around 44 mJ/cm², see FIG. 11H) that may result in a second $CD_{lim2}$. Hence, a failure rate equation based on two different $CD_{lim1}$ and $CD_{lim2}$ can be a sum of the resist thickness of the feature at a lower end of the curve 1702 and the failure rate at a high end of the curve 1702, as follows:

$$R_{fail}(d) = \int_{-\infty}^{CD_{lim1}} PDF_{CD}(CD,d)dCD + \int_{CD_{lim2}}^{\infty} PDF_{CD}(CD,d)dCD \quad (5)$$

Referring back to FIG. 10, in process P60, after the parameter limit is determined, the failure rate equations such as (4) and (5) may also be used to estimate failure rates for any dose values. In other words, the parameter limits may be substituted in the failure rate equation (e.g., eq. 4 or 5) and the failure rate is treated as unknown. Such an equation where failure rate is unknown is referred as an estimated failure rate. The failure rate may be estimated/determined (or solved) for different values of the process variable (e.g., dose).

The estimated failure rate may be further used to determine a process window over the process variable (e.g., dose). For example, the process window can be a range of dose values for which the estimated failure rate may be less than $10^{-9}$. In an embodiment, a desired failure rate may be determined from a desired yield (e.g., 99.9% for $10^6$ features), for example, using the equation (6) below:

$$R_{fail}(d) = (1-Y(d)) \quad (6)$$

Figure 11H:
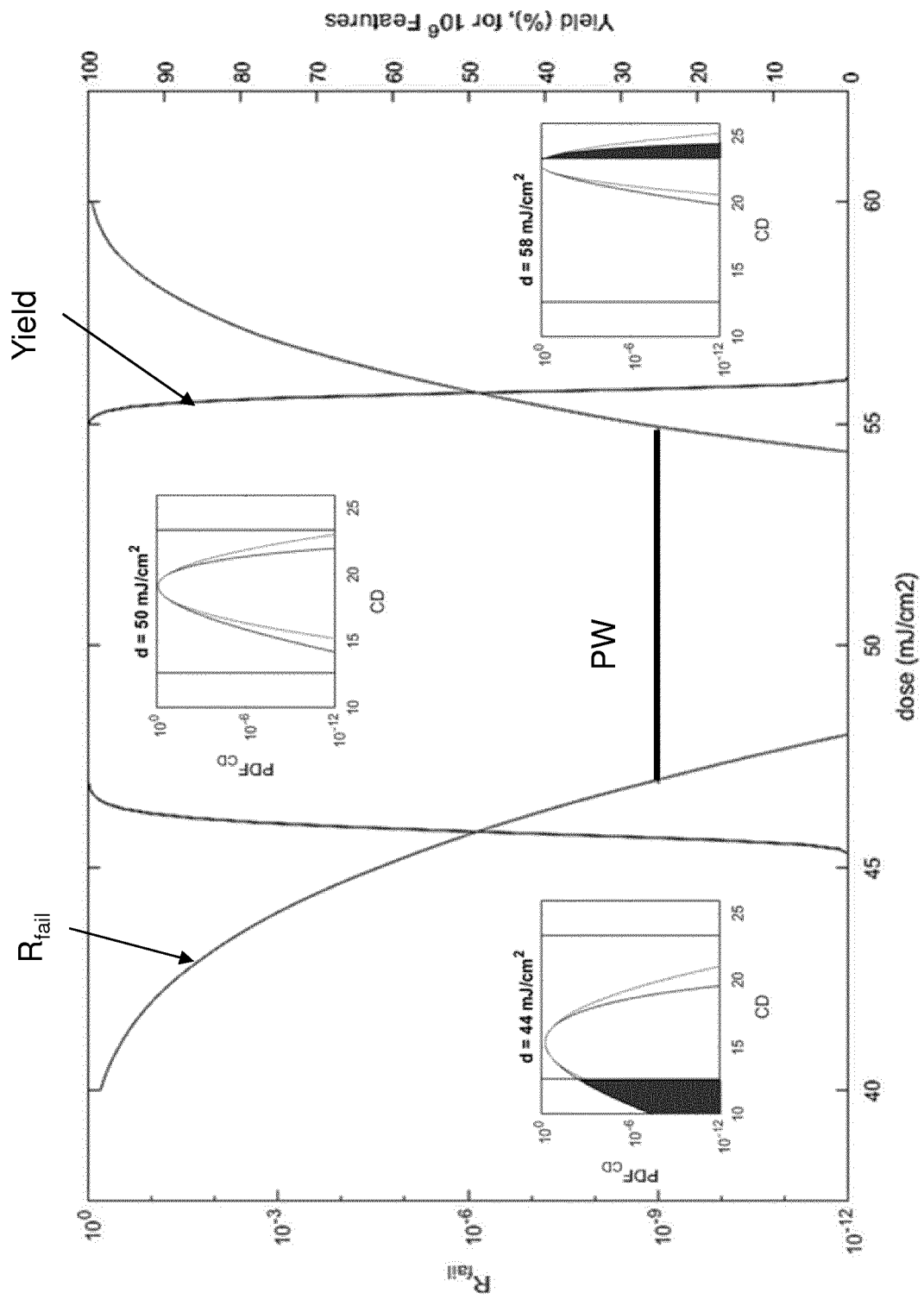
FIG. 11H illustrates an example process window, according to an embodiment.

In an embodiment, the process window may be determined graphically by plotting an estimated failure rate equation, as shown in FIG. 11H. For example, an estimated failure rate graph may be plotted against the process variable (e.g., dose). Then, a horizontal line can be drawn at a desired failure rate (e.g., $10^{-9}$) that may intersect with the estimated failure rate; the intersecting points provide the range of dose values i.e., the process window PW.

In an embodiment, a yield can be computed using the estimated failure rate (e.g., in eq. 4 or 5) as follows:

$$Y(d)=(1-R_{fail}(d))^N \quad (7)$$

In equation (7) above, Y(d) is the yield at a particular dose (d) for N individual features, and $R_{fail}(d)$ is the estimated failure rate (e.g., in eq. 4 or 5). Based on such computed yield, the process window can be selected where the computed yield is greater than or equal to the desired yield (e.g., 99.9%).

In an embodiment, the process window based on the yield may also be determined graphically, see FIG. 11H. For example, a computed yield graph (or estimated failure rate) may be plotted against the process variable (e.g., dose). Then, a line can be drawn at a desired yield (e.g., 99.9%) that may intersect with the yield graph (or the estimated failure rate), then, the intersecting points provide the range of dose values i.e., the process window PW. Thus, the process window not only defines the limits of the parameter of a feature that can be obtained from the patterning process, but also ensures that within such limits the feature is with desired yield or failure rate.

Furthermore, the above method can be extended to compute process window for each individual feature and an overlapping process window of different features may be determined to identify an effective process window for the patterning process. In addition, the process window can be defined over multiple process variables, for example, the above method can be performed at different alternative process-settings such as focus (or overlay, aberrations, track-temperature etc). Here, both the functional forms 1610, 1620, 1630 (e.g. $f_{CD}(d)$), $PDF_d(d)$, $PDF_{CD}(d)$) as well as the parameter limits $CD_{lim}$ may have these extra parameters as an additional dimensions (e.g. $CD_{lim}$ also including focus $CD_{lim}$ (focus)). Then, a two-dimensional dose-focus process window can be determined. Such 2-dimensional dose-focus window for different features is illustrated in FIGS. 12A and 12B, and further an overlapping processing window is illustrated in FIG. 12C.

Figure 12A:
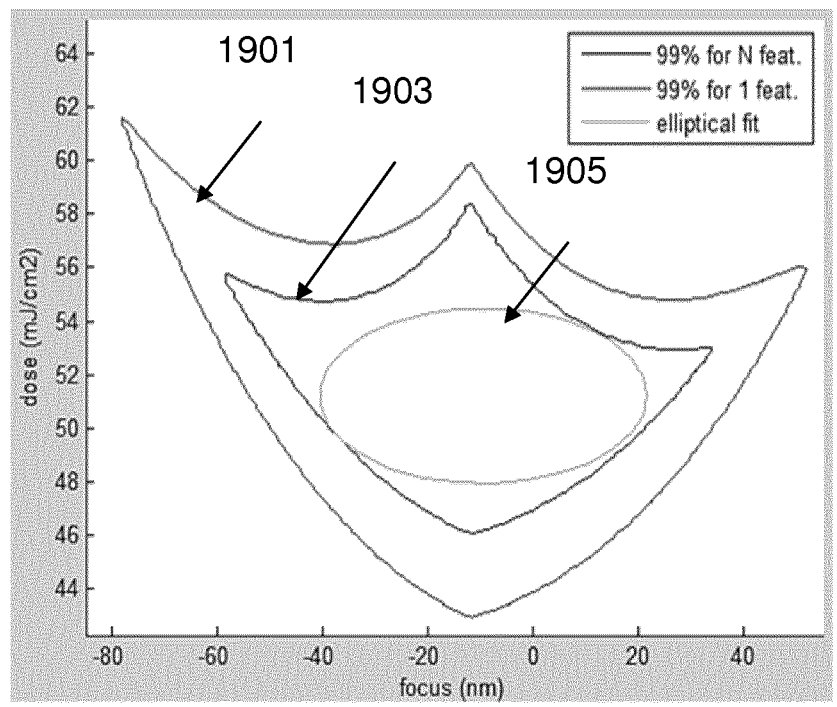
FIG. 12A illustrates an example process window for a first feature, according to an embodiment.

FIG. 12A illustrates a process window for a first feature (e.g., iso-contact hole features having a diameter of approximately 8 nm). A process window 1901 may be for a first feature, and a process window 1903 may be for N features. Further, the process window 1903 can be further refined by determining an elliptical process window 1905 within the bounds of the process window 1903 such that the elliptical process window 1905 has a relatively higher accuracy of (or lower variation in), for example, CD particularly at the boundary of the ellipse compared accuracy at the boundary of the process window 1903. It can be appreciated that the present disclosure is not limited to elliptical fit, and other appropriate fitting such as rectangular fit may be applied depending on other process variables or limitations (e.g. for strong correlation between process parameters, one can use rectangular fits while for non-correlated process parameters an elliptical fit can be used).

Figure 12B:
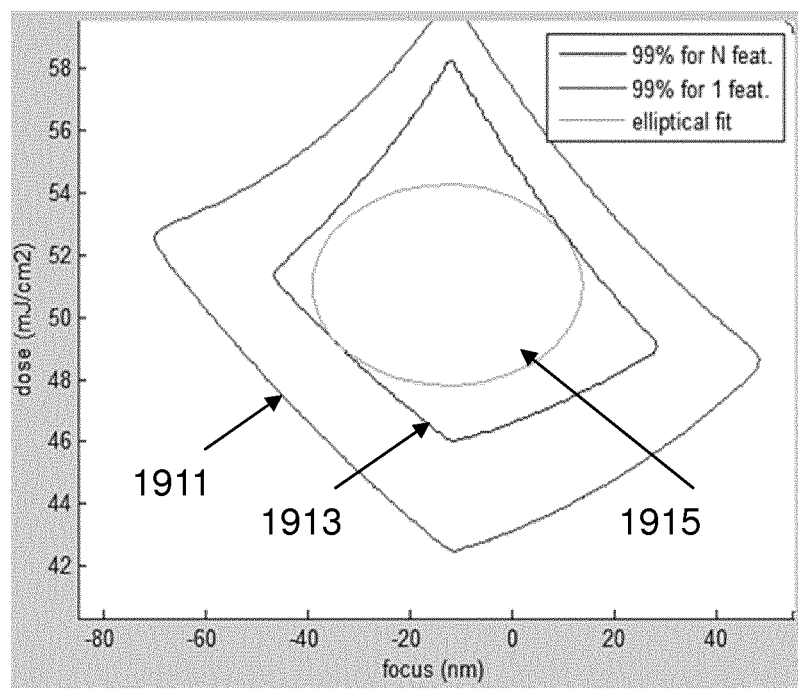
FIG. 12B illustrates an example process window for a second feature, according to an embodiment.

Similarly, in FIG. 12B, a process window for a second feature (e.g., dense-contact holes having a diameter of approximately 13 nm) can be determined. A process window 1911 may be for a single such feature, a process window 1913 can be for N ($10^4$) such features, and an elliptical window 1915 fitted within the process window 1913 for improved accuracy of the acceptable process-window for the patterning process.

Figure 12C:
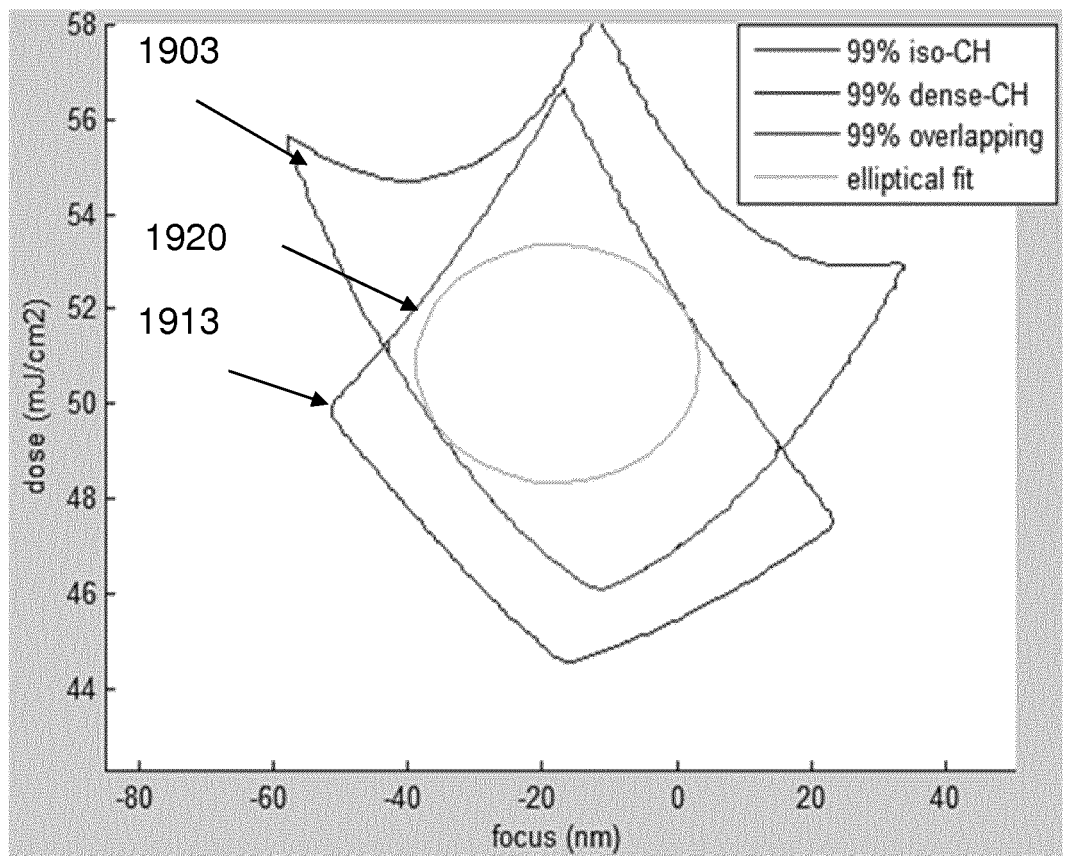
FIG. 12C illustrates an overlapping process window of FIGS. 12A and 12B, according to an embodiment.

Then, as shown in FIG. 12C, an overlapping process window 1920 can be determined from the process window 1903 of the first feature and the process window 1913 of the second window. The overlapping process window 1920 is a common region within the process window 1903 and 1913. For example, the overlapping process window 1920 can be determined by computing the product of the individual yields from which the first process window 1903 and the second process window 1913 were determined, where each process window can be a function of focus and dose. In another example, an intersection operation can be performed, where the process windows 1903 and 1913 are expressed in terms of set of values of, for example, dose and/or focus.

It can be appreciated by a person skilled in the art that the operation is not limited to calculating yield-products or intersection and any other appropriate mathematical operation/graphical approach/simulation can be performed to determine the overlapping process window 1920. Such overlapping process window 1920 between multiple features can be used as the process window for the entire substrate used in the patterning process to obtain a desired yield having with minimum defects.

Figure 13:
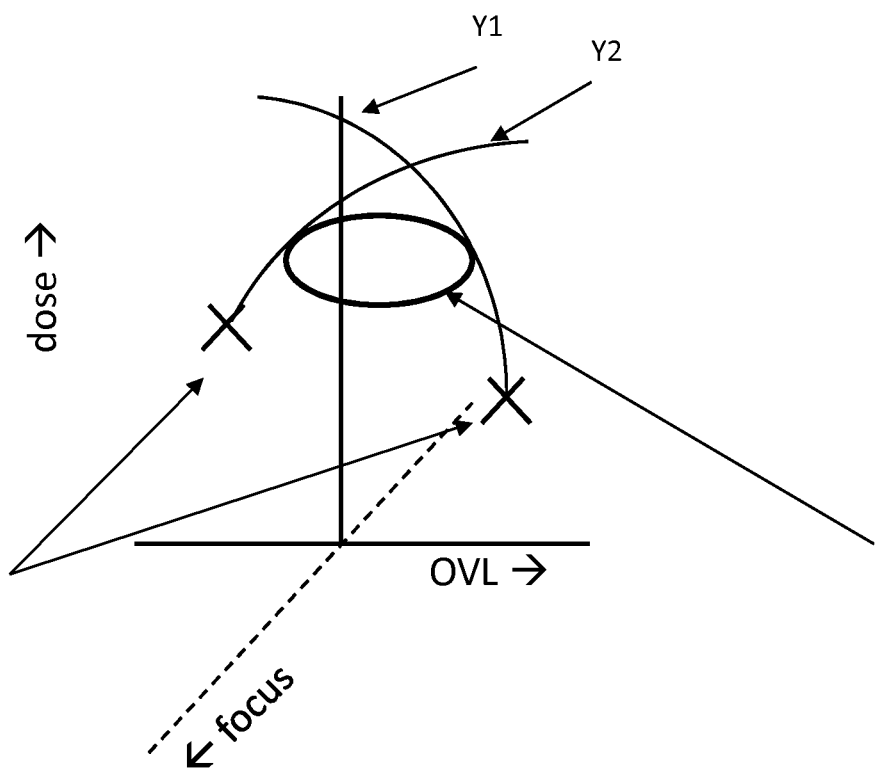
FIG. 13 illustrates a multidimensional process window, according to an embodiment.

Furthermore, the present disclosure is not limited to a two-dimensional process window (e.g., dose-focus process window). The method can be extended to provide a multi-dimensional process window. For example, a third variable, overlay, may be considered. Then, a yield and/or failure rates can be a function of dose, focus, overlay, or a combination thereof. Accordingly, the process window can be determined such that limits or specification based on all three process variables are satisfied. An example, multi-dimensional yield based process window is illustrated in FIG. 13. In FIG. 13, a first yield curve Y1 can be defined between overlay and dose and a second yield curve Y2 can be between focus and dose. Then an elliptical fit can be performed as a function of three variables (i.e., dose, focus, and overlay) such that the ellipse is bounded by the first yield curve Y1 and the second yield curve Y2. Then, the elliptical process window can be considered as the multi-dimensional process window. It can be appreciated that the term curve is used for visual clarity and understanding purposes only and is not limiting. The curve can be any function in general. Also, elliptical fit is also exemplary and other appropriate (e.g., rectangular) fit may be performed depending on process conditions that affect the process window.

In another embodiment, the method of FIG. 10 can be further extended to provide process window for an entire layer of a die having several features, each occurring multiple time per die of the substrate. For example, $$Y_{layer}(CD_{lim}) = \prod_{i=1}^{N} Y_i(CD_{lim}^i) \quad (8)$$

In equation (8) above, the yield $Y_i(CD_{lim}^i)$ refers to the desired yield of individual feature i having a CD limit $CD_{lim}^i$ and N is the total number of features on a particular layer. Then the yield of the layer is a product of the individual feature yield. The yield of the layer can be further used to compute the process window in a similar manner as discussed with respect to step P60, for example, using equations (6) and (7). The features can be grouped into "types" or "classes" when their parameter limits and $PDF_{CD}$ are similar to simplify the evaluation (e.g. a contact-hole and a line) for practical reasons in applications.

In an embodiment, the above method of determining a defect based (or yield based) process window can be further refined to provide a more accurate results. For example, by refining the variation of parameter used to compute the process variable PDF. The refined process variable PDF may be further used to compute a refined parameter PDF, which may give a more accurate processing window. In other words, a better estimate of the variance in parameter, by adjusting for known and/or stochastic variances caused by different factors within the patterning process, may be obtained to further generate more accurate results (i.e., a process window) compared to the above method.

Figure 14:
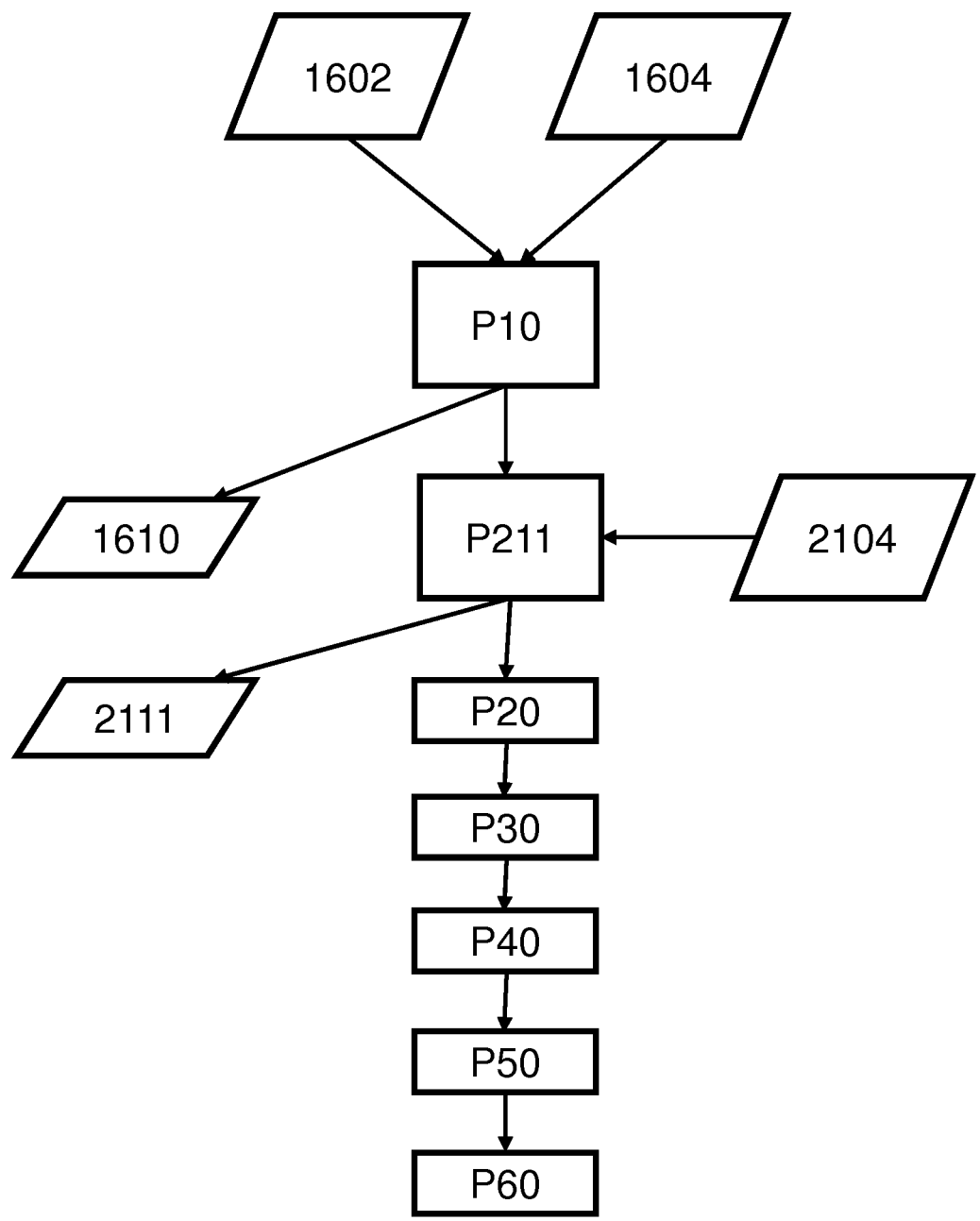
FIG. 14 schematically shows a flow for a method to refine a process window, according to an embodiment.

FIG. 14 is a flow chart of exemplary method used to modify the variation of the parameter and eventually the process window. As discussed with respect to FIG. 10, measurements of the parameter 1602 (e.g., a CD, overlay, etc.) and its variance thereof, and the process variable 1604 (e.g., dose, focus, etc.) can be obtained and a functional relationship between the parameter and the process variable may be established, for example, as discussed in process P10. It can be appreciated that the function relationship can a parameter (e.g., CD) be a function (e.g., eq. (1)) of one or more process variable (e.g., dose, focus, etc.). Furthermore, the function may also include one or more related parameters (e.g., overlay). The measurements 1602 of the parameter (e.g., CD) also provides a measured variance (e.g., $\sigma_{CD}$) of the parameter.

Such measured variance (e.g., $\sigma_{CD}$) of the parameter (e.g., CD) not only includes the variance associated with the process variable (e.g., dose), but also other variance caused by sources that may not be related to the process variable (e.g., dose). For example, sources other than the process variable that may contribute to the measured variance of the parameter may be metrology related, mask related, optical proximity correction, imaging error (e.g., involved in SEM based image analysis), etc. Hence, when a process variable PDF is computed using the measured variance without accounting for other variances, and such process variable PDF is further used to estimate the defect based process window, the resulting process window may not be accurate.

To further improve accuracy of the defect based process window, in process P211, a refined variance 2111 may be computed from the measured variance of the parameter by removing and/or accounting for variance contribution from other sources, so that the refined variance 2111 of the parameter is primarily associated with contributions from the process variable of interest (e.g., dose). The refined variance can be further used to determine the process variable PDF, as discussed in the process P20 above.

In an embodiment, the refined variance 2111 may be computed using the following equation (9):

$$\sigma_{CD}^2(d) = \sigma_{CD,measured}^2(d) - \sigma_{metro-noise}^2(d) - \text{MEEF}(d) \cdot \sigma_{mask}^2 \quad (9)$$

In equation (9) above, (i) $\sigma_{CD,measured}^2(d)$ is the measured variance in CD; (ii) $\sigma_{metro-noise}^2(d)$ is the variance due to metrology noise; and (iii) $\sigma_{mask}^2$ is the variance associated with mask, which is further multiplied by MEEF that is a Mask Error Enhancement Factor to account for the scaling (e.g., scaling down) effect of the mask pattern to the substrate.

The individual contributors of variance above can be, for example, measured by extending the classical matrix CD(E, F) by including a variation in mask bias and by repeating the measurements. In that case, the matrix is extended to CD(E, F,mask,iterations). The latter data is desired for at least a couple of CD(E,F) settings. Here mask stands for 2 or more measurements of the same feature at a different mask-bias and repeats for the number of times the same feature is measured. The MEEF is then defined by (CD+mask-CD-mask) or A(CD)mask. The mask distribution can be visualized/inspected by correcting for MEEF and the lithographic transfer by correcting the data for this: CD(mask)=CD(E,F, mask)-mean(CD(E,F,mask))/MEEF(E,F)

The impact of the stochastic variation in the mask-manufacturing can be refined by including a correction of the non-linear response of the lithographic system to the mask dimension. By measuring the non-linear mask variation by including multiple mask-CD's, one can model a non-linear response, e.g. through a polynomial relationship: CD(E,F,mask-delta(CD))=sum $a_j$(E,F)*mask^j. Because the actual distribution of the mask has been estimated above and this response is known, one can calculate a non-linear mask distribution per process-parameter setting (e.g. E,F)) by applying the same methodology as described in this embodiment (depicted in e.g. FIG. 25A).

It should be noted, the above variance is presented by way of example for clarity in understanding the present disclosure. However, the present disclosure is not limited to the above identified sources (e.g., mask and metro noise) of variance, other sources may be similarly included in determining the refined variance $\sigma_{CD}^2(d)$.

In an embodiment, the variance may be due to a systematic component that appears throughout the patterning process, and/or drift caused over a period of time in the patterning process. For example, systematic or drift related components can be OPC convergence residuals, SEM sensitivity error, SEM drift, scanner field-dependent effects (e.g., aberrations).

In an embodiment, the measured variance may also account for background variation that may not be related to dose. For example, background variation may be caused due to resist related parameters or other unknown variables of the patterning process. In case of resist related background correction, the background can be modelled and/or simulated based on the physics/chemistry of the resist layer in the patterning process. In an example, a resist process may be statistically modelled/simulated by assuming that the resist process follows a Poisson distribution. Then, the Poisson statistics (e.g., mean, variance, etc.) related to a number of blocks of polymers of the resist on a side wall of the feature may cause a background variance in the CD of the feature. Based on the background variance, the measured variance may be adjusted as follows:

$$\sigma_{CD}^2(d) = \sigma_{CD,measured}^2(d) - \sigma_{BG}^2 \quad (10)$$

In equation (9) above, (i) $\sigma_{CD}^2(d)$ is the refined variance of the parameter CD; and (ii) $\sigma_{BG}^2$ is the background variance.

The background variation can be determined in several ways. For example, measure a large amount of features at a single point on the dose-curve (e.g., curve 1702) where measured variance of the parameter (e.g. $\sigma_{CD,measured}$), and/or dose-sensitivity (DS) are minimum. The dose-sensitivity at a particular dose may be computed by taking a partial derivative $$\left(\text{e.g., } DS = \frac{\partial f_{CD}(d)}{\partial d}\right)$$

of the functional relationship (e.g., 1610) between the CD and dose at the particular setting. Hence, if the dose sensitivity is minimum, it implies that the contribution in variance of CD at that particular dose is not associated with the dose and such contribution (e.g., due to background) may be removed from the measured variance of CD.

In another example, the background contribution towards the measured variance of CD can be computed based on a convolution of two PDFs such as a first PDF associated with the dose-sensitivity (or, in general, sensitivity to process variable over which process window is to be determined), and a second PDF related to the background having a variance and assumed to have a normal distribution. The first PDF and the second PDF may be convoluted to determine the parameter PDF (e.g., PDF of CD), the convoluted PDF can then be compared to the PDF of the measured CD values. In another embodiment, Monte Carlo simulation can be performed with different variations of the first PDF and the second PDF that upon convolution can be fitted with the PDF of CD obtained from measurements or simulation thereof. Based on the fit (or lack thereof), a determination can be made whether the variation in first PDF leads to a relatively better fit than background PDF or vice-versa. For example, if variation in the background PDF leads to a relatively better fit, then that indicates the background variance may be dominant and may be accounted for in the variance of the parameter (i.e., CD) at the particular dose setting. In an example, the background contribution based on convolution of two or more PDFs can be determined, for example, using the following equation:

$$PDF_{CD} = PDF_{NL}(a. DS) \hat{\times} PDF_{CD}(\sigma_{BG}) \quad (11)$$

In equation (11) above, (i) $PDF_{CD}$ may be the parameter PDF, for example, determined from the measurements of the parameter or modeling/simulation; (ii) $PDF_{NL}$ (a. DS) is the process variable PDF determined by modeling/simulation based on the dose-sensitivity (DS), as discussed above; (iii) $PDF_{CD}(\sigma_{BG})$ is the parameter PDF having a background variance $\sigma_{BG}$ that can be determined by, for example, standard curve-fitting (e.g., maximum likelihood fit or mean square error based fitting) and/or Monte Carlo simulation based fitting; and (iv) $\hat{\times}$ is the convolution operator. The background variance $\sigma_{BG}$ determined using equation (11) can be further used to compute the refined variance, for example, using equation (9). The present disclosure is not limited to the above terms, furthermore, the equation (11) may include additional convolution terms of parameter PDFs or mask related PDF such as $PDF_{CD}$ (MEEF×$\sigma_{mask}$).

Once the refined variance (i.e., $\sigma_{CD}$) of the parameter is determined, the refined variance can be further used to determine a refined process variable PDF, for example, as discussed in process P20 of FIG. 10 and the equation(s) therein. Further, a refined parameter PDF may be computed, for example, as discussed in process P30 of FIG. 10 and the equation(s) therein. Furthermore, the refined parameter PDF may be used to determine the defect process window in a similar manner, for example, by following processes P40, P50, and P60 of FIG. 10 and the equation(s) therein. Hence, effectively, a refined processing window may be obtained compared to process window obtained when the measured variance of the parameter is used without any corrections/adjustments for components not related to the processing variable (e.g., dose).

Figure 15A:
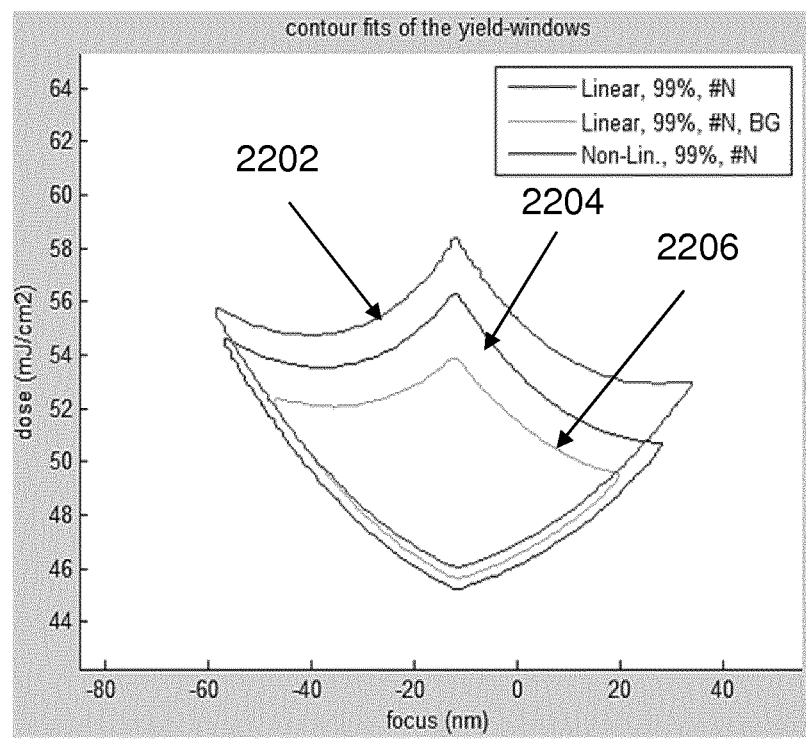
FIG. 15A illustrates examples of different process windows for a first feature, according to an embodiment.
Figure 15B:
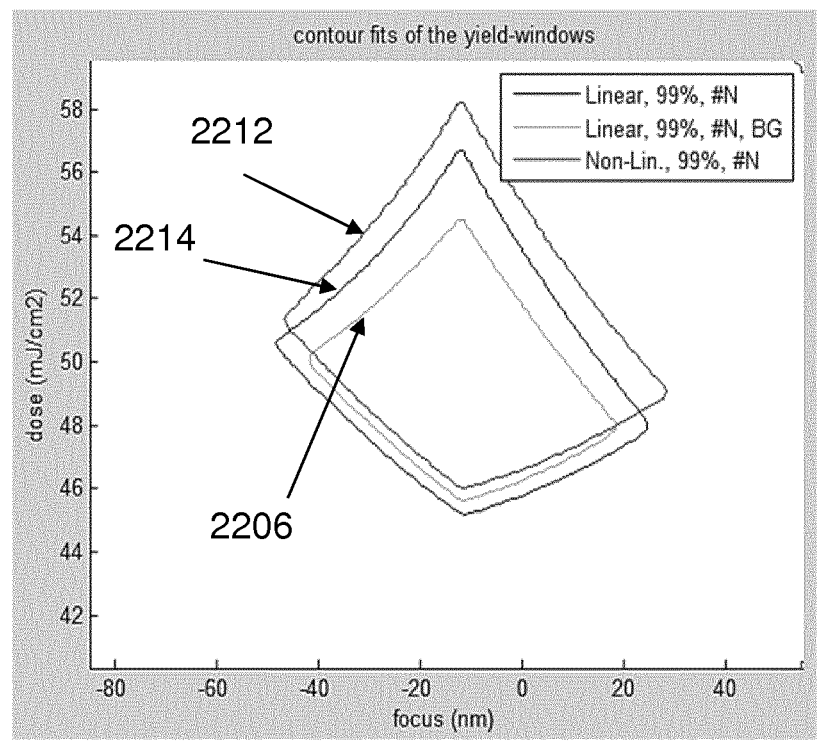
FIG. 15B illustrates examples of different process windows for a second feature, according to an embodiment.

FIGS. 15A and 15B illustrates the refined process windows 2206 and 2216, respectively, obtained for a first feature and a second feature respectively. FIG. 15A illustrates results of the methods in FIGS. 10 and 14 on the process window, as can be seen by a difference between a first process window 2202, a second process window 2204 and a third process window 2206. The first process window 2202 may be obtained considering a standard distribution, i.e., the process variable PDF is assumed to be standard (e.g., normal distribution) and not computed from the variance of parameter as discussed in FIG. 10. The second process window 2204 may be obtained using the method in FIG. 10. The second process window 2204 is offset from the first window 2202 towards relatively lower dose values, thus indicating that based on the measurements of the parameter (e.g., CD) of the patterning process, a lower dose values (at approximately similar focus) may be more appropriate compared to the first window 2202. Similarly, a further refinement of the second process window based on the background variation and/or variation unrelated to the process variable (e.g., dose), as discussed in method of FIG. 14 yields the third process window 2206. The third process window 2206 appears to be a subset of the second process window 2204 indicating that a subset of, for example, dose values are more appropriate compared to the first or the second process window.

Figure 16:
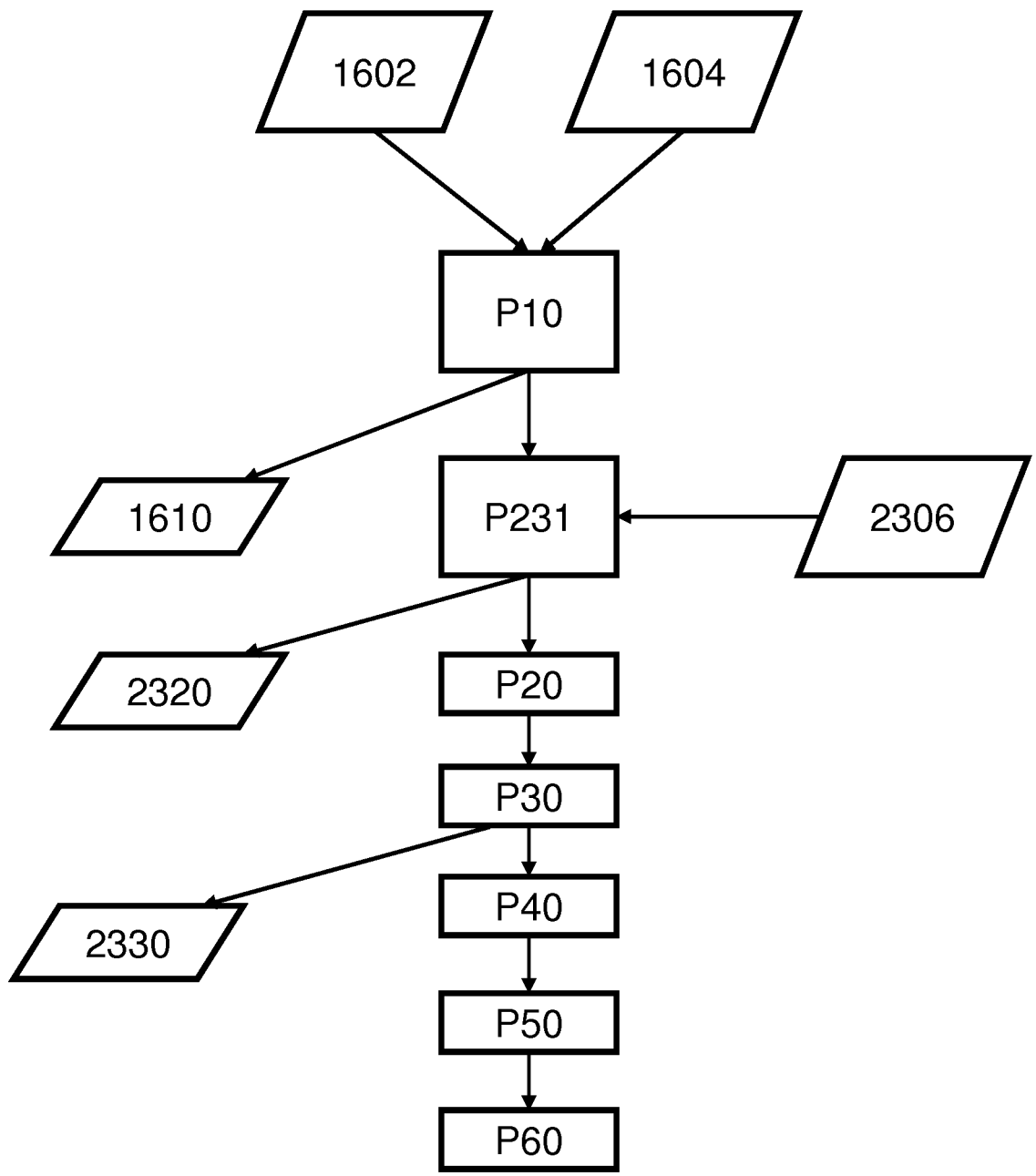
FIG. 16 schematically shows a flow for a method to refine a process window, according to an embodiment.

Similarly, FIG. 15B illustrates results of methods of FIGS. 16 and 14 for a second feature different from that used in FIG. 15A to obtain a first process window 2212, a second process window 2214, and the third process window 2216 that may be different from the process windows in FIG. 15A. For second feature as well, the third process window 2216 appears to be a subset of the second process window 2214 indicating that a subset of, for example, dose values are more appropriate compared to the first or the second process window.

The results and observations discussed above are for illustration purposes only to provide visual clarity and do not limit the methods discussed in the present disclosure.

The above methods of FIGS. 10 and 14 may be further extended to determine process window based on defects that may be observed in one or more post pattern transfer steps such as after an etching process that follows a pattern transfer step (e.g., after development). In other words, measurements may be performed in an after development inspection (ADI) step, after (intermediate) mask inspection (AMI), as well as after etch inspection (AEI) step. Such AEI measurements can be used to determine, for example, CD limits, and the process window in general. In certain situations, a defect in a feature may be observed, e.g., after development inspection, and the defect may still be repaired during and/or after an etching process (e.g., by trimming) While, in certain situations, a failure or defective pattern may be observed after the etching process although the pattern or feature may not have any defect after the development. Thus, measurements of parameter (e.g., CD) can be taken at different steps of the patterning process to determine and/or identify parameter limits and the process widow based on interdependency between different processes (e.g., ADI to AEI dependency and/or ADI to AMI).

Such process window can be determined by considering a transfer function between different processes of the patterning process, for example, a transfer function between the after development and after etch process. Such transfer function is a function that establishes a relationship between the parameter values measured after development and those measured after etching process. Hence, using such transfer impact of the process variable (e.g., dose) on the parameter measured after the etching process can be quantified. In other words, defects observed (or not observed) after the etching process can be used to determine the parameter limits and hence the process window.

FIG. 16 is a flow chart of an extended method to determine a process window according to an embodiment. In an embodiment, measurements of parameter after development 1602, a process variable 1604, and measurements of parameter after etching 2306 may be obtained, for example, from metrology tools used in the patterning process. The measurements 1602, 1604, and 2306 can be further used to determine a function relationship, similar to that discussed in process P10 above. In an embodiment, in process P10, a first functional relationship 1610 may be established between the measurements 1602 and 1604, using equation (1) discussed earlier.

In addition, in process P231, a second functional relationship 2320 may be established between the parameter and the process variable 2306, for example, using equation (12) below:

$$f_{CD\text{-}AEI}(d) = h(f_{CD\text{-}ADI}(d)) \tag{12}$$

In the second functional relationship (12), (i) $f_{CD\text{-}AEI}(d)$ refers to the parameter CD measured after the pattern is transferred (e.g. etched) into a mask and defined as a function of dose(d), (ii) h is a transfer function determined based on the physics/chemistry of the etching process and/or simulation, and (iii) $f_{CD\text{-}ADI}(d)$ refers to the parameter CD measured after the development, Furthermore, substituting for $f_{CD\text{-}AEI}(d)$ according to equation (1), the second functional relationship may be given by equation (13) below:

$$f_{CD-AEI}(d) = h\left(\sum_{n=0} a_n d_n\right) \tag{13}$$

Thus, the second relationship 2320, for example, in equation (13) captures the parameter variations due to the etching process via the transfer function h.

Furthermore, the process variable PDF 1620 can be computed in a similar manner as discussed in process P20. For example, the dose PDF 1620 can be obtained using dose variance computed using equation (2), in which the first functional relationship and the variance in the parameter obtained from the measurements after development inspection are used. Thus, the dose PDF accounts for CD variance after development process. In other words, the dose PDF can predict the probability of CD variation at a particular setting of dose.

Furthermore, in process P30, a parameter PDF 2330, for example, the CD PDF may be computed using a dose PDF, where the dose PDF may be determined (or modified from dose PDF 1620) using the second function relationship and based on the following equation (14):

$$PDF_{CD}(CD, d) = \tag{14}$$

$$PDF_d(g_g(CD_{AEI}), \sigma_d(g_d(CD_{AEI}))) * \left|\frac{\partial}{\partial d} g_d(CD_{AEI})\right|$$

In the equation (14) above, (i) $PDF_{CD}$ (CD, d) refers to the CD PDF 2330 which is a function of process variable i.e., dose (d); (ii) $g_d(CD_{AEI})$ is an inverse function of the second functional relationship (e.g., in eq. (13)) between the dose and CD; (iii) $PDF_d(g_d(CD_{AEI}), \sigma_d(g_d(CD_{AEI})))$ is the process variable PDF 2330, where $\sigma_d(g_d(CD_{AEI}))$ is a computed variance based on $g_d(CD_{AEI})$, for example, computed using an equation similar to eq. (2), where the conversion function (or conversion factor) can be a partial derivative of $g_d(CD_{AEI})$, and (iv) the absolute value of partial derivative term (i.e., $\left|\frac{\partial}{\partial d}g_d(CD_{AEI})\right|$)

is the conversion function (or conversion factor) that converts the process variable PDF to parameter PDF at a particular dose setting.

Thus, the CD PDF 2330 that can determine probability of failure of a feature due to etching process can be obtained. The CD PDF 2330 can be further used to compute a probability that CD will be within a desired range per dose setting, failure probabilities of the patterning process, or other statistically interesting values. According to the present disclosure, computation of failure probabilities (or failure rate) can be determined in a similar manner as discussed in process P60.

Furthermore, the parameter PDF 2330 may be used to determine the defect process window in a similar manner, for example, by following processes P40, P50, and P60 of FIG. 10 and the equation(s) therein. Hence, effectively, a processing window that accounts for defects that may occur in subsequent process(es) (e.g., AEI) may be obtained.

Figure 17:
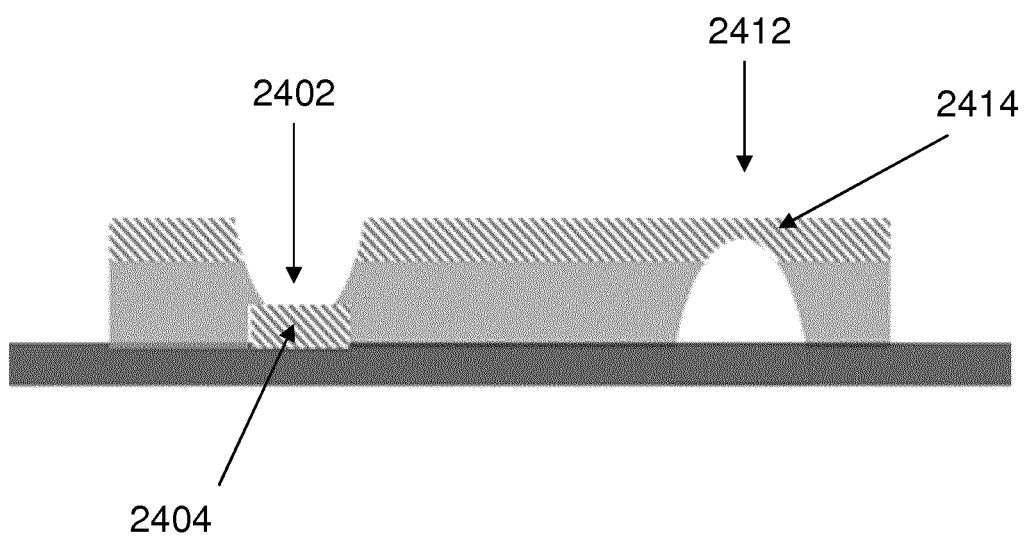
FIG. 17 illustrates an example application of methods, according to an embodiment.

In embodiment, the above methods may be applied to determine resist de-scumming, or other post patterning process and/or resist-type optimization. For example, as shown in FIG. 17, a footing 2402 and necking 2412 type of failure may be observed for certain setting of the process variable such as dose/focus. In case of footing, de-scumming may be performed to remove a foot 2404 at the substrate. In case of the necking 2412, a resist thickness may be reduced by removing a top layer 2414. Thus, defect-based process window may be improved at an expense of resist. In embodiment, modelling/simulation may be performed to determine an optimum thickness without changing/compromising the process window (i.e., having a desired yield), so less defects (e.g., necking/footing) may be observed.

In another application, the above methods may be applied during OPC calibration by modelling/simulation. For example, for the desired yield, the total number of features and their respective probabilities of failure, simulation (e.g., using Tachyon) may be performed to optimize OPC for lowest yielding feature.

Optical proximity correction (OPC) addresses the fact that, in addition to any demagnification by the lithographic projection apparatus, the final size and placement of an image of the patterning device pattern projected on the substrate will not be identical to, or simply depend only on the size and placement of, the corresponding patterning device pattern features on the patterning device. It is noted that the terms "mask", "reticle", "patterning device" are utilized interchangeably herein. Also, person skilled in the art will recognize that, especially in the context of lithography simulation/optimization, the terms "mask pattern," "reticle pattern" and "patterning device pattern" can be used interchangeably, as in lithography simulation/optimization, a physical patterning device is not necessarily used but a patterning device pattern can be used to represent a physical patterning device. For the small feature sizes and high feature densities present on some patterning device patterns, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the patterning device pattern is in accordance with requirements of a given target design, proximity effects should be predicted and compensated for, using sophisticated numerical models, corrections or pre-distortions of the patterning device pattern. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the patterning device pattern has some modification in order to achieve high fidelity of the projected image to the target design. These OPC modifications may include shifting or biasing of edge positions or line widths and/or application of "assist" features that are intended to assist projection of other features.

Application of model-based OPC to a target design involves good process models and considerable computational resources, given the many millions of features typically present in a device design. However, applying OPC is generally not an exact science, but an empirical, iterative process that does not always compensate for all possible proximity effects. Therefore, the effect of OPC, e.g., patterning device patterns after application of OPC and any other RET, should be verified by design inspection, e.g., intensive full-chip simulation using calibrated numerical process models, in order to reduce or minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured. Both OPC and full-chip RET verification may be based on numerical modelling systems and methods as described, for example in, U.S. Pat. No. 7,003,758 and an article titled "Optimized Hardware and Software For Fast, Full Chip Simulation", by Y. Cao et al., Proc. SPIE, Vol. 5754, 405 (2005), which are incorporated herein in their entireties by reference.

One of the simplest forms of OPC is selective bias. Given CD vs. pitch data, all of the different pitches could be forced to produce the same CD, at least at best focus and exposure, by changing the CD at the patterning device level. Thus, if a feature prints too small at the substrate level, the patterning device level feature would be biased to be slightly larger than nominal, and vice versa. Since the pattern transfer process from patterning device level to substrate level is non-linear, the amount of bias is not simply the measured CD error at best focus and exposure times the reduction ratio, but with modelling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. A process window being a range of values of two or more process parameters (e.g., focus and radiation dose in the lithographic apparatus) under which a feature is sufficiently properly created (e.g., the CD of the feature is within a certain range such as ±10% or ±5%). Therefore, the "best" bias to give identical CD vs. pitch may even have a negative impact on the overall process window, reducing rather than enlarging the focus and exposure range within which all of the target features print on the substrate within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the goals of device design and manufacturing is often to maximize the number of functional elements while minimizing the area required per chip, adding excess spacing is an undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a substrate under some or all conditions in the process window. Assist features can take on much more aggressive forms than simple hammerheads added to line ends, to the extent the pattern on the patterning device is no longer simply the desired substrate pattern upsized by the reduction ratio. Assist features such as serifs can be applied for many more situations than simply reducing line end pull back. Inner or outer serifs can be applied to any edge, especially two dimensional edges, to reduce corner rounding or edge extrusions. With enough selective biasing and assist features of all sizes and polarities, the features on the patterning device bear less and less of a resemblance to the final pattern desired at the substrate level. In general, the patterning device pattern becomes a pre-distorted version of the substrate-level pattern, where the distortion is intended to counteract or reverse the pattern deformation that will occur during the manufacturing process to produce a pattern on the substrate that is as close to the one intended by the designer as possible.

Another OPC technique involves using completely independent and non-resolvable assist features, instead of or in addition to those assist features (e.g., serifs) connected to the main features. The term "independent" here means that edges of these assist features are not connected to edges of the main features. These independent assist features are not intended or desired to print as features on the substrate, but rather are intended to modify the aerial image of a nearby main feature to enhance the printability and process tolerance of that main feature. These assist features (often referred to as "scattering bars" or "SBAR") can include sub-resolution assist features (SRAF) which are features outside edges of the main features and sub-resolution inverse features (SRIF) which are features scooped out from inside the edges of the main features. The presence of a SBAR adds yet another layer of complexity to a patterning device pattern. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the patterning device level.

An assist feature may be viewed as a difference between features on a patterning device and features in the patterning device pattern. The terms "main feature" and "assist feature" do not imply that a particular feature on a patterning device must be labelled as one or the other.

In addition to, or alternatively to, optimization to patterning device patterns (e.g., OPC), an illumination mode can be optimized, either jointly with patterning device optimization or separately, in an effort to improve the overall lithography fidelity. Many off-axis illumination modes, such as annular, quadrupole, and dipole, have been used, and provide more freedom for OPC design, thereby improving the imaging results, As is known, off-axis illumination is a proven way to resolve fine structures (i.e., target features) contained in the patterning device. However, when compared to a traditional illumination mode, an off-axis illumination mode usually provides less radiation intensity for the aerial image (AI). Thus, it becomes desirable to attempt to optimize the illumination mode to achieve the optimal balance between finer resolution and reduced radiation intensity. Several illumination optimization approaches can be found, for example, in an article by Rosenbluth et al., titled "Optimum Mask and Source Patterns to Print a Given Shape", Journal of Microlithography, Microfabrication, Microsystems 1(1), pp.13-20, (2002), which is incorporated herein in its entirety by reference.

The pressure of ever decreasing design rules drives semiconductor chipmakers to move deeper into low $k_1$ lithography. Lithography towards lower $k_1$ puts heavy demands on RET, exposure tools, and the need for litho-friendly design. So, to help ensure that the device design can be produced on to the substrate with workable process window, illumination mode—patterning device pattern optimization (referred to in some cases as source-mask optimization or SMO) is becoming a significant RET to achieve,e.g., smaller features.

So, for low $k_1$ photolithography, optimization of both the illumination mode and the patterning device pattern is useful to ensure a viable process window for projection of critical device patterns. Some algorithms (e.g. as described in Socha et al., "Simultaneous Source Mask Optimization (SMO)," Proc. SPIE Vol. 5853, 180-193 (2005), which is incorporated herein in its entirety by reference) discretize illumination into independent illumination distribution points and the patterning device pattern into diffraction orders in the spatial frequency domain, and separately formulate an objective function (which is defined as a function of selected design variables) based on process window metrics such as exposure latitude which could be predicted by optical imaging models from illumination distribution point intensities and patterning device pattern diffraction orders.

A further illumination mode and patterning device pattern optimization method and system that allows for simultaneous optimization of the illumination mode and the patterning device pattern using an objective function without constraints and within a practicable amount of time is described in PCT Patent Application Publication No. WO 2010/059954, titled "Fast Freeform Source and Mask Co-Optimization Method", which is hereby incorporated by reference in its entirety. Another illumination and patterning device optimization method and system that involves optimizing the illumination by adjusting pixels of the illumination distribution is described in U.S. Patent Application Publication No. 2010/0315614, titled "Source-Mask Optimization in Lithographic Apparatus", which is hereby incorporated by reference in its entirety.

Now, the patterning device referred to above can comprise one or more patterning device patterns. The patterning device pattern can be generated utilizing a CAD (computer-aided design) program, this process often being referred to as EDA (electronic design automation). Most CAD programs follow a set of predetermined design rules in order to create functional patterning device patterns for a patterning device. These rules are set by processing and design limitations. For example, design rules define the space tolerance between device features (such as gates, capacitors, etc.) or interconnect lines, so as to ensure that the devices or lines do not interact with one another in an undesirable way. The design rule limitation can be referred to as "critical dimensions" (CD). A critical dimension of a device can be defined as the smallest width of a line or hole or the smallest space between two lines or two holes. Thus, the CD determines the overall size and density of the designed device. One of the goals in device fabrication is to faithfully reproduce the original device design on the substrate (via the patterning device).

Further, in an optimization process of a system, a figure of merit of the system can be represented as an objective function (e.g., a cost function or a merit function). The optimization process typically boils down to a process of finding a set of parameters (design variables) of the system that minimizes or maximizes the objective function. The objective function can have any suitable form depending on the goal of the optimization. For example, the objective function can be weighted root mean square (RMS) of deviations of certain characteristics (evaluation points) of the system with respect to the intended values (e.g., ideal values) of these characteristics; the objective function can also be the maximum of these deviations. The term "design variables" as used herein comprises a set of parameters of a patterning process (e.g., of a lithographic process, a lithographic projection apparatus, etc.), for example, parameters that a user of a lithographic projection apparatus can adjust. It should be appreciated that any characteristics of a patterning process, including those of the illumination mode, the patterning device pattern (or the patterning device construction), the projection optics, and/or resist characteristics can be among the design variables in the optimization. The objective function is often a non-linear function of the design variables. Then standard optimization techniques are used to, e.g., minimize or maximize the objective function. The term "evaluation points" herein should be interpreted broadly to include any characteristics of the system or process. The design variables of the system can be confined to finite ranges and/or be interdependent due to practicalities of implementations of the system or process. In case of a lithographic projection apparatus, the constraints are often associated with physical properties and characteristics of the hardware such as tunable ranges, and/or patterning device manufacturability design rules (MRCs), and the evaluation points can include physical points on a resist image on a substrate, as well as non-physical characteristics such as dose and focus.

So, in a lithographic projection apparatus, an illumination system provides illumination (i.e. radiation) to patterning device and projection optics directs the illumination from the patterning device onto a substrate. In an embodiment, the projection optics enables the formation of an aerial image (AI), which is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. In an embodiment, simulation of a lithography process can simulate the production of the aerial image and/or resist image.

Figure 18:
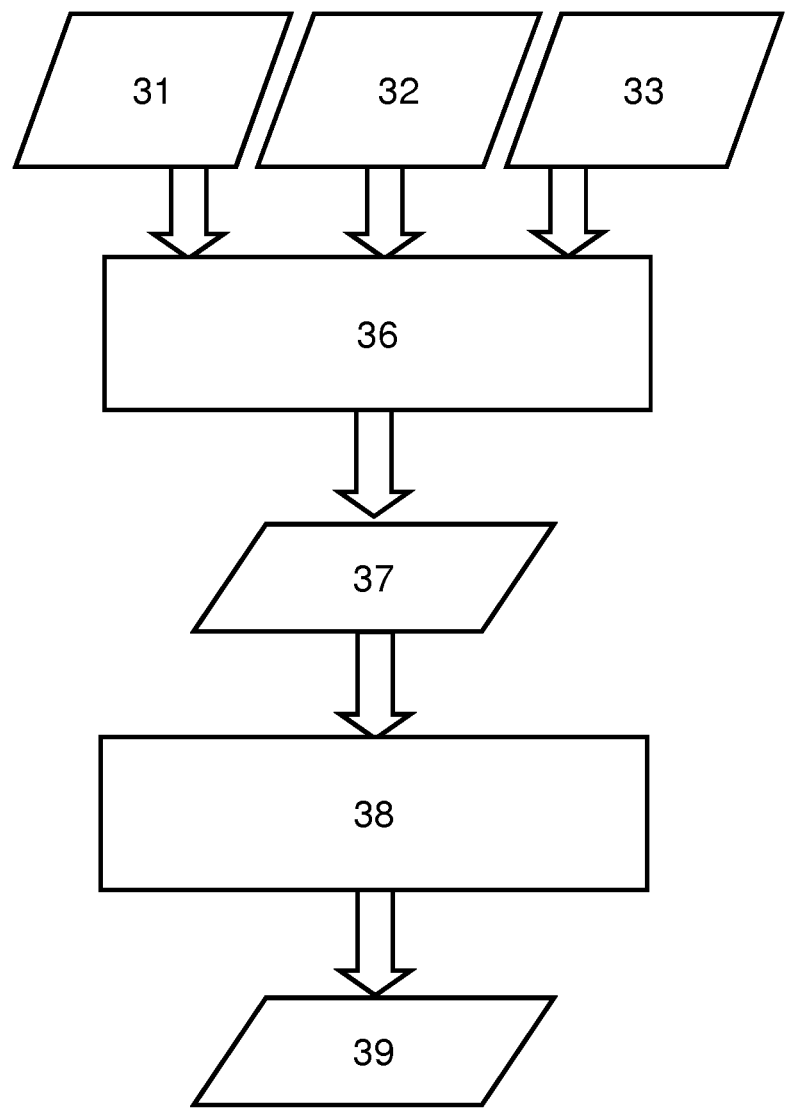
FIG. 18 is a block diagram of simulation models corresponding to the subsystems in FIG. 1, according to an embodiment.

An exemplary flow chart for modelling and/or simulating parts of a patterning process is illustrated in FIG. 18. As will be appreciated, the models may represent a different patterning process and need not comprise all the models described below.

An illumination model 31 represents optical characteristics (including radiation intensity distribution and/or phase distribution) of an illumination mode used to generate a patterned radiation beam. The illumination model 31 can represent the optical characteristics of the illumination that include, but not limited to, numerical aperture settings, illumination sigma (σ) settings as well as any particular illumination mode shape (e.g. off-axis radiation shape such as annular, quadrupole, dipole, etc.), where σ (or sigma) is outer radial extent of the illuminator.

A projection optics model 32 represents optical characteristics (including changes to the radiation intensity distribution and/or the phase distribution caused by the projection optics) of the projection optics. The projection optics model 32 may include optical aberrations caused by various factors, for example, heating of the components of the projection optics, stress caused by mechanical connections of the components of the projection optics, etc. The projection optics model 32 can represent the optical characteristics of the projection optics, including one or more selected from: an aberration, a distortion, a refractive index, a physical size, a physical dimension, an absorption, etc. Optical properties of the lithographic projection apparatus (e.g., properties of the illumination, the patterning device pattern and the projection optics) dictate the aerial image. Since the patterning device pattern used in the lithographic projection apparatus can be changed, it is desirable to separate the optical properties of the patterning device pattern from the optical properties of the rest of the lithographic projection apparatus including at least the illumination and the projection optics. The illumination model 31 and the projection optics model 32 can be combined into a transmission cross coefficient (TCC) model.

A patterning device pattern model 33 represents optical characteristics (including changes to the radiation intensity distribution and/or the phase distribution caused by a given patterning device pattern) of a patterning device pattern (e.g., a device design layout corresponding to a feature of an integrated circuit, a memory, an electronic device, etc.), which is the representation of an arrangement of features on or formed by a patterning device. The patterning device model 33 captures how the design features are laid out in the pattern of the patterning device and may include a representation of detailed physical properties of the patterning device and a patterning device pattern, as described, for example, in U.S. Pat. No. 7,587,704, which is incorporated by reference in its entirety.

A resist model 37 can be used to calculate the resist image from the aerial image. An example of such a resist model can be found in U.S. Pat. No. 8,200,468, which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 32.

Having these models, an aerial image 36 can be simulated from the illumination model 31, the projection optics model 32 and the patterning device pattern model 33. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 38 can be simulated from the aerial image 36 using a resist model 37. So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model 39. The post-pattern transfer process model 39 defines performance of one or more post-resist development processes (e.g., etch, CMP, etc.) and can produce a post-etch image.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Simulation of the patterning process can, for example, predict contours, CDs, edge placement (e.g., edge placement error), pattern shift, etc. in the aerial, resist and/or etched image. Thus, the objective of the simulation is to accurately predict, for example, edge placement, and/or contours, and/or pattern shift, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Details of techniques and models used to transform a patterning device pattern into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, 2010-0180251 and 2011-0099526, the disclosure of each which is hereby incorporated by reference in its entirety.

To facilitate the speed of evaluating the models, from the patterning device pattern, one or more portions may be identified, which are referred to as "clips." In a specific embodiment, a set of clips is extracted, which represents the complicated patterns in the patterning device pattern (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the patterning device pattern or may be similar or have a similar behavior of portions of the patterning device pattern where critical features are identified either by experience (including clips provided by a customer), by trial and error, or by running a full-chip simulation. Clips usually contain one or more test patterns or gauge patterns. An initial larger set of clips may be provided a priori by a customer based on known critical feature areas in a patterning device pattern which require particular image optimization. Alternatively, in another embodiment, the initial larger set of clips may be extracted from the entire patterning device pattern by using some kind of automated (such as, machine vision) or manual algorithm that identifies the critical feature areas.

Furthermore, various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When designing, modifying, etc. a part of a patterning process using, for example, the modeling described herein, it is possible and economical to focus on the hot spots. When the hot spots are not defective, it is most likely that all the patterns are not defective.

Returning back the modeling of the patterning process, an optimization can be performed using, for example, an objective function, such as $$CF(z_1, z_2, \ldots, z_N) = \sum_{p=1}^{P} w_p f_p^2(z_1, z_2, \ldots, z_N) \quad (15)$$

wherein $(z_1, z_2, \ldots, z_N)$ are N design variables or values thereof; $f_p(z_1, z_2, \ldots, z_N)$ may be a function of a defect metric at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, or any point on a patterning device pattern, or resist image, or aerial image.

The objective function may represent any suitable characteristics of the patterning process, such as of the lithographic projection apparatus or the substrate, for instance, focus, CD, image shift, image distortion, image rotation, etc. For example, the objective function may be a function of one or more of the following lithographic metrics: edge placement error, critical dimension, resist contour distance, worst defect size, pattern shift, stochastic effect, three-dimensional effect of the patterning device, three-dimensional effect of the resist, best focus shift, pupil fill factor, exposure time, and/or throughput. Since it is the resist image that often dictates the pattern on a substrate, the objective function often includes functions that represent some characteristics of the resist image. For example, $f_p(z_1, z_2, \ldots, z_N)$ of such an evaluation point can be simply a total number of defects in the resist image. The design variables can be any adjustable parameters such as adjustable parameters of the illumination mode, the patterning device pattern, the projection optics, dose, focus, etc.

The lithographic apparatus may include one or more components collectively called a "wavefront manipulator" that can be used to adjust shapes of a wavefront and intensity distribution and/or phase shift of the radiation beam. The wavefront and intensity distribution can be adjusted at any location along an optical path of the lithographic projection apparatus, such as before the patterning device, near a pupil plane, near an image plane, or near a focal plane. The projection optics can be used to correct or compensate for certain distortions of the wavefront and intensity distribution caused by, for example, the illumination, the patterning device, temperature variation in the lithographic projection apparatus, and/or thermal expansion of components of the lithographic projection apparatus. Adjusting the wavefront and intensity distribution can change values of the evaluation points and the objective function. Such changes can be simulated from a model or actually measured.

It should be noted that the normal weighted root mean square (RMS) of $f_p(z_1, z_2, \ldots, z_N)$ is defined as $$\sqrt{\frac{1}{P}\Sigma_{p=1}^{P} w_p f_p^2(z_1, z_2, \ldots, z_N)},$$

therefore, for example, minimizing the weighted RMS of $f_p(z_1, z_2, \ldots, z_N)$ is equivalent to minimizing the objective function $CF(z_1, z_2, \ldots, z_N) = \Sigma_{p=1}^{P} w_p f_p^2(z_1, z_2, \ldots, z_N)$, defined in Eq. 15. Thus the weighted RMS of $f_p(z_1, z_2, \ldots, z_N)$ and Eq. 15 may be utilized interchangeably for notational simplicity herein.

Further, if the process window (PW) is maximized, it is possible to consider the same physical location from different PW conditions as different evaluation points in the objective function in Eq. 15. For example, if N PW conditions are considered, then the evaluation points can be categorized according to their PW conditions and the objective functions can be written as:

$$CF(z_1, z_2, \ldots, z_N) = \Sigma_{p=1}^{P} w_p f_p^2(z_1, z_2, \ldots, z_N) = \Sigma_{u=1}^{U} \Sigma_{p_u=1}^{P_u} w_{p_u} f_{p_u}^2(z_1, z_2, \ldots, z_N) \quad (16)$$

where $f_{p_u}(z_1, z_2, \ldots, z_N)$ is a function of the defect metric of the $p_u$-th evaluation point for a set of values of the design variables of $(z_1, z_2, \ldots, z_N)$ under the u-th PW condition u=1, ..., U. When this defect metric is a failure rate, then minimizing the above objective function is equivalent to minimizing the defects under various PW conditions, which may lead to maximizing the PW. In particular, if the PW also includes different patterning device bias, then minimizing the above objective function also includes the minimization of mask error enhancement factor (MEEF), which is defined as the ratio between the substrate EPE and the induced patterning device pattern feature edge bias.

The design variables may have constraints, which can be expressed as $(z_1, z_2, \ldots, z_N) \in Z$, where Z is a set of possible values of the design variables. The constraints may represent, e.g., physical restrictions in a hardware implementation of the lithographic projection apparatus. The constraints may include one or more selected from: a tuning range, a rules governing patterning device manufacturability (MRC), and/or interdependence between two or more design variables.

The optimization process therefore is to find a set of values of the design variables, under the constraints $(z_1, z_2, \ldots, z_N) \in Z$, that, e.g., minimize the objective function, i.e., to find $$(\tilde{z}_1, \tilde{z}_2, \tilde{z}_N) = \arg\min_{(z_1, z_2, \ldots, z_N) \in Z} CF(z_1, z_2, \ldots, z_N) \quad (17)$$

$$= \arg\min_{(z_1, z_2, \ldots, z_N) \in Z} \Sigma_{p=1}^{P} w_p f_p^2(z_1, z_2, \ldots, z_N)$$

Figure 19:
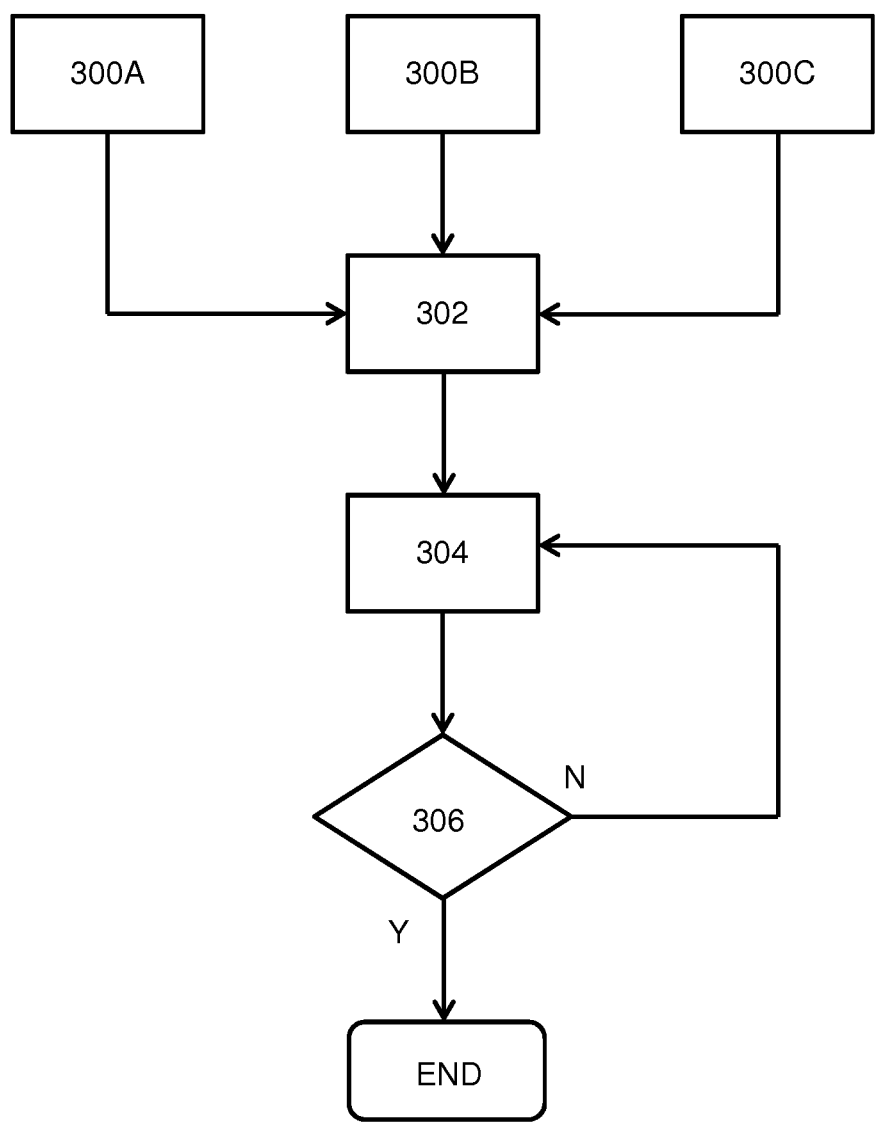
FIG. 19 shows a flow chart of a general method of optimizing the lithography projection apparatus, according to an embodiment.

A general method of optimizing the lithography projection apparatus, according to an embodiment, is illustrated in FIG. 19. This method comprises a step 302 of defining a multi-variable objective function of a plurality of design variables. The design variables may comprise any suitable combination selected from: one or more characteristics of the illumination mode (300A) (e.g., pupil fill ratio, namely percentage of radiation of the illumination that passes through a pupil or aperture), one or more characteristics of the projection optics (300B) and/or one or more characteristics of the patterning device pattern (300C). For example, the design variables may include characteristics of the illumination mode (300A) and characteristics of the patterning device pattern (300C) (e.g., global bias) but not characteristics of the projection optics (300B), which leads to a SMO. Alternatively, the design variables may include characteristics of the illumination mode (300A), characteristics of the projection optics (300B) and characteristics of the patterning device pattern (300C), which leads to an optimization of the illumination, the patterning device pattern and the projection optics (sometimes referred to as a source-mask-lens optimization (SMLO)). In step 304, the design variables are simultaneously adjusted so that the objective function is moved towards convergence. In step 306, it is determined whether a predefined termination condition is satisfied. The predetermined termination condition may include various possibilities, e.g., the objective function may be minimized or maximized, as required by the numerical technique used, the value of the objective function is equal to a threshold value or has crossed the threshold value, the value of the objective function has reached within a preset error limit, and/or a preset number of iterations of the objective function evaluation is reached. If a termination condition in step 306 is satisfied, the method ends. If the termination condition in step 306 is not satisfied, the steps 304 and 306 are iteratively repeated until a desired result is obtained. The optimization does not necessarily lead to a single set of values for the design variables because there may be physical restraints caused by factors such as the pupil fill factor, the resist chemistry, the throughput, etc. The optimization may provide multiple sets of values for the design variables and associated performance characteristics (e.g., the throughput) and allows a user of the lithographic apparatus to pick one or more sets.

In an embodiment, instead of, or in addition to, calculating and/or determining the effect on the optical characteristics of the illumination system and/or projection optics, it is envisioned that adjustable optical characteristics of the illumination system and/or projection optics can be included in the design variables. Exemplary adjustable optical characteristics may include one or more lens manipulators, temperature data or a signal associated with temperature data of one or more devices, e.g. a heater, utilized to control the temperature of an optical element of the illumination system and/or projection system, one or more Zernike coefficients, etc. The SMO or SMLO procedure can then be carried out and the design variables, including the adjustable optical characteristics, can be simultaneously adjusted so that the objective function is moved towards convergence.

In FIG. 19, the optimization of all the design variables is executed simultaneously. Such flow may be called the simultaneous optimization, joint optimization, or co-optimization. The terms "simultaneous", "simultaneously", "joint" and "jointly" as used herein mean that the design variables of the characteristics of the illumination mode, patterning device, projection optics and/or any other design variables, are allowed to change at the same time.

Figure 20:
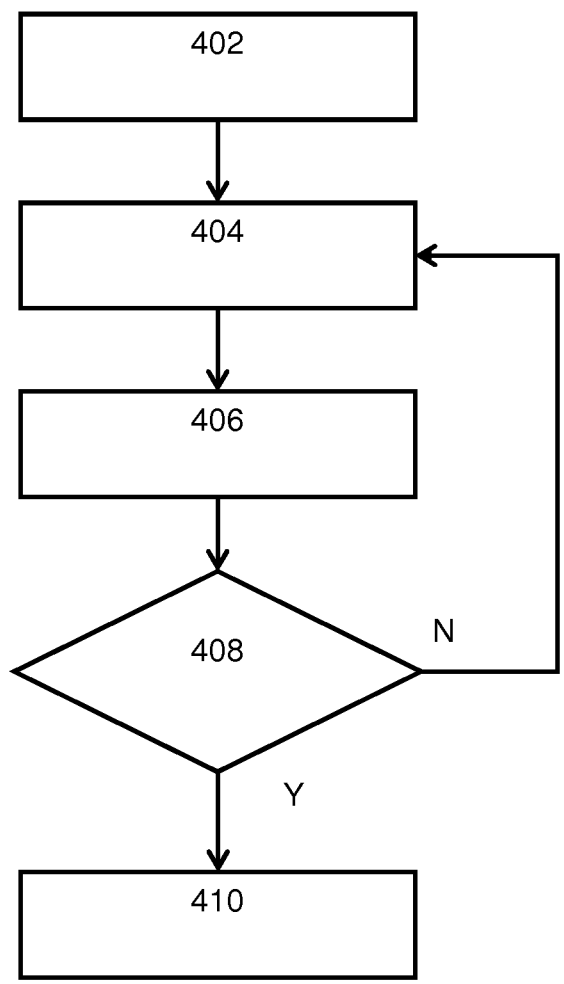
FIG. 20 shows a flow chart of a method of optimizing the lithography projection apparatus where the optimization of all the design variables is executed alternately, according to an embodiment.

Alternatively, the optimization of all the design variables is executed alternately, as illustrated in FIG. 20. In this flow, in each step, some design variables are fixed while the other design variables are optimized as part of evaluation of the objective function; then in the next step, a different set of variables are fixed while the others are optimized as part of evaluation of the objective function. These steps are executed alternately until convergence or certain terminating conditions are met. As shown in the non-limiting example flowchart of FIG. 20, first, a patterning device pattern (step 402) is obtained, then a step of illumination mode optimization is executed in step 404, where all the design variables of the illumination mode are optimized (SO) as part of evaluation of a suitable objective function while all the other design variables are fixed. Then in the next step 406, a mask optimization (MO) is performed, where all the design variables of the patterning device are optimized as part of evaluation of a suitable objective function while all the other design variables are fixed. These two steps are executed alternately, until certain terminating conditions are met in step 408. Various termination conditions can be used, such as, the value of the objective function becomes equal to a threshold value, the value of the objective function crosses the threshold value, the value of the objective function reaches within a preset error limit, or a preset number of iterations of evaluation of the objective function is reached, etc. Note that SO-MO-Alternate-Optimization is used as an example for the alternative flow. The alternate flow can take many different forms, such as SO-LO-MO-Alternate-Optimization, where SO, LO (Lens Optimization) is executed, and MO alternately and iteratively; or first SMO can be executed once, then execute LO and MO alternately and iteratively; and so on. Finally the output of the optimization result is obtained in step 410, and the process stops.

The pattern selection algorithm, as discussed before, may be integrated with the simultaneous or alternate optimization. For example, when an alternate optimization is adopted, first a full-chip SO can be performed, the 'hot spots' and/or 'warm spots' are identified, then a MO is performed. In view of the present disclosure numerous permutations and combinations of sub-optimizations are possible in order to achieve the desired optimization results.

Figure 21:
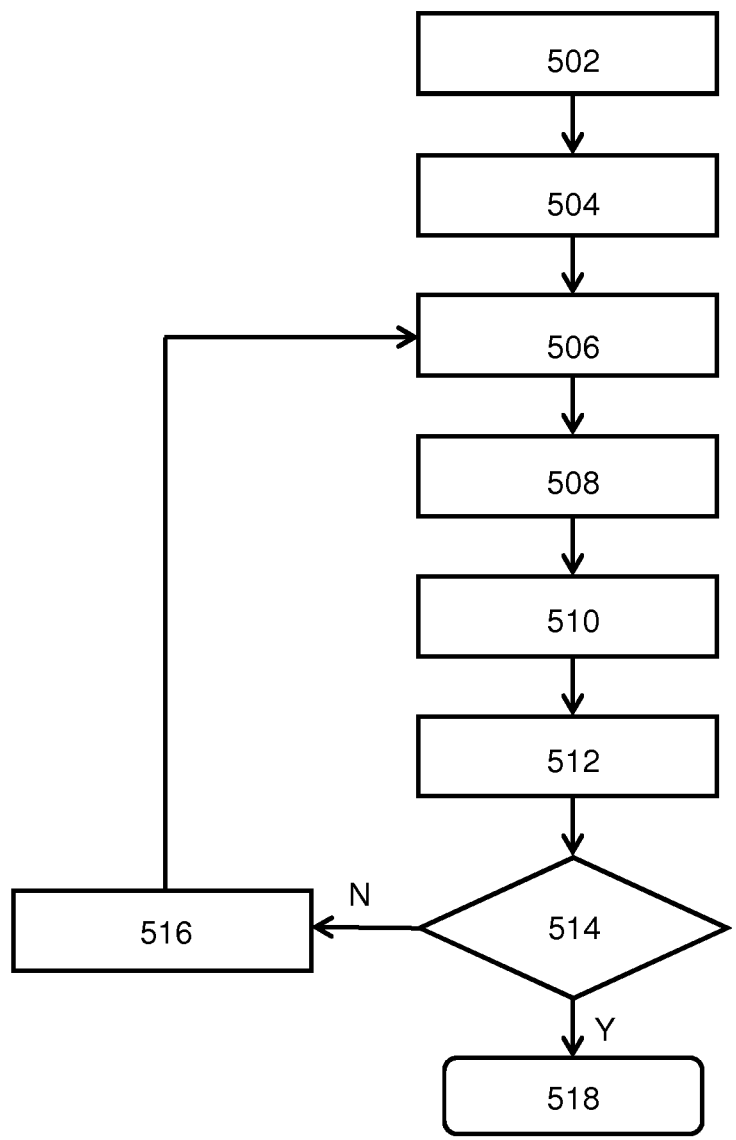
FIG. 21 shows one exemplary method of optimization, according to an embodiment.

FIG. 21 shows one exemplary method of optimization, where an objective function is defined and evaluated. In step 502, initial values of design variables are obtained, including their tuning ranges, if any. In step 504, the multi-variable objective function is set up. In step 506, the objective function is expanded within a small enough neighborhood around the starting point value of the design variables for the first iterative step (i=0). In step 508, standard multi-variable optimization techniques are applied to minimize or maximize the objective function. Note that the optimization can have constraints, such as tuning ranges, during the optimization process in 508 or at a later stage in the optimization process. Each iteration is evaluated using given test patterns (also known as "gauges") for the identified evaluation points that have been selected to optimize the lithographic process. In step 510, a lithographic response (e.g., one or more certain characteristics of an aerial image, one or more certain characteristics of a resist image, or one or more certain characteristics of the lithographic process such as the process window) is predicted. In step 512, the result of step 510 is compared with a desired or ideal lithographic response value. If the termination condition is satisfied in step 514, i.e. the optimization generates a lithographic response value sufficiently close to the desired value, and then the final value of the design variables is outputted in step 518. The output step may also include outputting other functions using the final values of the design variables, such as outputting a wavefront aberration-adjusted map at the pupil plane (or other planes), an optimized illumination mode map, an optimized patterning device pattern (e.g., including optical proximity corrections), etc. If the termination condition is not satisfied, then in step 516, the values of the design variables is updated with the result of the i-th iteration, and the process goes back to step 506. An algorithm, such as the Gauss-Newton algorithm, the Levenberg-Marquardt algorithm, the gradient descent algorithm, simulated annealing, the genetic algorithm, etc. can be applied to evaluate and solve the objective function.

Optimizing a patterning process can expand the process window. A larger process window provides more flexibility in process design and device design. The process window can be defined as a set of focus and dose values for which the resist image are within a certain limit of the design target of the resist image. Note that all the methods discussed here may also be extended to a generalized process window definition that can be established by different or additional base parameters in addition to or other than exposure dose and defocus. These may include, but are not limited to, optical settings such as NA, optical sigma, optical aberrations, polarization, or optical constants of the resist layer. For example, as described earlier, if the PW also involves different mask bias, then the optimization can include the minimization of MEEF. The process window defined on focus and dose values only serve as an example in this disclosure.

A method of maximizing the process window, according to an embodiment, is described below. In a first step, starting from a known condition ($f_0$, $E_0$) in the process window, wherein $f_0$ is a nominal focus and $\varepsilon_0$ is a nominal dose, there is performed minimization of one of the example objective functions below in the vicinity ($f_0 \pm \Delta f$, $\varepsilon_0 \pm \varepsilon$):

$$CF(z_1, z_2, \ldots, z_N, f_0, \varepsilon_0) = \min_{(f,\varepsilon)=(f_0 \pm \Delta f, \varepsilon_0 \pm \varepsilon)} \left( \max_p \left| f_p(z_1, z_2, \ldots, z_N, f, \varepsilon) \right| \right) \quad (18)$$

or $$CF(z_1, z_2, \ldots, z_N, f_0, \varepsilon_0) = \min \left( \max \sum_{(f,\varepsilon)=(f_0 \pm \Delta f, \varepsilon_0 \pm \varepsilon)} \sum_p w_p f_p^2(z_1, z_2, \ldots, z_N, f, \varepsilon) \right) \quad (19)$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N, f, \varepsilon)$ can be found such that the objective function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose so. In an alternative embodiment, $(f_0 \pm \Delta f, \varepsilon_0 \pm \varepsilon)$ is accepted as part of the process window, if a set of values of $(z_1, z_2, \ldots, z_N)$ can be found such that the objective function is within a preset limit.

The methods described earlier in this disclosure can be used to minimize the respective objective functions of equation (18) or (19). If the design variables are characteristics of the projection optics, such as the Zernike coefficients, then minimizing the objective functions of equation (18) or (19) leads to process window maximization based on projection optics optimization, i.e., LO. If the design variables are characteristics of the illumination mode and patterning device pattern in addition to those of the projection optics, then minimizing the objective function of equation (18) or (19) leads to process window maximizing based on SMLO. If the design variables are characteristics of the illumination mode and the patterning device pattern, then minimizing the objective functions of equation (18) or (19) leads to process window maximization based on SMO.

The optimization described above may be used to find a set of values of $(z_1, z_2, \ldots, z_N)$ to reduce many physical effects that may be adverse to the lithographic process. Multiple optimizations may be conducted in series for different physical effects, on different components of the lithographic apparatus, and under different conditions.

The methods related to the source/mask/source-mask optimization, discussed above, include the use of linearized functions selected to optimize the printed wafer contour throughout the process window. The merit function is typically based on a pure optical model because optics in photolithography systems tend to determine a majority of the process constraints. In one example, the merit function may be selected to reduce the worst edge placement error of a design layout throughout the process window.

The present disclosure describes a method to obtain a process window based on a defect criteria, expressed as a defect metric, related to one or more features to be printed on a substrate. For example, the process window can be a set of dose and/or focus values (also referred as dose/focus settings) that are sensitive to failures of certain features within, for example, the target design, and/or a patterning device layout (e.g., a mask layout having curvilinear patterns or Manhattan patterns). In an embodiment, the defects may occur due to a feature size, a relatively high density of features in a particular location on the substrate, or a combination thereof. In an embodiment, a model of the patterning process may be configured to optimize such defect occurrences. In an embodiment, the optimization of the defects may involve modifying patterning characteristics, as discussed earlier in the disclosure, such as a source characteristics, a patterning device layout characteristics, or a combination thereof such that the patterning process produce minimum number of one or more defects or a total number of defects. Thus, according to an embodiment, the result of such defect based optimization will be a source and/or mask characteristics, and/or a process window that results in less defects and/or high yield of the patterning process. It can be understood by a person skilled in the art that the present method is not limited to the source/mask/source-mask optimization, and other models (e.g., projection optics model, resist model, etc.) of the patterning process may also be configured to include defect based optimization.

In an embodiment, the defects may occur due to variations in the patterning process that are beyond a desired range (e.g., beyond 3 sigma level). For example, local CD variations may be observed due to photon and acid shot noise causing very asymmetric tails (e.g., in a distribution of CD values) at higher sigma level (e.g., more than 3 sigma level) indicating that the features printed by the patterning process will be likely cause a defect on the printed substrate. However, during simulation of the process models (e.g., a SMO), typically, a parameter variation having symmetric tails (or symmetric distribution) with 3 sigma variations is assumed. As such, the process models may not be readily available to predict defects or determine patterning process characteristics (e.g., source characteristic, mask characteristic, and/or patterning window) that will minimize such defects due to process variations. The following method describes a process to incorporate such defect based determination of patterning process characteristics. The term "distribution" with reference to a parameter used herein refers to a probability density function or a variation of the parameter. In an embodiment, the probability density function provides probability of occurrence of a particular event (e.g., a defect).

Figure 22:
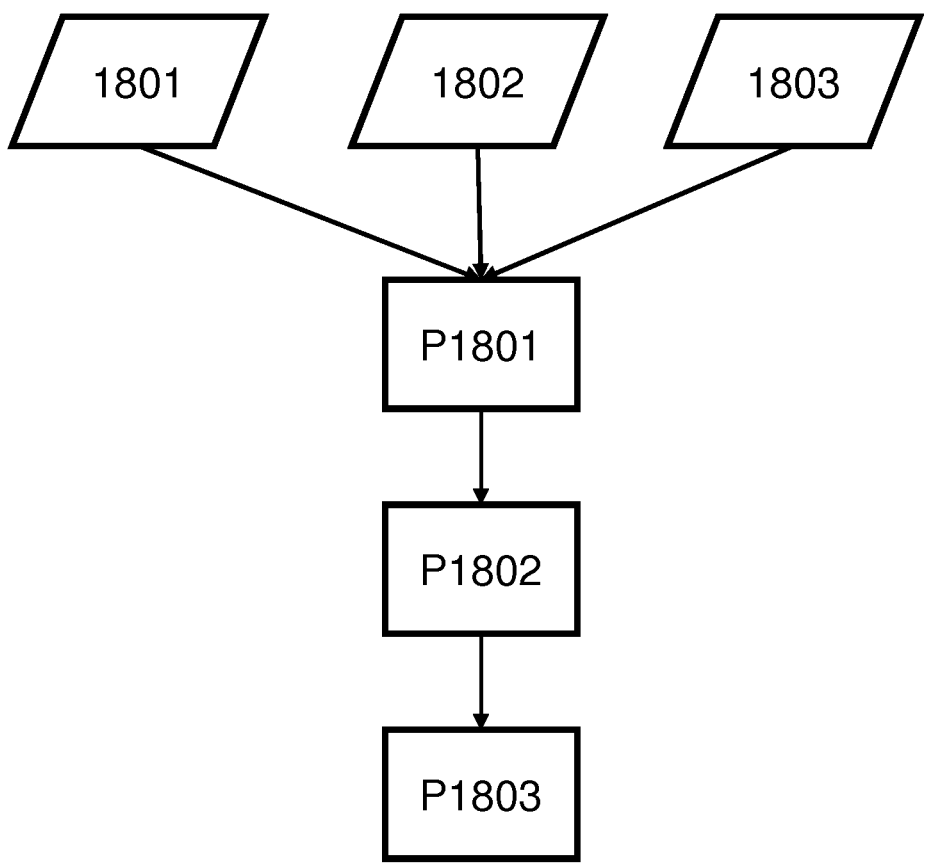
FIG. 22 shows a flow chart of a method for determining a process window based on defects, according to an embodiment.

FIG. 22 is a flow chart of the method for determining a process window based on defects that may occur due to variations in the patterning process. In an embodiment, the process window may be determined, for example, via simulation of a process model (e.g., SMO) of the patterning process that includes a merit function based on, for example, a number of defects.

The method, in process P1801, involves obtaining a variation 1801 of a first parameter (e.g., dose, focus, etc.) of the patterning process, a variation 1802 of a second parameter (e.g., CD, overlay, etc.) based on a relationship (e.g., a dose-CD relationship discussed earlier) between the first parameter and the second parameter, and a process model 1803 (e.g., SMO model) of the patterning process.

The variation 1801 of the first parameter (e.g., dose, focus, etc.) of the patterning process may be obtained based on simulation of a local parameter uniformity model of the patterning process. In an embodiment, the local parameter uniformity model is a local CD uniformity model configured to determine dose values to print features having different CD values with certain uniformity in size and shape at different locations on a substrate.

In an embodiment, LCDU model may be a function of dose and focus that is fitted based on, for example, statistical data fitting methods such as linear regression, non-linear regression, probability distribution fitting, etc. An example model is given by: LCDU=a*Dose×d(CD)/d(dose)+b, where, a and b are fit parameters and d(CD)/d(dose) is dose sensitivity, which may be computed from, for example, a known Bossung fit method.

In an embodiment, a different "Bossung" fit may be performed to determine local CD, for example: LCDU=$\Sigma_{ij}b_{ij}$dose$^i$focus$^j$ The present disclosure is not limited to a particular LCDU model, Bossung fit model, etc. The number of model parameters for model fitting are chosen to balance an accurate description of the local CD dependence through a process window and its sensitivity to metrology repeatability and accuracy. Several models are available to fit the LCDU-data. For example, NILS/ILS based models inclusive or exclusive of backgrounds distribution, e.g. LCDU=a+b/NILS or LCDU=$\sqrt{(a^2+(b/NILS)^2)}$, etc.

In an embodiment, the variation of the first parameter may be obtained based on experimental data, for example, measurements related the lithographic apparatus, or measurements related to printed substrate. The present disclosure, however, is not limited to a particular parameter of the patterning process or a method of obtaining the variation of the particular parameter. In an embodiment, the first parameter of the patterning process can be a dose, focus, or other relevant parameters.

In an embodiment, the variation 1801 of the first parameter (e.g., dose, focus, etc.) of the patterning process may be obtained based on a relationship (e.g., a dose-CD relationship discussed earlier) between the first parameter and the second parameter. The relationship between the first parameter (e.g., dose) and the second parameter (e.g., CD) may be a physics based models, empirical model, or machine learning models configured to predict the second parameter values based on values of the first parameter as input. In an embodiment, the empirical model or the machine learning model may be established using experimental data of a printed substrate subjected to the patterning process.

In an embodiment, the process model 1803 may be any model configured to predict a characteristics of the patterning process. For example, the process model 1803 can be a source model, mask model and/or a source-mask optimization model, where the respective models are configured to determine an optimum source characteristics, mask characteristics, and/or sour-mask characteristics, as discussed earlier.

The method, in process P1802 involves, inserting a Gaussian distribution in the relationship between the first parameter and the second parameter for modifying the variation of the first parameter. In an embodiment, the Gaussian distribution can be a Gaussian dose distribution. In an embodiment, the Gaussian distribution has a variation of greater than or equal to three sigma, for example to allow modification of the variation 1801 of the first parameter to seven sigma level. In an embodiment, the inserting of the Gaussian distribution may involve addition or convolution of the Gaussian distribution with the relationship between the first parameter and the second parameter.

Figures 25A, 25B:
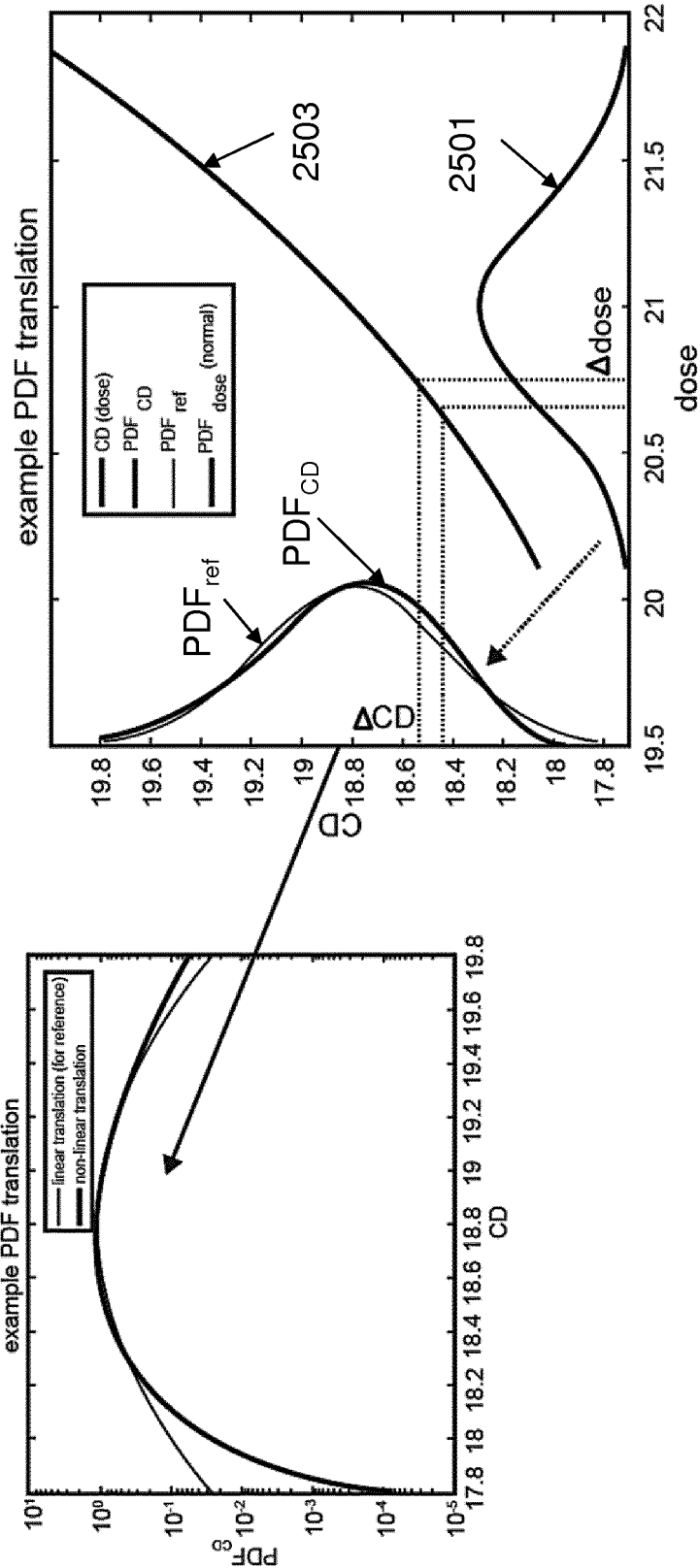
FIGS. 25A and 25B illustrates an example dose distribution, dose-CD relationship, and probability distribution of CD determined from the dose distribution and dose-CD relationship, according to an embodiment.

FIGS. 25A and 25B illustrate an example of applying Gaussian dose distribution 2501 to a relationship 2503 between two parameters of the patterning process such as dose and CD to determine a PDF$_{CD}$ of CD. The PDF$_{CD}$ can be further used to determine failure probabilities or defect probabilities. Based on the defect probabilities, a processing window (e.g., values of dose and focus) is determined. Thereby, a defect-based process window is generated so that high or desired yield is achieved. The present disclosure is not limited to dose and CD, similar approach may be applied for other combination of process parameters such as dose, focus, CD, EPE, etc.

In FIG. 25A, the relationship 2503 can be any functional relationship based on simulation or measurement data between more than one parameter. In an embodiment, the relationship 2503 is a non-linear relationship between dose and CD. The non-linear relationship may be obtained based on simulation of process models configured to represent the patterning process or based on measurement data related to dose and CD obtained from, for example, metrology tools.

According to the methods of the present disclosure, the Gaussian dose distribution 2501 (also referred as PDF$_{dose}$) may be convoluted with the relationship 2503 to determine a probability distribution (PDF$_{CD}$) of a CD. FIG. 25A clearly shows that such PDF$_{CD}$ is different from a reference PDF (e.g., a normal PDF of CD around a mean CD value).

In an embodiment, PDF$_{CD}$ is determined based on a set of equations. First, the PDF$_{dose}$ and a differential component of dose (i.e., $\Delta$dose) is equated with PDF$_{CD}$ (to be determined) and a differential component of CD (i.e., $\Delta$CD), which can be represented by PDF$_{dose}$·$\Delta$dose=PDF$_{CD}$·$\Delta$CD.Then, PDF$_{CD}$ at a particular CD value can be determined by taking the product of PDF$_{dose}$ for the particular CD value and dose sensitivity (i.e., $\Delta$dose/$\Delta$CD), which is represented by PDF$_{CD}$=PDF$_{dose@CD}$·$\Delta$dose/$\Delta$CD. The dose sensitivity quantifies the effect of change in dose for a change in CD.

In an embodiment, the LCDU model, as discussed earlier, allows estimating dose variation ($\sigma_{dose}$) or dose-distribution over a focus(F)-exposure(E) matrix using following equation $\sigma_{dose}(E,F)=\sigma_{LCDU}\times(dCD/ddose)^{-1}(E,F)$, where the location variation in CD can be determined from the LCDU data or model and the term (dCD/ddose) can be determined by differentiating the LCDU model with respect to dose. In an embodiment, to further improve the accuracy of failure rate predictions, the LCDU due to a local dose can be obtained from correcting the measured LCDU through additional measurements and subtracting variation associated to metrology noise (i.e., noise in metrology data) and variations associated with mask, as follows:

$$\sigma_{CD}^2(d)=\sigma_{CD,meas}^2(d)-\sigma_{metro-noise}^2(d)-\text{MEEF}(d)\times\sigma_{mask}^2$$

Then, the relevant PDF$_{CD}$ can be found by convoluting the PDF's of the relevant contributions such as dose, metrology noise, mask, and background BG (which can be a normal distribution), as follows:

$$PDF_{CD}(CD,d)=PDF_{dose}\otimes PDF_{metro-noise}\otimes PDF_{mask}\otimes PDF_{BG}$$

Figure 26:
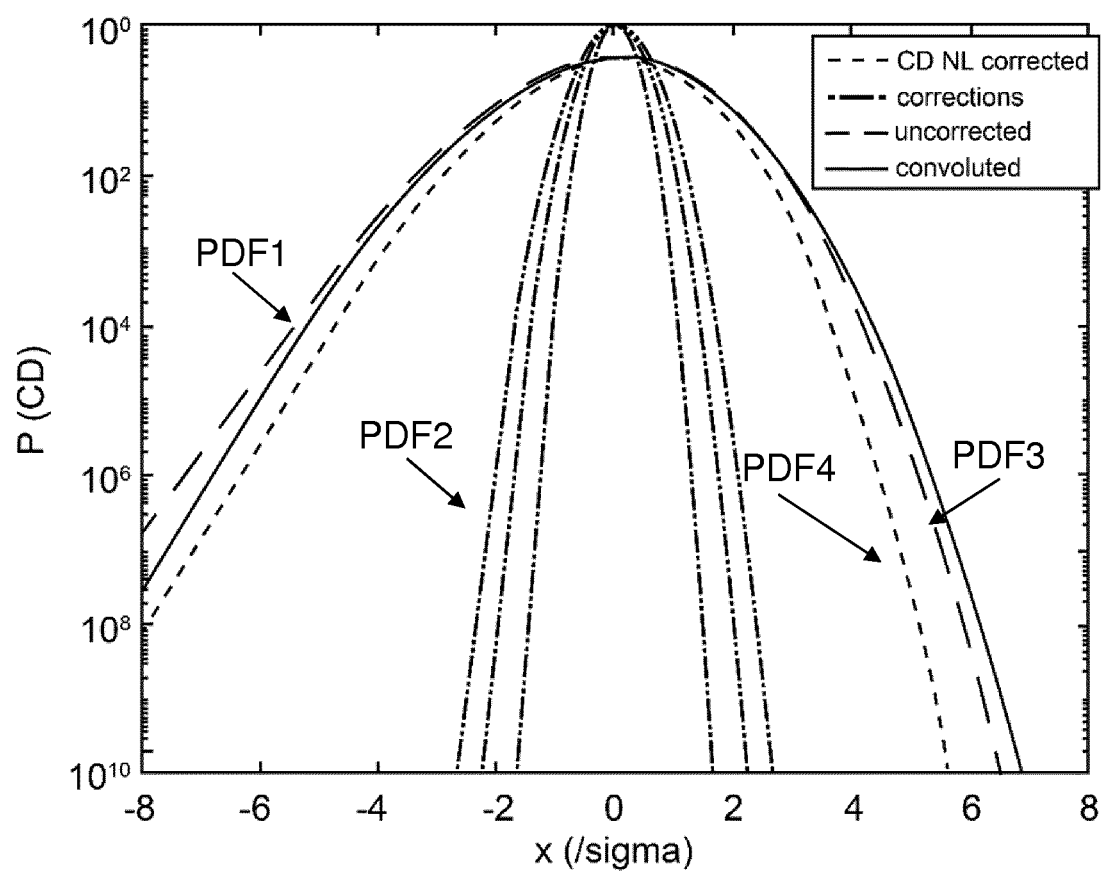
FIG. 26 illustrates example probability distributions of CD obtained from different methods, according to an embodiment.
Figure 27:
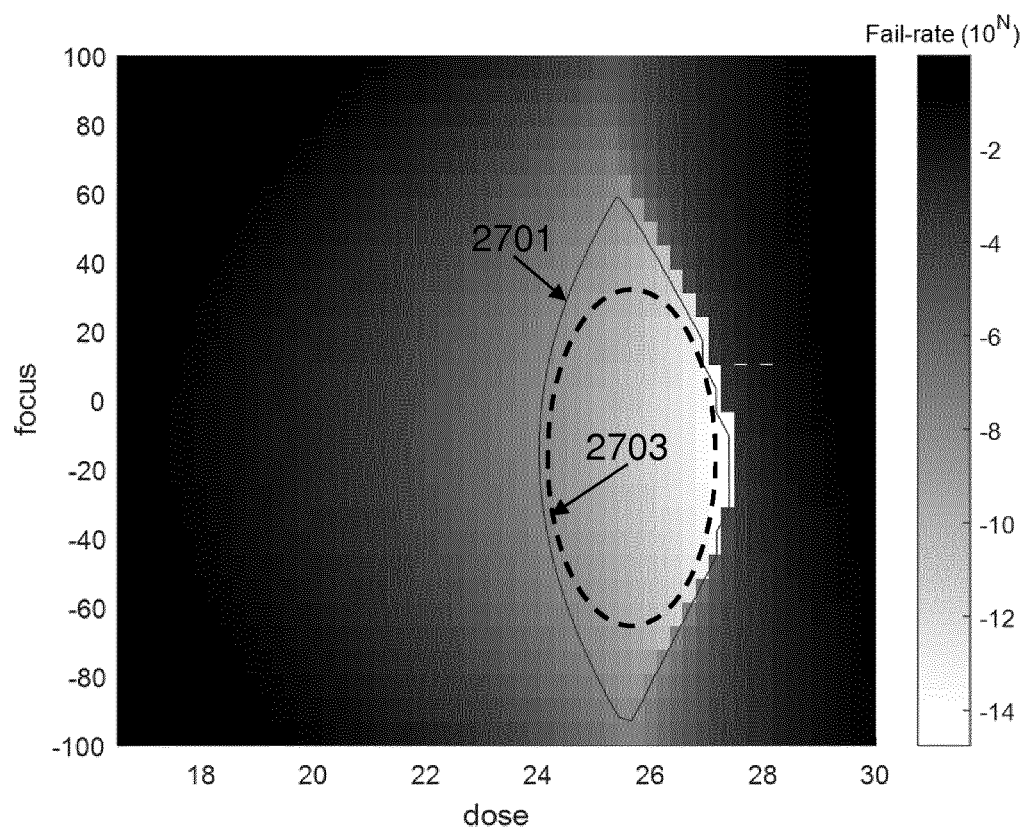
FIG. 27 an example process window based on measured data on, e.g., 24 nm HP contact-holes on an EUV Scanner, determined by applying the method on measured fail-rates, according to an embodiment.
Figure 28A:
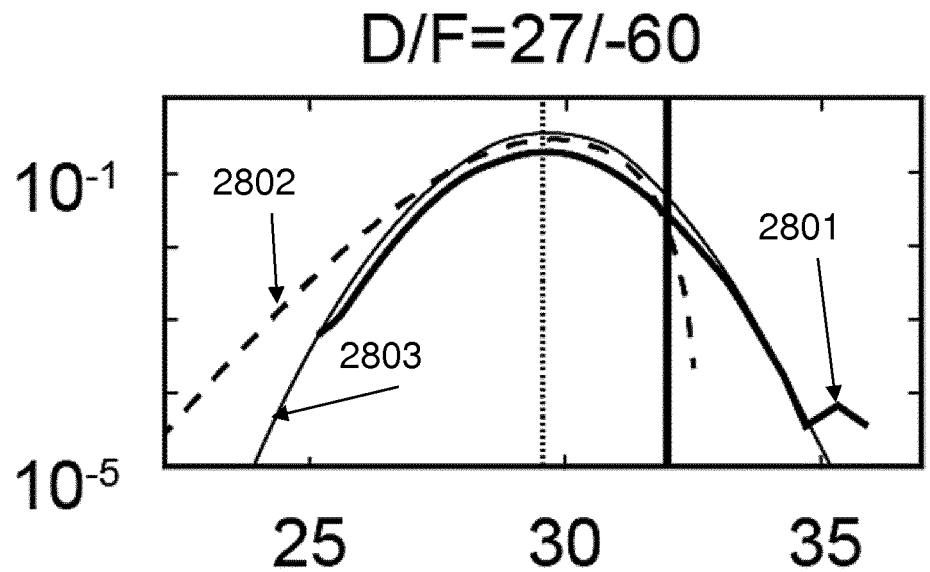
FIG. 28A-28D illustrate example failure distribution at different dose/focus values that are used to compute the process window of FIG. 27.
Figure 28B:
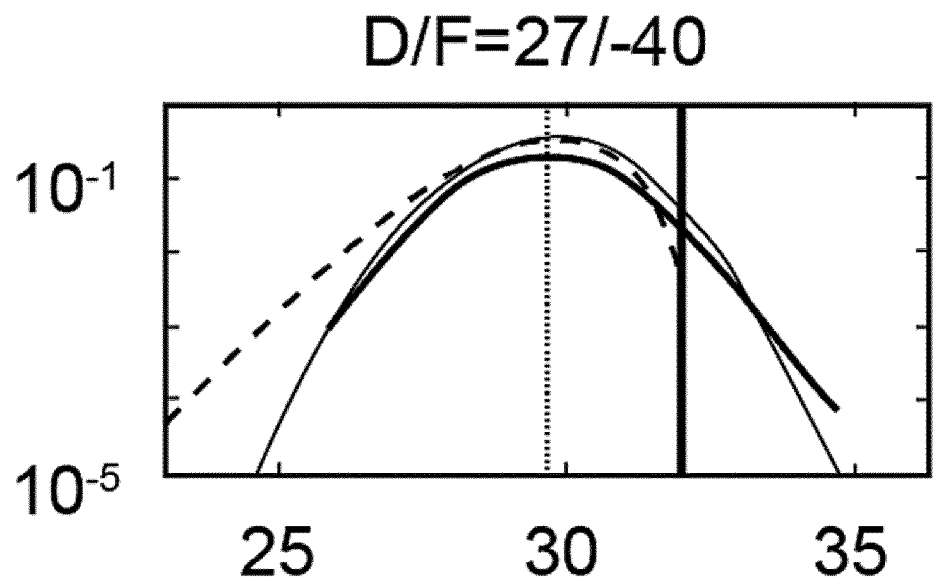
Figure 28C:
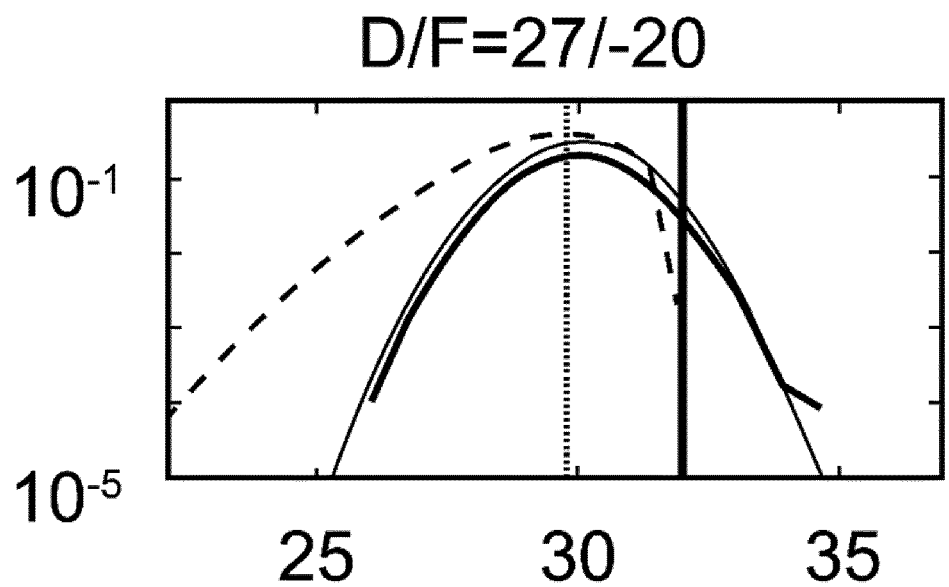
Figure 28D:
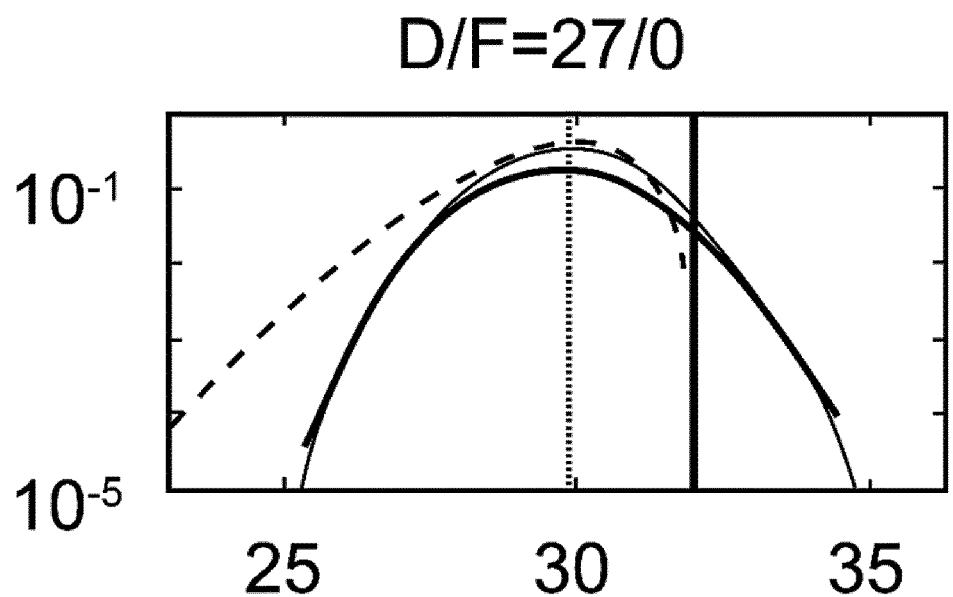

FIG. 26 illustrates different the PDF's of CD which differ from each other based on the different methods (as discussed above) applied to determine the PDF. For example: i) PDF1 is an uncorrected PDF of CD that does not consider dose-distribution (e.g., Gaussian dose distribution) or simply based on mean CD values; (ii) PDF2 are PDFs of different corrections (e.g., associated with metrology noise, mask, background, etc.) that can applied to PDF1; (iii) PDF3 is a convoluted PDF based on dose-CD relationship (e.g., as discussed with FIGS. 25A and 25B), and (iv) PDF4 is a corrected PDF that accounts for variation from different sources (e.g., metrology noise, mask, BG, etc.). The different PDF of CD clearly show that CD distribution changes depending on a dose-distribution or correction applied that changes the defect probabilities, effectively affecting determination of the process window of the patterning process. An example defect based process window is illustrated in FIG. 27 and example failure rates used to determine defect-based process window are illustrated in FIG. 28A-28D.

Figure 23A:
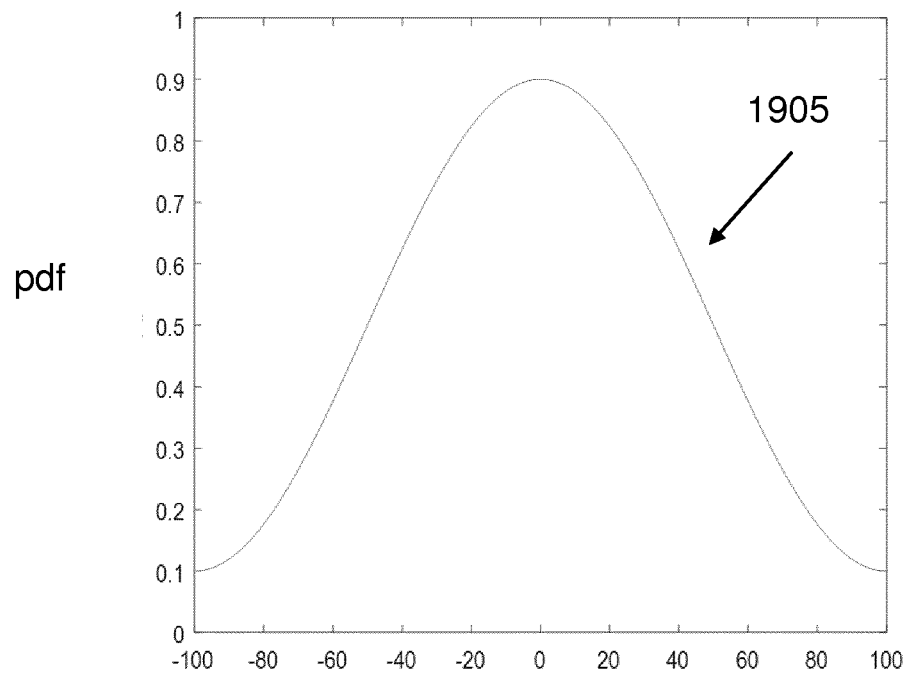
FIG. 23A is an example Gaussian distribution, according to an embodiment.
Figure 23B:
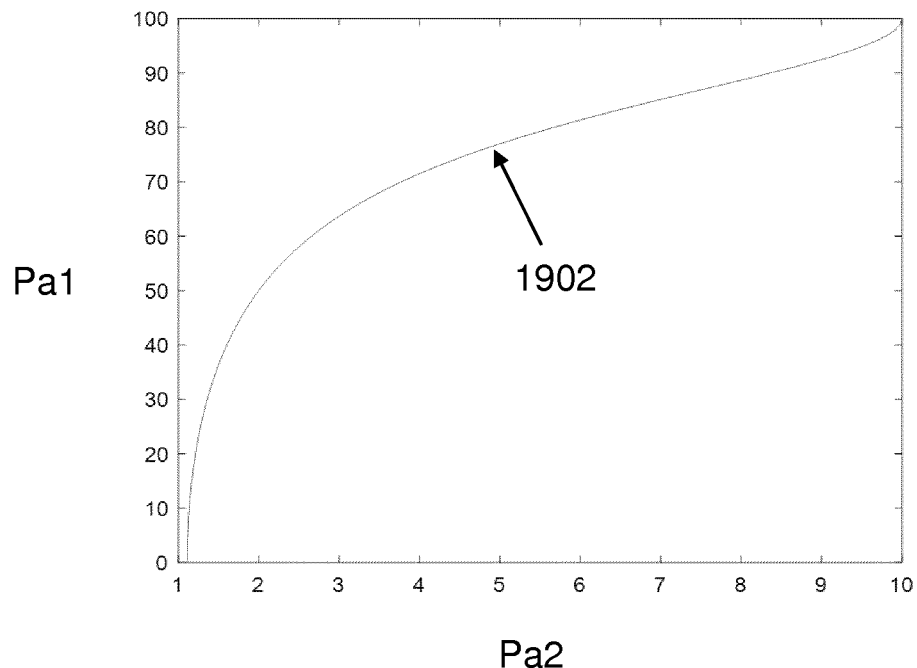
FIG. 23B illustrates an example relationship between a first parameter and a second parameter, according to an embodiment.
Figure 23C:
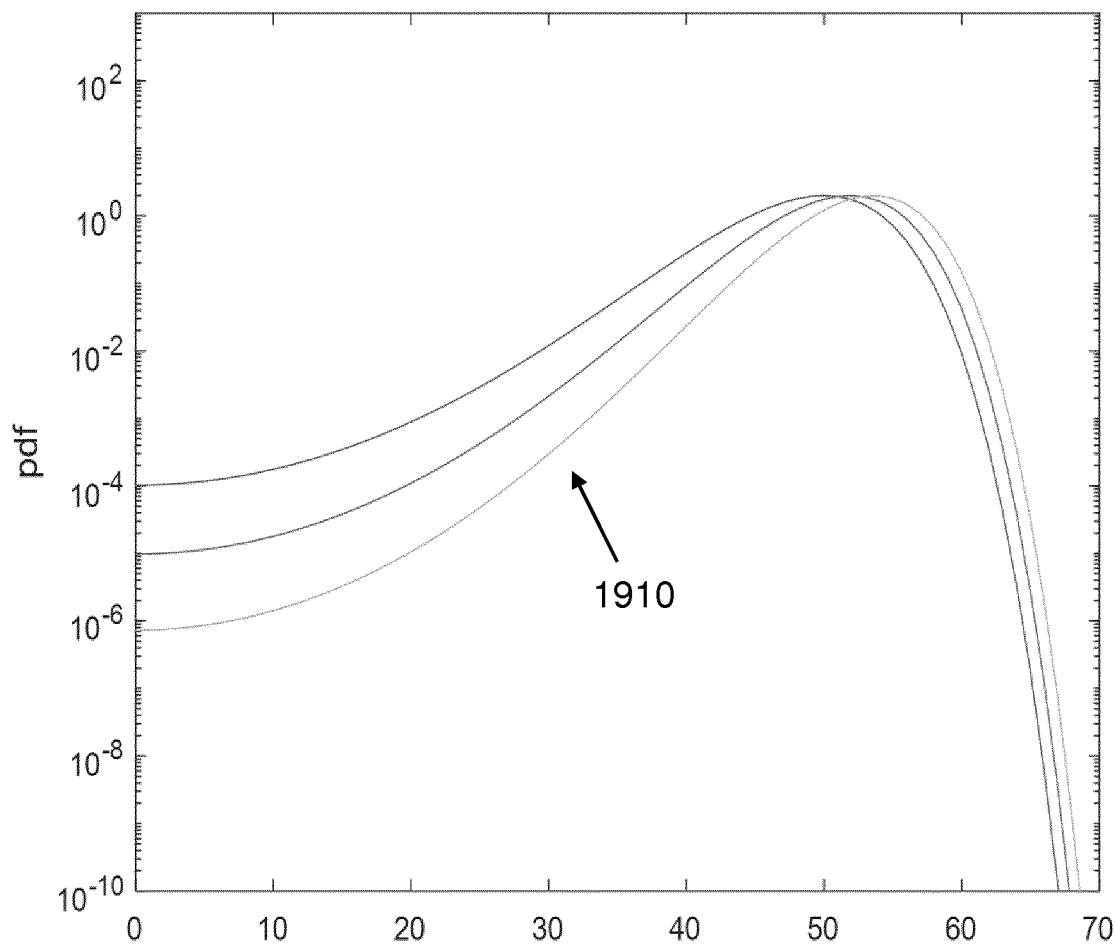
FIG. 23C illustrates an example probability distribution at different wafer-bias, according to an embodiment.

In another example, FIGS. 23A-23C illustrate the effect of inserting the Gaussian distribution in the relationship between the first parameter (e.g., dose) and the second parameter (e.g., CD or duty cycle i.e. CD/pitch). FIG. 23A is an example Gaussian distribution representing a local variation (e.g., at a particular location such as a hot spot) in an aerial image.

FIG. 23B illustrates an example relationship 1902 between the first parameter Pa1 (e.g., dose) and the second parameter Pa2 (e.g., CD or duty cycle i.e., CD/pitch). The relationship 1902 is represented as a graph 1902 for visualization purposes. The graph 1902 includes an approximately linear part and a non-linear part. The linear part or linear relationship exists between a first threshold value (e.g., 3) and a second threshold value (e.g., 9) and a non-linear relationship exists outside the first and second threshold values. For most cases, the values of the first parameter (e.g., dose) are around a normal operating range (e.g., around 5), where a linear relationship between the first parameter and the second parameter is observed. However, when a value of the first parameter (e.g., dose) falls outside the threshold values, for example, below the first threshold (e.g., 3), the non-linear relationship between the first parameter (e.g., dose) and the second parameter (e.g., CD) indicates a rapid change in values of second parameter (e.g., CD) for a small change in values of the first parameter (e.g., dose). Such small change in values of the first parameter (e.g., dose) may increase the failure rate of a feature by orders of magnitude higher compared to failure rates within the linear relationship.

The aforementioned issue is amplified for EUV exposures, as the typical dose variation can be more than 3 times larger then for ArFi. For example, ArFi has a 6 sigma dose variation of approximately 12% and approximately 8% for line/space and contact hole feature types, respectively. This typical variation justifies optimizing classical lithographic process-windows based on CD±10% estimated from a simulated dose-sensitivity and target dose. On the other hand, in case of EUV, the 6 sigma variation is much higher, for example, approximately 44% and approximately 22% for the same feature types i.e., line/space and contact holes, respectively. Such, dose variation results in highly non-linear behaviour between CD and dose, which effectively affects the determination of failure probabilities and process window determination. In case of EUV, a relation (e.g., similar to dose-CD) between different EUV specific parameters can be used to estimate, for example, a contribution from a reticle to a local CD distribution of the features on the reticle. For example, a mask error enhancement factor (MEEF) may be used to develop a relation between the reticle and CD. Thus, variability contributions from different parameters of the patterning process may be used in failure/defect probability determination, thereby accurately determining a defect-based process window.

FIG. 23C illustrates an example failure rate distribution 1910 (also referred as a curve 1910) resulting from inserting the Gaussian distribution 1905 in the relationship 1902 between the first parameter and the second parameter. In FIG. 23C, the left side of the curve 1910 has a fat tail indicating a relatively high failure rate may be observed if the values of the first parameter are low (e.g., below the first threshold). According to the method of the present disclosure, the failure rate distribution 1910 enables determination of a probability of failure of a particular feature for a small change in values of the first parameter (e.g., dose). The probability of failure may be further used to determine optimum values of the first parameter (e.g., dose) and define a process window based on the failure probability or defects in general.

Referring back to FIG. 22, the method, in process P1803, involves identifying, via simulation of the process model (e.g., SMO), the process window based on a merit function, such that the merit function is optimized In an embodiment, the merit function is defined as a defect metric, for example, in terms of number of defects, a failure rate of one or more types of defects, or other appropriate defect related metric. In an embodiment, defect occurrences on a substrate subjected to the patterning process is a result of insertion of the Gaussian distribution in the relationship between the first parameter and the second parameter resulting in a failure rate distribution (e.g., 1910 of FIG. 23C) of the second parameter, as discussed earlier. In an embodiment, the identifying of the process window may involve biasing of the second parameter or factors related to the second parameter. In an embodiment, biasing may be achieved in different ways, for example, by adjusting values of the first parameter or a characteristic of a patterning device.

In an embodiment, the identifying of the process window may involve biasing of the second parameter (e.g., positive CD bias), biasing of a patterning device (e.g., a mask) that affects the second parameter, biasing of a source that affects the second parameter, etc. In an embodiment, a positive bias and/or a negative bias is applied to feature in regions having relatively higher failure rate relative to other locations on the substrate. However, such biasing of the substrate or the patterning device involves a trade-off between other parameters of the patterning process, for example, overlay. For example, a negative biasing of the mask may result in increased overlay, which may be undesired. Hence, although an increased CD of a pattern may be desired to reduce the number of defects, there may be additional process conditions or process parameters that may be affected by such adjustments to the second parameter while reducing the defects. As such, an optimized process window may be an intersection of different process windows associated with other limiting process conditions.

FIG. 27 illustrates an example process window 2701 determined based on defect or failure probabilities computed according to methods of present disclosure. In an embodiment, an upper limit may be calculated based on failure rates, which may obtained from, for example, measured wafer data. Such measurement data involves for different dose/focus values which features failed to print as expected. For example, dose/focus values at which kissing holes or closed holes were found.

The process window 2701 can be determined by setting a threshold value of failure rate of $10^{-8}$ on the cumulative $PDF_{CD}$ which may be derived from a relationship between CD, dose, and focus, as discussed above. The centre of the process window 2701 is shifted compared to the classically defined process-window by a +20% dose and a −20 nm focus and the process window size was adjusted.

FIGS. 28A-28D illustrate example failure distribution at different dose/focus values that are used to compute the process window of FIG. 27. In the FIGS. 28A-28D, a mean CD is around 30 nm and an upper limit of CD is selected as approximately 32 nm. Further, different failure rate PDFs are plotted, for example, in FIG. 28A, PDF 2801 is obtained from data, PDF 2802 is obtained from non-linear fitting (e.g., using LCDU model and dose-distribution, as discussed above), and PDF 2803 is a standard normal CD distribution.

FIGS. 28A-28D illustrate different probability distribution for different dose/focus (D/F) values. Thus, for different dose/focus values, failure probabilities can be computed. Then, dose/focus values for which failure probability is below a failure rate threshold value (e.g., $10^{-8}$) are selected. In an embodiment, failure rates may be estimated by setting a CD-filter (e.g., exclude CD less than 8 nm and greater than 40 nm) and determining CD-values using the non-linear cumulative distribution function CDF(E,F) of failure probabilities, where CDF(E,F) refers to the cumulative PDF of the CD which accounts for variations in, for example, dose, focus, mask, etc. as discussed earlier.

In an embodiment, the method, in process P1803, involves an optimization process, which is an iterative process to optimize a process window based on the merit function. The optimization process involves iteratively modifying parameters of the patterning process so that the merit function is optimized (in an embodiment minimized). Such optimization of the merit function refers to balancing of defect occurrences due to values of the first parameter below a first threshold and/or the values of the first parameter above a second threshold. In an embodiment, the first threshold is lower than the second threshold. In an embodiment, optimization of the merit function includes minimization of one or more defects or failure rates associated with the one or more defects. An example merit function represented by equation for CF ($z_1, z_2, \ldots, z_N$) is discussed earlier in the disclosure.

In an embodiment, the defect may be expressed as an error rate or a failure rate, which can be further used to define the merit function. During the optimization process, the merit function is optimized (in an embodiment, minimized). The optimization process may involve adjusting the critical dimension of the patterning process in order to bias the critical dimension in a manner such that the defects (or a failure rate) is minimized. The adjustment may involve, for example, increasing or decreasing the size of the features to be printed on the substrate. Such adjustment may be achieved, for example, by increasing or decreasing the dose or biasing the mask. The term 'bias' or 'biasing' as used herein refers to increasing or decreasing a value of the parameter of the patterning process.

In an embodiment, a positive biasing of wafer refers to increasing the size of the critical dimension of a feature of the substrate. A negative biasing of mask refers to decreasing the size of the critical dimension of a feature of the mask. In an embodiment, the positive biasing of the critical dimension may be achieved by increasing the dose value. An amount of increase in dose value may be determined based on the relationship between the dose and CD. Similarly, the positive biasing may also be achieved by adjusting the size of a feature the mask pattern. In an embodiment, the amount of adjustment to the mask pattern may depend on the density of the features within a particular location of the mask or density of features to be printed on the substrate. On the other hand, for locations on the substrate where the CD values are relatively large or less dense compared to other locations on the substrate, the method may not apply any biasing to avoid unnecessary trade-offs (e.g., in overlay or EPE) in those particular locations.

In an embodiment, the method of FIG. 22, may be configured to determine a process window based on optimization (in an embodiment minimization) of one or more particular defects. For example, minimization of a hole closure type of defect, or other defects discussed with respect to FIGS. 11D and 11E. In an embodiment, certain defects may be fixed in a post-patterning process such as a resist or etch process. Such defects may be assigned lower weight during optimization of the merit function, for example, as discussed with respect to FIG. 17.

In an embodiment, the merit function may further comprise constraints (expressed in a form of a metric) related to one or more of other process conditions such as related to a focus, an overlay, and/or msdz. Accordingly, the optimization process may involve simultaneously optimizing one or more of the defect based metric, a focus based metric, an overlay based metric, and/or an msdz based metric. In an embodiment, msdz refers to a moving standard deviation, i.e., a height error made by the substrate position control loop during exposure.

In an embodiment, a targeted experiment where a defect-based process window can be designed for various settings (e.g. msd, aberrations or the resist-process itself, e.g. resist-height) that can be used to optimize the window, e.g. a merit function described by a (defect-based) best energy (BE), best focus (BF), exposure latitude (EL) and depth of focus (DoF). Aberrations and focus typically affect resist profiles and are thus expected to have an impact on failure and related defect based process windows. If multiple features are present, for example in the simultaneous optimization of lines and tip-tip constructs, This experimentally obtained defect based process window can also be used to find non-obvious optimizations (e.g. it could be that a Z9 aberration or additional MSD lead to be better profiles that enable more process window for the tips).

In an embodiment, the identifying of the process window involves overlapping of a first process window related to a first pattern and a second process window related to a second pattern. The first pattern and the second pattern may refer to a pattern in a first location and the second location, respectively, on the substrate having a relatively greater density of features compared to other locations on the substrate. In an embodiment, the first location and the second location may be different hot spot locations i.e., locations of process window limiting patterns.

Depending on how often these hot spot patterns appear in a typical die, different failure-rate requirements for the individual patterns may be balanced or co-evaluated. For example, let us consider a die that includes two features that have individual defect-based process windows. Then, a success rate (i.e., 1-failure-rate) of an individual feature by two functions may be represented by cumulative distribution function such as $CDF_1$(Dose, Focus) and $CDF_2$(Dose,Focus). Let us assume that the first feature appears $10^3$ times in a die, while the $2^{nd}$ feature appears $10^8$ times in a die. To calculate the expected fail-rate of the die at a particular process setting, a combined success-rate may be determined by $CDF_{die}$ (Dose, Focus), $CDF_1$(Dose,Focus)$^{1000}\times CDF_2$(Dose,Focus)$^{100000000}$. Such determination of combined success-rate may be made for as many features and defect-modes as desired.

In an embodiment, the process model used in the method above may be model of a SMO process and the method discussed above may be integrated with the SMO process to determine a defect based process window, source characteristics that optimizes (e g, minimize) the defects, mask characteristics that optimizes (e.g., minimizes the defects. In other words, the SMO process may be modified or refined to further consider defects, effectively improving the yield of the patterning process.

In an embodiment, the determination of defect based process window using the SMO model (or process) involves adjusting one or more characteristic of a source and/or a mask based on a defect metric, such that the defect metric is reduced. The adjustment includes biasing the mask to create a positive bias on a substrate printed using the mask. The biasing is applied to patterning within a pattern limiting process windows.

In an embodiment, when a Gaussian dose variation is inserted in the CD dose relation, the SMO process will result in a "fat tail" on the low CD side of the CD distribution. This fat tail can be suppressed by allowing for a positive bias on the wafer so that small CD values are avoided at the expense of, for example, a higher bridging defect incidence. Alternatively, a negative bias on the mask can be applied such that a higher dose part of the CD dose relation is sampled, further away from hole collapse. If the SMO process is done with a merit function that accounts for defect occurrence due to the effect of Gaussian local dose variation then the optimum can be found that balances defect incidence due to low dose on the one hand a high dose on the other.

As such, in an embodiment, the SMO process is directly optimizing the yield of the patterning process. The process involves computing a stochastic CD distribution under dose, focus, msdz and/or process conditions that are representative of pattern performance (scanner, process, etch). This allows for optimization of asymmetric defect PWs, in which the requirements on low CD excursions and high CD excursions are very different. An example is reduction of hole closure incidence.

In an embodiment, after performing optimization of the process window based on the SMO process, the method may further comprise performing an optical proximity correction (OPC) on the mask to reduce the defect metric. For example, the OPC may involve increasing the critical dimension of a feature, such that the feature is relatively close to or touches a neighbouring feature, as further discussed with respect to FIG. 24 below.

Figure 24:
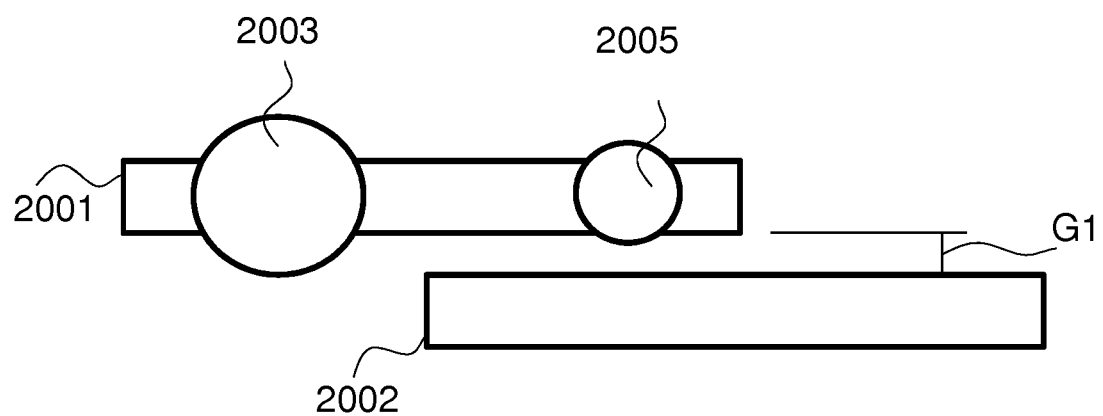
FIG. 24 illustrates an example of biasing of mask during an OPC process, according to an embodiment.

FIG. 24 illustrates an example of biasing of mask during an OPC process. A target pattern may include features such as a first bar 2001 spaced apart from a second bar 2002 by a distance G1. Furthermore, the first bar 2001 may include a first hole 2003 and a second hole 2005 along the length of the first bar 2001. In an embodiment, the critical dimension of the second hole 2005 may be adjusted relative to the distance Gl. The adjustment may be such that it intersects with the second bar 2002. Typically, such intersection of the features may not be desirable. As such, during the typical OPC process, the critical dimension of second hole 2005 may be reduced to prevent intersection of the second hole 2005 with the second bar 2002. However, according to an embodiment of the present disclosure, if a stochastic variation in critical dimension of the second hole 2005 is high, it may lead to increased failure probability. Hence, according to the present disclosure, it may be desirable to increase the second hole 2005 to get very close (or almost intersect) to the second bar 2002 to prevent a potential failure or defect in the pattern to be printed on the substrate.

In an embodiment, during OPC as well different defect may be analyzed. For example, the defects may a hole closure, necking, and/or bridging, as illustrated earlier in FIGS. 11D and 11E. In an embodiment, the defect based process window determination may be based on minimizing one or more defects. For example, the during the optimization process CD values of the features may be modified to increase or decrease in size so that hole closure type of defect is minimized.

As mentioned earlier, the optimization process may involve other process limiting parameters (e.g., dose, focus, overlay, etc.) Hence, in an embodiment, during the optimization, a CD distribution can be calculated using not only a Gaussian dose distribution but also the typical conditions at a location on a substrate. Such process conditions include, but not limited to, focus, overlay, msdz and also process (effectively dose). In an embodiment, a dose to size constraints can be imposed to weigh in productivity of the patterning process. In principle, the overlapping defect PW of a set of hot design spots at a set of hot field/wafer spots can be calculated. In an embodiment, in a second iteration wafer data (e.g., CD, dose, focus, overlay, etc.) obtained from metrology tools may be used to verify and improve the merit function and/or the optimization process.

The embodiments may further be described using the following clauses:

1. A method for determining parameter limit of a feature on a substrate, the method comprising: obtaining (i) measurements of a parameter of the feature, (ii) data related to a process variable of a patterning process used to generate the feature, (iii) a functional behavior of the parameter defined as a function of the process variable based on the measurements of the parameter and the data related to the process variable, (iv) measurements of a failure rate of the feature, and (v) a probability density function of the process variable for a setting of the process variable;
converting, by a hardware computer system, the probability density function of the process variable for the setting to a probability density function of the parameter for the setting based on a conversion function, wherein the conversion function is determined based on the function of the process variable; and
determining, by the hardware computer system, a parameter limit of the parameter based on the probability density function of the parameter for the setting and the measurements of the failure rate of the feature.

2. The method according to clause 1, wherein the probability density function of the process variable for the setting is determined based on a variance of the process variable that is computed from a measured variance of the parameter for the setting of the process variable and a local derivative of the function of the process variable with respect to the process variable determined for the setting of the process variable.

3. The method any of clause 1-2, wherein the conversion function is a conversion factor, wherein the conversion factor is an absolute value of a local derivative of an inverse of the function of the process variable determined for the setting of the process variable.

4. The method according any of clause 1-3, further comprising:
determining, by the hardware computer system, an estimated failure rate of the feature based on the parameter limit and the probability density function of the parameter; and
identifying, by the hardware computer system, a process window related to the process variable such that the estimated failure rate of the feature is less than a predetermined threshold.

5. The method according to clause 4, wherein the predetermined threshold is based on a selected yield of the patterning process.

6. The method of any of clauses 1-5, wherein the failure rate is related to one or more failures of the feature, the one or more failure modes comprising a physical failure, a transfer failure, and/or postponed failure of the feature.

7. The method according to clause 6, wherein the postponed failure of the feature is a failure that occurs in a next step of the patterning process due to defect in a current processing step.

8. The method according to clause 7, wherein the one or more failures of the feature are weighted based on a frequency of a particular failure to generate a weighted failure rate of the feature.

9. The method any of clauses 1-8, further comprising:
obtaining a weighted function of the process variable based on a correlation between the one or more failures and the process variable;
determining, by the hardware computer system, a weighted parameter limit of the parameter based on the weighted function of the process variable; and
determining, by the hardware computer system, the process window based on the weighted parameter limit.

10. The method of any of clauses 8-9, further comprising:
optimizing, by the hardware computer system, a resist thickness, and/or resist type using a resist model of a resist process, by simulation, based on the postponed failures associated with the resist process.

11. The method according to clause 10, wherein the failure associated with the resist process comprises a footing failure and/or a necking failure.

12. The method of any of clauses 1-11, further comprising:
obtaining the parameter limit for each feature type of a plurality of feature types, and the estimated failure rate of each feature type of the plurality of feature types based on the corresponding parameter limit; and
determining, by the hardware computer system, an overlapping process window based on a product of the estimated failure rate of each feature type of the plurality of feature types.

13. The method according to clause 12, further comprising:
iteratively determining an optical proximity correction, by modelling and/or simulation, based on a maximum of the estimated failure rate of each feature type of the plurality of feature types.

14. The method according to clause 13, wherein the maximum of the estimated failure rate corresponds to a feature type having lowest yield.

15. The method of any of clauses 1-14, further comprising:
determining, by the hardware computer system, a refined variance of the parameter from the measured variance of the parameter, wherein the refined variance accounts for variance due to factors unrelated to the process variable.

16. The method according to 15, wherein the refined variance is computed by removing the variance due the factors unrelated to the process variable from the measured variance.

17. The method according to clause 16, wherein the factors unrelated to the process variable include contribution from metrology noise, mask, and background.

18. The method according to clause 16, wherein contribution of the background is a stochastic component of the patterning process determined at a particular setting of the process variable, wherein the measured variance has minimum sensitivity to the process variable.

19. The method according to clause 15, wherein determining of the process window is based on the refined variance.

20. The method of any of clauses 1-19, further comprising:
obtaining a transfer function of a post pattern transfer step of the patterning process, and another process variable PDF based on the transfer function; and
determining, by the hardware computer system, the process window based on the another process variable PDF.

21. The method of any of clauses 1-20, wherein the parameter of the patterning process is a critical dimension and the process variable is a dose.

22. The method of any of clauses 1-21, wherein the setting of the process variable is a dose value within a range of dose values.

23. The method of any of clauses 4-22, wherein the patterning process is configured to adjust of one or more apparatuses of the patterning process based on the process window.

24. The method according to clause 25, wherein the one or more apparatuses includes a lithographic apparatus configured to perform patterning on a substrate based on the process window.

25. The method of any of clauses 1-24, wherein the parameter limit is a common parameter limit, the common parameter limit determined based on a plurality of probability density functions of the parameter, each probability density function of the parameter determined at a particular setting of the process variable.

26. A method for determining a process window of a patterning process, the method comprising:
obtaining (i) a parameter limit of a parameter of the patterning process based on failure rate measurements of the patterning process, and (ii) a probability density function of the parameter defined as a function of a process variable and a variance of the process variable of the patterning process;
determining, by a hardware computer system, an estimated failure rate of the patterning process based on the parameter limit and the probability density function of the parameter; and
identifying, by the hardware computer system, the process window in terms of the process variable such that the estimated failure rate of the parameter is less than a selected threshold.

27. The method according to clause 26, wherein the identifying of the process window involves determining a range of the process variable between an intersection of the estimated failure rate and the selected threshold.

28. The method of any of clauses 27, wherein the intersection is graphically determined by plotting the estimated failure rate, the process variable, and the selected threshold on a graph.

29. The method according to clause 28, wherein the selected threshold is based on a selected yield of the patterning process.

30. The method according to clause 29, wherein the patterning process is configured to adjust of one or more apparatuses of the patterning process based on the process window.

31. The method according to clause 30, wherein the one or more apparatuses includes a lithographic apparatus configured to perform patterning on a substrate based on the process window.

32. The method of any of clauses 26-31, wherein the parameter of the patterning process is a critical dimension and the process variable is a dose.

33. The method of any of clauses 26-32, wherein the setting of the process variable is a dose value within a range of dose values.

34. A method for determining a process window of a patterning process, the method comprising:
obtaining (i) a variation of a first parameter of the patterning process, (ii) a variation of a second parameter based on a relationship between the first parameter and the second parameter, and (iii) a process model of the patterning process;
inserting, by a hardware computer system, a Gaussian distribution in the relationship between the first parameter and the second parameter for modifying the variation of the first parameter resulting in a failure rate distribution of the second parameter; and identifying, via simulation of the process model, the process window such that a merit function of the process model is optimized, wherein the merit function comprises a defect metric based on failure rate distribution of the second parameter.

35. The method of clause 34, wherein the identifying the process window is an iterative process, an iteration comprises:

biasing the second parameter; and determining a failure probability based on the failure rate distribution due to the biasing.

36. The method of any of clauses 34-35, wherein the biasing is achieved by adjusting values of the first parameter or a characteristic of a patterning device.

37. The method of any of clauses 34-36, wherein the first parameter is a dose and the second parameter is a critical dimension.

38. The method of clause 37, wherein the biasing of the critical dimension comprises adjusting the dose and/or a dimension of a feature of the patterning device.

39. The method of any of clauses 36-38, the biasing includes increasing or decreasing the critical dimension to be printed on the substrate.

40. The method of clause 39, wherein the adjustment of the critical dimension is achieved by increasing or decreasing the dose of the patterning process.

41. The method of any of clauses 34-40, wherein the identifying of the process window further comprises:

determining an overlapping process window based on an overlap of a first process window related to a first pattern with a second process window related to a second pattern.

42. The method of clause 41, wherein the first pattern and the second pattern are process window limiting patterns.

43. The method of any of clauses 34-42, wherein optimizing of the merit function comprises minimizing of a failure rate associated with one or more defects.

44. The method of clause 43, wherein the one or more defect comprises a hole closure.

45. The method of clause 34-44, wherein optimization of the merit function involves establishing a balance between a first defect occurrence due to values of the first parameter below a first threshold and/or a second defect occurrence due to the values of the first parameter being above a second threshold.

46. The method of clause 45, wherein the first threshold is lower than the second threshold.

47. The method of any of clauses 34-46, wherein the merit function further comprises constraints related to one or more of a focus, overlay, msdz, and dose.

48. The method of any of clauses 34-47, wherein the first parameter variation is estimated based on simulation of a local parameter uniformity model of the patterning process.

49. The method of clause 48, wherein the local parameter uniformity model is a local critical dimension uniformity model.

50. The method of any of clauses 34-49, wherein the process model is a source optimization, mask optimization, and/or a source-mask optimization model.

51. The method of any of clauses 34-50, wherein the Gaussian distribution has a variation of greater than or equal to three sigma.

52. The method of any of clauses 43-51, wherein the one or more defects include at least one of a hole closure, necking, and bridging.

53. The method of any of clauses 34-52, wherein the failure rate distribution is a probability density function used to compute a probability of defect occurrence for a change in the second parameter.

54. The method of any of clauses 34-53, wherein the defect metric is a total number of defects, a failure rate associated with the one or more defects.

55. A method for performing source-mask optimization based on a defect-based process window, the method comprising:

obtaining a first result of from a source-mask-optimization model and process window limiting patterns within the first result; and adjusting, via a hardware computer system, characteristic of a source and/or a mask based on a defect metric, such that the defect metric is reduced.

56. The method of clause 55, wherein the adjustment includes biasing the mask to create a positive bias on a substrate printed using the mask.

57. The method of clause 56, wherein the biasing is applied to patterning within a pattern limiting process windows.

58. The method of any of clauses 55-57, further comprising performing an optical proximity correction on the mask to reduce the defect metric.

59. The method of clause 58, further comprising increasing the critical dimension of a feature, such that the feature is relatively close to or touches a neighboring feature.

Figure 29:
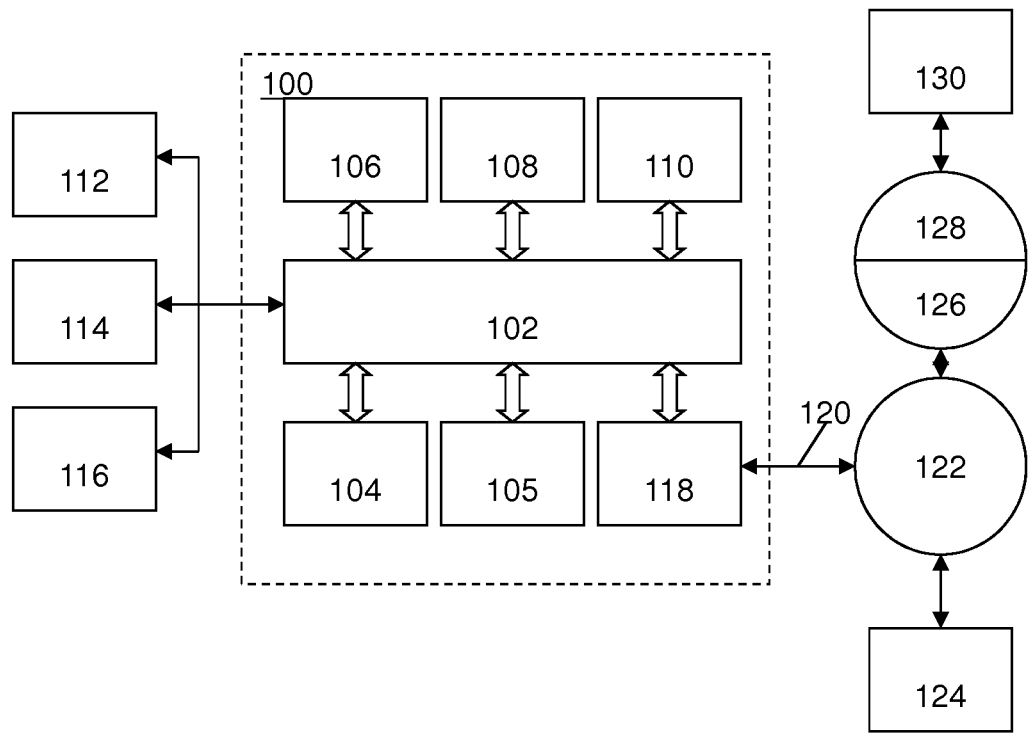
FIG. 29 is a block diagram of an example computer system, according to an embodiment.

FIG. 29 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also desirably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 30:
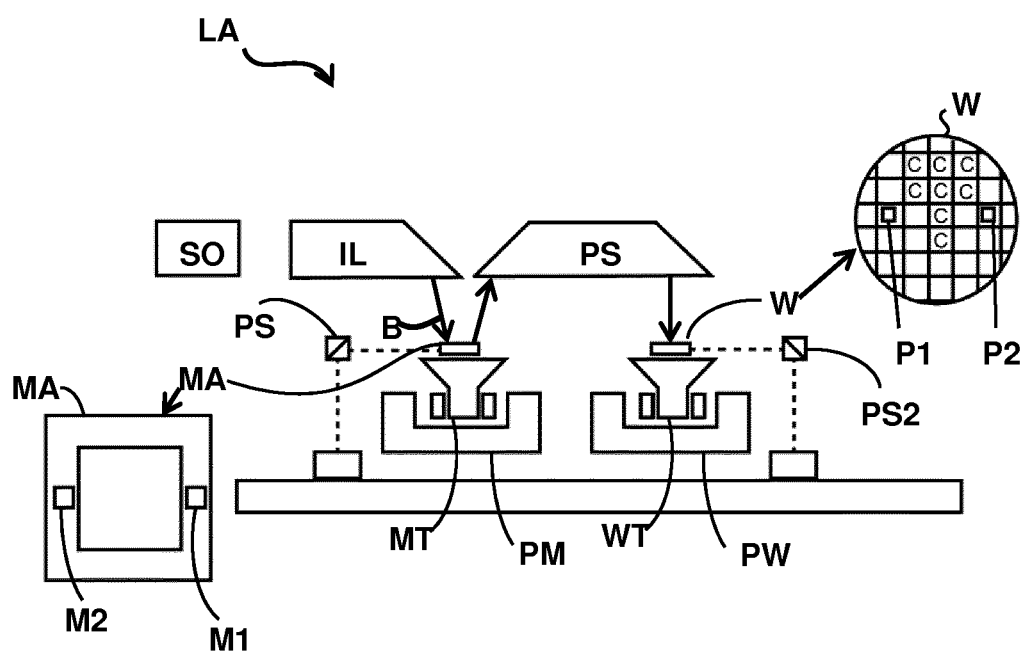
FIG. 30 is a schematic diagram of another lithographic projection apparatus, according to an embodiment.

FIG. 30 schematically depicts another exemplary lithographic projection apparatus LA that includes:
- a source collector module SO to provide radiation.
- an illumination system (illuminator) IL configured to condition a radiation beam B (e.g. EUV radiation) from the source collector module SO.
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have multi-layer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 26, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 26, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 31:
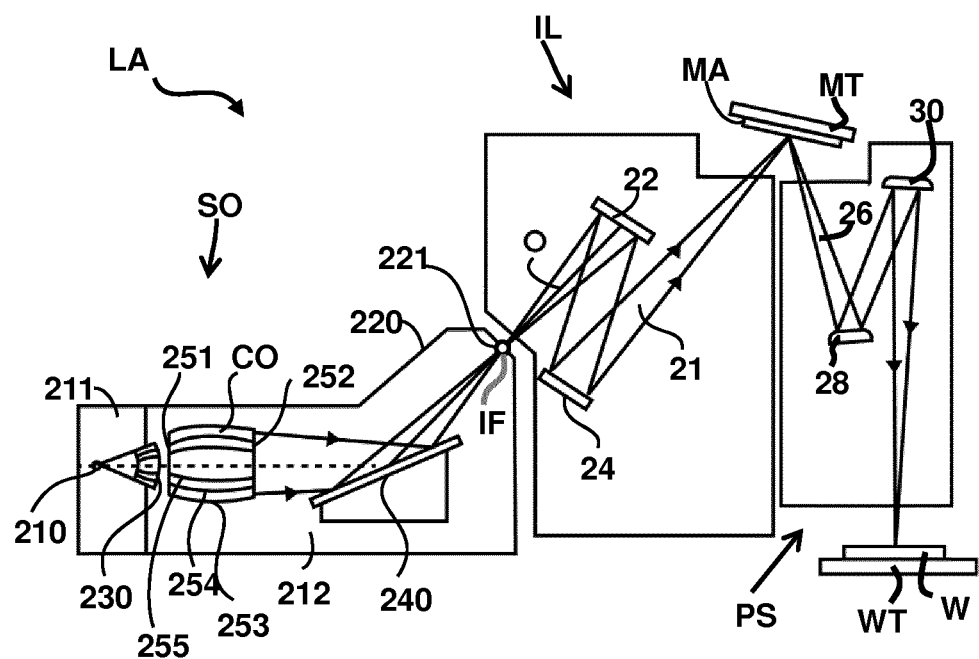
FIG. 31 is a more detailed view of the apparatus in FIG. 26, according to an embodiment.

FIG. 31 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1- 6 additional reflective elements present in the projection system PS than shown in FIG. 31.

Collector optic CO, as illustrated in FIG. 31, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 32:
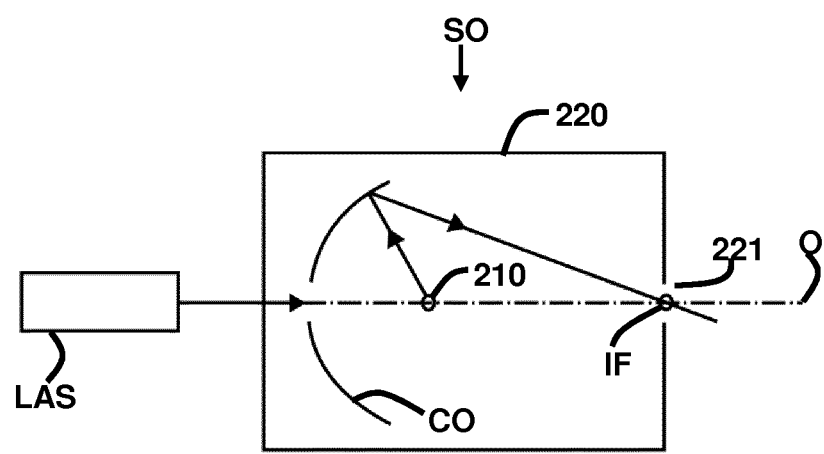
FIG. 32 is a more detailed view of the source collector module of the apparatus of FIG. 30 and FIG. 31, according to an embodiment.

Alternatively, the source collector module SO may be part of an LPP radiation system as shown in FIG. 32. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multilayer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A method for determining a parameter limit of a feature on a substrate, the method comprising:
obtaining (i) a functional behavior of a parameter of the feature defined as a function of the process variable based on measurements of the parameter and data related to a process variable of a patterning process used to generate the feature, (ii) measurements of a failure rate of the feature, and (iii) a probability density function of the process variable for a setting of the process variable;
converting, by a hardware computer system, the probability density function of the process variable for the setting to a probability density function of the parameter for the setting based on a conversion function, wherein the conversion function is determined based on the function of the process variable; and
determining, by the hardware computer system, a parameter limit of the parameter based on the probability density function of the parameter for the setting and the measurements of the failure rate of the feature.

2. The method according to claim 1, wherein the probability density function of the process variable for the setting is determined based on a variance of the process variable that is computed from a measured variance of the parameter for the setting of the process variable and a local derivative of the function of the process variable with respect to the process variable determined for the setting of the process variable.

3. The method according to claim 1, wherein the conversion function is a conversion factor, wherein the conversion factor is an absolute value of a local derivative of an inverse of the function of the process variable determined for the setting of the process variable.

4. The method according to claim 1, further comprising:
determining, by the hardware computer system, an estimated failure rate of the feature based on the parameter limit and the probability density function of the parameter; and
identifying, by the hardware computer system, a process window related to the process variable such that the estimated failure rate of the feature is less than a predetermined threshold.

5. The method according to claim 4, wherein the predetermined threshold is based on a selected yield of the patterning process.

6. The method according to claim 1, wherein the failure rate is related to one or more failures of the feature, the one or more failures having one or more failure modes comprising a physical failure mode of the feature, a transfer failure mode of the feature, and/or a postponed failure mode of the feature.

7. The method according to claim 6, wherein the failure rate is related to a postponed failure mode of the feature and the postponed failure mode of the feature is a failure that occurs in a next step of the patterning process due to defect in a current processing step, and/or
wherein the one or more failures of the feature are weighted based on a frequency of a particular failure to generate a weighted failure rate of the feature.

8. The method according to claim 1, further comprising:
obtaining a weighted function of the process variable based on a correlation between one or more failures of the feature and the process variable;
determining, by the hardware computer system, a weighted parameter limit of the parameter based on the weighted function of the process variable; and
determining, by the hardware computer system, a process window based on the weighted parameter limit.

9. The method of claim 8, further comprising optimizing, by the hardware computer system, a resist thickness and/or resist type using a resist model of a resist process, by simulation, based on one or more postponed failures associated with the resist process.

10. The method of claim 1, further comprising:
obtaining the parameter limit for each feature type of a plurality of feature types, and an estimated failure rate of each feature type of the plurality of feature types based on the corresponding parameter limit; and
determining, by the hardware computer system, an overlapping process window based on the estimated failure rate of each feature type of the plurality of feature types.

11. The method according to claim 10, further comprising iteratively determining an optical proximity correction, by modelling and/or simulation, based on a maximum of the estimated failure rate of each feature type of the plurality of feature types.

12. The method according to claim 1, further comprising determining, by the hardware computer system, a refined variance of the parameter from a measured variance of the parameter, wherein the refined variance accounts for variance due to factors unrelated to the process variable.

13. The method according to claim 12, wherein the refined variance is computed by removing the variance due factors unrelated to the process variable from the measured variance.

14. The method according to claim 12, further comprising determining a process window based on the refined variance.

15. The method of claim 1, further comprising:
obtaining a transfer function of a post pattern transfer step of the patterning process, and a probability density function of another process variable based on the transfer function; and
determining, by the hardware computer system, a process window based on the probability density function of the another process variable.

16. A computer product comprising a non-transitory computer-readable medium having instructions, the instructions, upon execution by a computer system, configured to cause the computer system to at least:
obtain (i) a functional behavior of a parameter of a feature on a substrate defined as a function of the process variable based on measurements of the parameter and data related to a process variable of a patterning process used to generate the feature, (ii) measurements of a failure rate of the feature, and (iii) a probability density function of the process variable for a setting of the process variable;
convert the probability density function of the process variable for the setting to a probability density function of the parameter for the setting based on a conversion function, wherein the conversion function is determined based on the function of the process variable; and
determine a parameter limit of the parameter based on the probability density function of the parameter for the setting and the measurements of the failure rate of the feature.

17. The computer product according to claim 16, wherein the probability density function of the process variable for the setting is determined based on a variance of the process variable that is computed from a measured variance of the parameter for the setting of the process variable and a local derivative of the function of the process variable with respect to the process variable determined for the setting of the process variable.

18. The computer product according to claim 16, wherein the conversion function is a conversion factor, wherein the conversion factor is an absolute value of a local derivative of an inverse of the function of the process variable determined for the setting of the process variable.

19. The computer product according to claim 16, wherein the instructions are further configured to cause the computer system to:
   determine an estimated failure rate of the feature based on the parameter limit and the probability density function of the parameter; and
   Identify a process window related to the process variable such that the estimated failure rate of the feature is less than a predetermined threshold.

20. The computer product according to claim 16, wherein the instructions are further configured to cause the computer system to:
   obtain a weighted function of the process variable based on a correlation between one or more failures of the feature and the process variable;
   determine a weighted parameter limit of the parameter based on the weighted function of the process variable; and
   determine a process window based on the weighted parameter limit.

* * * * *